US011003884B2

(12) United States Patent
Buchan et al.

(10) Patent No.: US 11,003,884 B2
(45) Date of Patent: May 11, 2021

(54) FINGERPRINT SENSOR DEVICE AND METHODS THEREOF

(71) Applicant: QUALCOMM Incorporated, San Diego, CA (US)

(72) Inventors: Nicholas Ian Buchan, San Jose, CA (US); Mario Francisco Velez, San Diego, CA (US); Chin-Jen Tseng, Fremont, CA (US); Hrishikesh Vijaykumar Panchawagh, Cupertino, CA (US); Firas Sammoura, San Jose, CA (US); Jessica Liu Strohmann, Cupertino, CA (US); Kostadin Dimitrov Djordjev, San Jose, CA (US); David William Burns, San Jose, CA (US); Leonard Eugene Fennell, San Jose, CA (US); Jon Gregory Aday, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 144 days.

(21) Appl. No.: 15/430,389

(22) Filed: Feb. 10, 2017

(65) Prior Publication Data
US 2017/0364726 A1 Dec. 21, 2017

Related U.S. Application Data

(60) Provisional application No. 62/351,228, filed on Jun. 16, 2016.

(51) Int. Cl.
*G06K 9/00* (2006.01)
*G01N 29/22* (2006.01)
(Continued)

(52) U.S. Cl.
CPC .......... *G06K 9/0002* (2013.01); *G01N 29/22* (2013.01); *G01N 29/2437* (2013.01);
(Continued)

(58) Field of Classification Search
CPC .... G06K 9/0002; H01L 41/047; H01L 27/323
See application file for complete search history.

(56) References Cited

U.S. PATENT DOCUMENTS 5,133,037 A   7/1992 Yoon et al.
5,670,871 A   9/1997 Man et al.
(Continued)

FOREIGN PATENT DOCUMENTS

CN   101315823 A   12/2008
CN   101533170 A   9/2009
(Continued)

OTHER PUBLICATIONS

Taiwan Search Report—TW103119261—TIPO—dated Oct. 23, 2017.
(Continued)

*Primary Examiner* — Solomon G Bezuayehu
(74) *Attorney, Agent, or Firm* — Qualcomm Incorporated

(57) ABSTRACT

A fingerprint sensor device includes a sensor substrate, a plurality of sensor circuits over a first surface of the sensor substrate, and a transceiver layer located over the plurality of sensor circuits and the first surface of the sensor substrate. The transceiver layer includes a piezoelectric layer and a transceiver electrode positioned over the piezoelectric layer. The piezoelectric layer and the transceiver electrode are configured to generate one or more ultrasonic waves or to receive one or more ultrasonic waves. The fingerprint sensor device may include a cap coupled to the sensor substrate and
(Continued)

a cavity formed between the cap and the sensor substrate. The cavity and the sensor substrate may form an acoustic barrier.

39 Claims, 42 Drawing Sheets

(51) Int. Cl.
    *G01N 29/24*         (2006.01)
    *H01L 41/047*       (2006.01)
    *H01L 41/107*       (2006.01)
    *G02F 1/1333*       (2006.01)
    *H01L 27/32*        (2006.01)

(52) U.S. Cl.
    CPC .......... *H01L 41/047* (2013.01); *H01L 41/107* (2013.01); *G02F 1/13338* (2013.01); *H01L 27/323* (2013.01)

(56) References Cited

U.S. PATENT DOCUMENTS

| | | | |
|---|---|---|---|
| 7,223,243 B2 | 5/2007 | Morris et al. | |
| 7,400,750 B2 | 7/2008 | Nam | |
| 7,616,786 B2 | 11/2009 | Setlak | |
| 7,955,641 B2 | 6/2011 | Schneider et al. | |
| 8,139,827 B2 | 3/2012 | Schneider et al. | |
| 8,183,745 B2 | 5/2012 | Trolier-McKinstry et al. | |
| 8,193,685 B2 | 6/2012 | Klee et al. | |
| 8,201,739 B2 | 6/2012 | Schneider et al. | |
| 8,247,802 B2 | 8/2012 | Nomura et al. | |
| 8,288,776 B2 | 10/2012 | Choi et al. | |
| 8,724,832 B2 | 5/2014 | Stephanou et al. | |
| 9,157,821 B2* | 10/2015 | Robert | G01L 9/0052 |
| 9,170,668 B2 | 10/2015 | Schneider et al. | |
| 9,262,003 B2 | 2/2016 | Kitchens et al. | |
| 2004/0263483 A1 | 12/2004 | Aufderheide | |
| 2006/0286311 A1 | 12/2006 | Okazaki et al. | |
| 2007/0008952 A1 | 1/2007 | Miao | |
| 2007/0029899 A1 | 2/2007 | Matsuzawa | |
| 2007/0089525 A1 | 4/2007 | Momose et al. | |
| 2007/0231462 A1 | 10/2007 | Araki et al. | |
| 2007/0258628 A1* | 11/2007 | Schneider | A61B 5/1172 382/124 |
| 2007/0272020 A1* | 11/2007 | Schneider | H01L 27/20 73/628 |
| 2008/0033298 A1 | 2/2008 | Habu et al. | |
| 2008/0231145 A1 | 9/2008 | Nagano et al. | |
| 2009/0004744 A1 | 1/2009 | Surber et al. | |
| 2009/0236732 A1* | 9/2009 | Yu | H01L 23/4334 257/707 |
| 2010/0032832 A1* | 2/2010 | Tomura | H01L 24/13 257/737 |
| 2010/0052478 A1 | 3/2010 | Schneider et al. | |
| 2010/0108771 A1* | 5/2010 | Wong | G06K 19/077 235/492 |
| 2011/0003491 A1 | 1/2011 | Levy et al. | |
| 2011/0021515 A1 | 1/2011 | Dong et al. | |
| 2011/0034912 A1 | 2/2011 | De et al. | |
| 2011/0112622 A1 | 5/2011 | Phan et al. | |
| 2011/0182488 A1* | 7/2011 | Bredholt | G06K 9/00026 382/124 |
| 2011/0215150 A1* | 9/2011 | Schneider | G06K 9/0002 235/439 |
| 2011/0279662 A1* | 11/2011 | Schneider | A61B 5/1172 348/61 |
| 2012/0111119 A1 | 5/2012 | Small et al. | |
| 2012/0144920 A1 | 6/2012 | Wong et al. | |
| 2012/0147698 A1 | 6/2012 | Wong et al. | |
| 2012/0206585 A1 | 8/2012 | Schneider et al. | |
| 2013/0176825 A1* | 7/2013 | Heitz | G01C 19/5747 367/179 |
| 2014/0035935 A1 | 2/2014 | Shenoy et al. | |
| 2014/0198072 A1 | 7/2014 | Schuele et al. | |
| 2014/0218802 A1* | 8/2014 | Saito | G02B 26/001 359/578 |
| 2014/0352440 A1 | 12/2014 | Fennell et al. | |
| 2014/0354596 A1 | 12/2014 | Djordjev et al. | |
| 2014/0354597 A1 | 12/2014 | Kitchens, II et al. | |
| 2014/0354823 A1* | 12/2014 | Kitchens | G06K 9/0002 348/163 |
| 2014/0354905 A1 | 12/2014 | Kitchens et al. | |
| 2014/0355387 A1 | 12/2014 | Kitchens, II et al. | |
| 2014/0359757 A1 | 12/2014 | Sezan et al. | |
| 2015/0198699 A1* | 7/2015 | Kuo | G01S 15/02 367/7 |
| 2015/0241393 A1 | 8/2015 | Ganti et al. | |
| 2015/0286318 A1 | 10/2015 | Morein et al. | |
| 2016/0026842 A1 | 1/2016 | Withers et al. | |
| 2016/0042217 A1* | 2/2016 | Kim | G06F 3/041 382/124 |
| 2016/0107194 A1* | 4/2016 | Panchawagh | G06F 3/043 367/140 |
| 2016/0171276 A1 | 6/2016 | Chiang et al. | |
| 2016/0210496 A1 | 7/2016 | Lin et al. | |
| 2017/0249493 A1* | 8/2017 | Yu | G06K 9/0004 |
| 2017/0317269 A1 | 11/2017 | Zhang et al. | |
| 2018/0213333 A1 | 7/2018 | Kitchens, II et al. | |

FOREIGN PATENT DOCUMENTS

| | | |
|---|---|---|
| CN | 101691202 A | 4/2010 |
| CN | 102596044 A | 7/2012 |
| CN | 102714274 A | 10/2012 |
| DE | 19833928 A1 | 2/2000 |
| JP | S58186981 A | 11/1983 |
| JP | 2012125560 A | 7/2012 |
| JP | 2012127945 A | 7/2012 |
| KR | 20010110247 A | 12/2001 |
| KR | 100363279 B1 | 2/2003 |
| KR | 20080109327 A | 12/2008 |
| TW | 200625155 A | 7/2006 |
| WO | WO-2008015917 A1 | 2/2008 |
| WO | WO-2015105320 A1 | 7/2015 |

OTHER PUBLICATIONS

International Search Report and Written Opinion—PCT/US2017/035981—ISA/EPO—dated Sep. 19, 2017.

Pangracious V., et al., "Three-Dimensional Integration: A More Than Moore Technology", In: Three-Dimensional Design Methodologies for Tree-based FPGA-Architecture, Jan. 1, 2015, vol. 350, Springer, XP055405152, ISSN: 1876-1100, ISBN: 978-3-642-05166-1, DOI: 10.1007/978-3-319-19174-4_2, pp. 13-41.

Wang Z., "3-D Integration and Through-Silicon Vias in MEMS and Microsensors", Journal of Microelectromechanical Systems, Oct. 1, 2015, vol. 24, No. 5, XP055405155, ISSN: 1957-7157, DOI: 10.1109/JMEMS.2015.2448681, pp. 1211-1244.

Lee J.S., et al., "Surface Functionalization of a Poly(vinylidene fluoride): Effect on the Adhesive and Piezoelectric Properties", ACS Applied Materials & Interfaces, 2009, vol. 1 (12), pp. 2902-2908.

Pecora A., et al., "Flexible PVDF-TrFE pyroelectric Sensor Driven by Polysilicon Thin Film Transistor Fabricated on Ultra-Thin Polyimide Substrate", Sensors and Actuators A: Physical, 2012, vol. 185, pp. 39-43.

Serrado Nunes. J., et al., "Electrical and Microstructural Changes of P-PVDF under Different Processing Conditions by Scanning Force Microscopy," Materials Research Society Symposium Proceedings, 2007, vol. 949, pp. 1-6.

Xu H., et al., "Domain Stabilization Effect of Interlayer on Ferroelectric Poly(Vinylidene Fluoride-Trifluoroethylene) Copolymer Ultrathin Film," Journal of Applied Physics, 2009, vol. 105 (3), pp. 34107-1-34107-6.

Kressmann R., et al, "New Results of Micromachined Silicon Subminiature Microphones using Piezoelectric Polymer Layers", Proceedings 9th International Symposium on Electrets (ISE 9), 1996, pp. 1044-1049.

(56) References Cited

OTHER PUBLICATIONS

Mao D., et al., "Ferroelectric Properties and Polarization Switching Kinetic of Poly (vinylidene Fluoride-trifluoroethylene) Copolymer," Aug. 23, 2011, XP055639755.
Taiwan Search Report—TW106118555—TIPO—dated Jan. 20, 2021.

* cited by examiner

FRONT SIDE VIEW

CROSS-SECTIONAL VIEW

FINGERPRINT SENSOR DEVICE AND METHODS THEREOF

CROSS-REFERENCE/CLAIM OF PRIORITY TO RELATED APPLICATION

The present application claims priority to U.S. Provisional Application No. 62/351,228 titled "FINGERPRINT SENSOR DEVICE AND METHODS THEREOF", filed Jun. 16, 2016, which is hereby expressly incorporated by reference herein.

BACKGROUND

Field of the Disclosure

Various features relate generally to a fingerprint sensor device, and more specifically to an ultrasonic fingerprint sensor device with reduced form factor and reduced imagery interference.

Background

FIG. 1 illustrates a fingerprint sensor device 100 underneath a platen 101. The fingerprint sensor device 100 includes a sensor substrate 102, a plurality of sensor circuits 104 formed on the sensor substrate 102, a receiver 106 on a first surface of the sensor substrate 102, and a transmitter 108 on a second surface of the sensor substrate 102. Thus, the receiver 106 and the transmitter 108 are located on opposite sides or opposite surfaces of the sensor substrate 102. The plurality of sensor circuits 104, the receiver 106 and the transmitter 108 are electrically coupled to a control unit 110.

The transmitter 108 includes a piezoelectric layer that is capable of generating ultrasonic waves or signals. The receiver 106 includes a piezoelectric layer that is capable of detecting or receiving ultrasonic waves or signals. The transmitter 108 may generate ultrasonic waves that may bounce off or reflect off a target object 112 (e.g., a finger) pressed against a surface of the platen 101. The transmitter 108 may include a piezoelectric layer and a pair of electrode layers (not shown) formed on each side of the piezoelectric layer. The receiver 106 may include a piezoelectric layer and an electrode layer (not shown) formed on one side of the piezoelectric layer, with the other side of the piezoelectric layer directly coupled or capacitively coupled to the plurality of sensor circuits 104.

The control unit 110 is configured to control the transmitter 108 and the receiver 106, and to process signals from the plurality of sensor circuits 104 to form a digital image or representation of the target object 112 (e.g., finger) pressed against the platen 101.

One drawback of the finger sensor device 100 of FIG. 1 is that there may be imagery interference from artifacts and/or objects located near the transmitter 108. For example, there may be moisture, particles, foreign objects, and/or device components that may interfere or disrupt the ultrasonic waves generated by the transmitter 108. Moisture and particles, such as dust and/or dirt, can be problematic because they can vary and change over time, and thus cannot readily be calibrated away.

Therefore, there is an ongoing need for better fingerprint sensor devices with better form factors and improved imaging performance, accuracy and precision.

SUMMARY

Various features relate generally to a fingerprint sensor device, and more specifically to a fingerprint sensor device with a reduced form factor and reduced imagery interference.

One example provides a fingerprint sensor device that includes a sensor substrate, a plurality of sensor circuits over a first surface of the sensor substrate, and a transceiver layer located over the plurality of sensor circuits and the first surface of the sensor substrate. The transceiver layer includes a piezoelectric layer and a transceiver electrode positioned over the piezoelectric layer. The piezoelectric layer and the transceiver electrode are configured to generate one or more ultrasonic waves or to receive one or more ultrasonic waves.

Another example provides an apparatus that includes a sensor substrate, a plurality of sensor circuits over a first surface of the sensor substrate, and transceiver means located over the plurality of sensor circuits and the first surface of the sensor substrate. The transceiver means includes transmitter means configured to generate one or more ultrasonic waves, and receiver means configured to receive one or more ultrasonic waves.

Another example provides a method for fabricating a fingerprint sensor device. The method provides a sensor substrate. The method forms a plurality of sensor circuits over a first surface of the sensor substrate. The method provides a transceiver layer over the plurality of sensor circuits and the first surface of the sensor substrate. The method of providing the transceiver layer comprises providing a piezoelectric layer. The method of providing the transceiver layer further comprises providing a transceiver electrode positioned over the piezoelectric layer, wherein the piezoelectric layer and the transceiver electrode are configured to generate one or more ultrasonic waves and to receive one or more ultrasonic waves.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a fingerprint sensor device that includes a sensor substrate, a plurality of sensor circuits disposed on a first surface of the sensor substrate or fabricated in the sensor substrate, and a transceiver layer formed over the plurality of sensor circuits and the first surface of the sensor substrate. The transceiver layer may be configured to serve as a transmitter for generating ultrasonic waves and as a receiver to receive ultrasonic waves. The fingerprint sensor device may include a cap coupled to the sensor substrate such that a cavity region is formed between the sensor substrate and the cap. In some implementations, an interface between a surface (e.g., backside surface) of the sensor substrate and the cavity region is configured to serve as an acoustic barrier for the fingerprint sensor device. The sensor substrate may include one or more electrical vias. The vias may serve to transmit electrical signals from one side of the sensor substrate to the other side. The transceiver layer may include a piezoelectric layer and an electrode layer formed over one side of the piezoelectric layer, with the other side of the piezoelectric layer directly or capacitively coupled to the plurality of sensor circuits. A coating layer such as an acrylic layer may be disposed on the electrode layer.

Exemplary Fingerprint Sensor Devices

Figure 1:
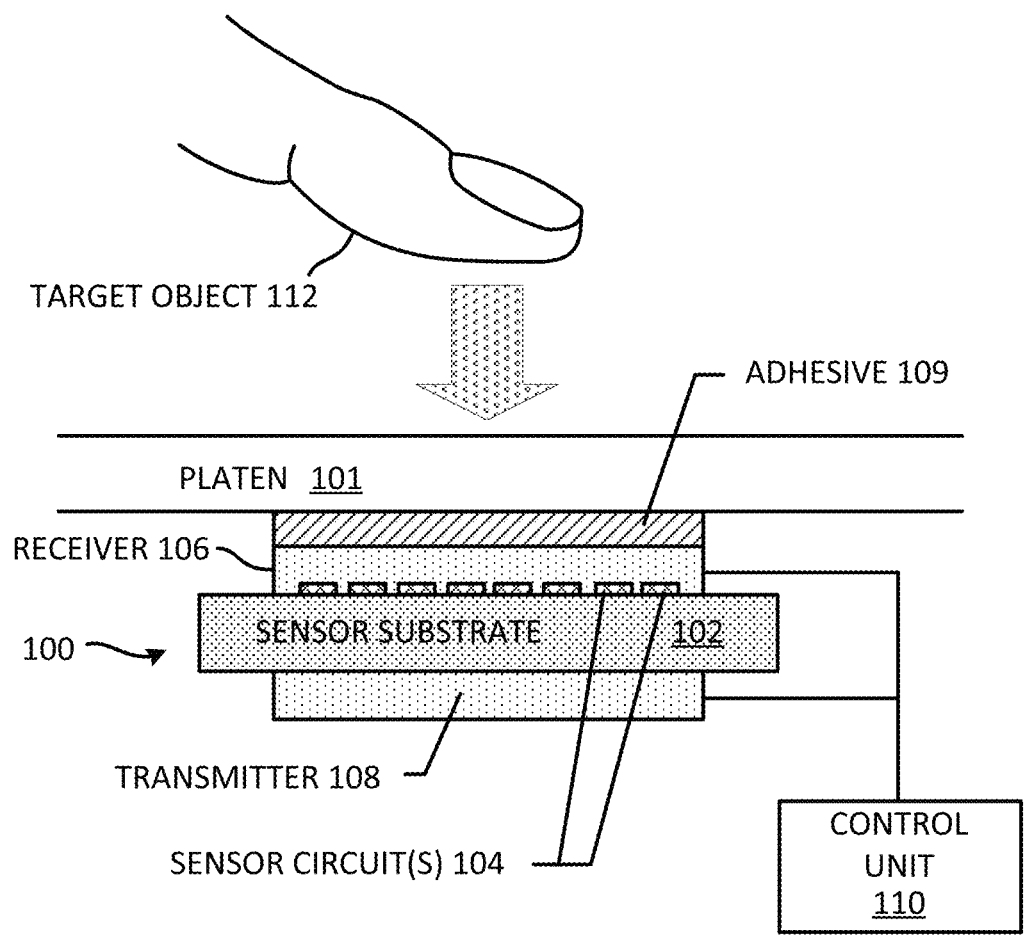
FIG. 1 illustrates a fingerprint sensor device that includes a transmitter and a receiver located on opposite sides of a sensor substrate.
Figure 2:
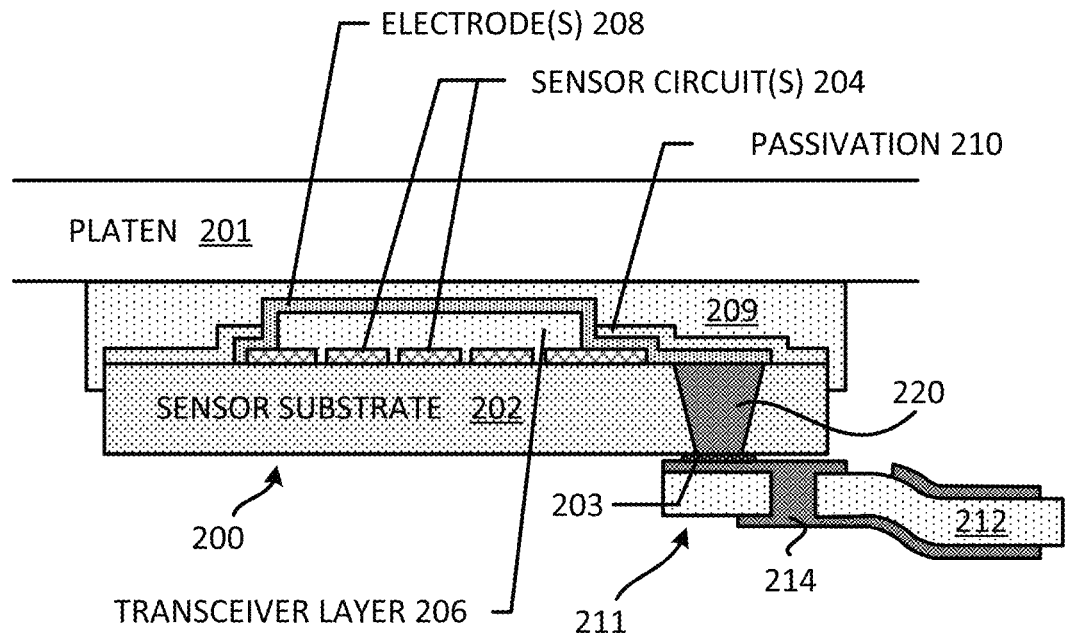
FIG. 2 illustrates a fingerprint sensor device that includes a transceiver layer over a sensor substrate, where the sensor substrate includes at least one through-substrate via (TSV).

FIG. 2 illustrates an example of a fingerprint sensor device 200 that is coupled to a platen 201 with an adhesive 209 (e.g., a platen adhesive such as a thermally cured or UV-curable epoxy). As shown in FIG. 2, the fingerprint sensor device 200 may be located underneath the platen 201. The platen 201, in some implementations, may be a cover glass of a display device (e.g., mobile device), a portion of an enclosure of a display device, or a cover of an ultrasonic authenticating button. In some implementations, the platen may include a portion of a display cover glass, a liquid-crystal display (LCD) display panel, an organic light-emitting diode (OLED) or active-matrix organic light-emitting diode (AMOLED) display panel, a display module, or a visual display.

FIG. 2 illustrates a fingerprint sensor device 200 that includes a sensor substrate 202, a plurality of sensor circuits 204, a transceiver layer 206, one or more transceiver electrodes 208, and a passivation layer 210. The sensor substrate 202 includes at least one via 220 that traverses (e.g., vertically traverses) the sensor substrate 202. The via 220 may be a through-substrate via (TSV) such as a through-glass via (TGV) or a through-silicon via. It is noted that more than one via 220 may traverse the sensor substrate 202. Different implementations may use different materials for the sensor substrate 202. For example, the sensor substrate 202 may include a silicon substrate, a silicon-on-insulator (SOI) substrate, a thin-film transistor (TFT) substrate, a glass substrate, a plastic substrate, a ceramic substrate, and/or a combination thereof.

The plurality of sensor circuits 204 may be formed over (e.g., on) a first surface (e.g., a front surface or front side) of the sensor substrate 202, such as TFT circuits formed on a TFT substrate or complementary metal-oxide-semiconductor (CMOS) circuits formed on or in a silicon substrate. The transceiver layer 206 may be disposed over the plurality of sensor circuits 204. In some implementations, the transceiver layer 206 may be positioned over the plurality of sensor circuits 204 and coupled to the plurality of sensor circuits 204 with an adhesive layer (not shown). In some implementations, the transceiver layer 206 may be sprayed, spun, dispensed, coated or otherwise formed directly or indirectly on the sensor circuits 204. In some implementations, the transceiver layer 206 may serve as both a transmitter and a receiver.

The transceiver layer 206 (e.g., transceiver means) may be configured to generate at least one ultrasonic wave/signal and to receive or detect at least one ultrasonic wave/signal. In particular, the transceiver layer 206 may serve as a transmitter (e.g., transmitter means) that is configured to generate at least one ultrasonic wave/signal, and to serve as a receiver (e.g., receiver means) that is configured to receive or detect at least one ultrasonic wave/signal. The transceiver layer 206 may include one or more piezoelectric layers and electrode layers that enable the transceiver layer 206 to generate and detect ultrasonic waves/signals. For example, a transmitter may include one or more piezoelectric layers to generate ultrasonic waves/signals, and a receiver may include one or more piezoelectric layers to detect ultrasonic waves/signals.

In some implementations, the same piezoelectric layer(s) of the transceiver layer 206 may be used to generate and detect ultrasonic waves/signals. For example, during a first time period (e.g., a first operational mode), the piezoelectric layer of the transceiver layer 206 may be configured to generate ultrasonic waves/signals, and during a second time period (e.g., a second operational mode), the same piezoelectric layer may be configured to receive ultrasonic waves/signals. In some implementations, during the operation of the transceiver layer 206, the piezoelectric layer(s) may be configured in such a way as to switch back and forth between being configured as a transmitter and as a receiver.

As will be further described below, the generation and detection of ultrasonic waves/signals through the use of one or more layers of piezoelectric material allows the fingerprint sensor device 200 to create a digital image or provide image information of an object touching the platen 201, such as the ridges and valleys of a human finger. More detailed examples of transceiver configurations are further described below in FIGS. 41 and 42.

The sensor circuits 204 may include a thin-film transistor (TFT) array. For example, the sensor circuits 204 may include an array of pixel circuits, where each pixel circuit may include one or more thin-film transistors. In some implementations, a pixel circuit may include a diode, a capacitor, and several transistors. A pixel circuit may be configured to convert an electric charge generated by the transceiver layer 206 proximate to the pixel circuit into an electrical signal in response to a received ultrasonic wave. A pixel circuit may include a pixel input electrode that electrically couples the transceiver layer 206 to the pixel circuit. Ultrasonic waves may be generated by providing an electrical signal to the one or more transceiver electrodes 208. The generated ultrasonic waves may be transmitted through the platen 201. Ultrasonic energy that is reflected from the exposed outer (top) surface of the platen 201 may generate a localized surface charge by the transceiver layer 206. The localized surface charge may be detected by underlying sensor circuits 204 via the pixel input electrodes. The detected signal on the pixel input electrodes may be amplified by the sensor circuits 204 and output signals from the sensor circuits 204 may be sent to a sensor controller or other circuitry (e.g., a control unit, control circuitry or an applications processor) for signal processing. In alternative configurations, the sensor circuits 204 may include one or more silicon-based transistors, diodes and passive devices formed on or in a silicon substrate.

The one or more transceiver electrodes 208 may be formed over or otherwise disposed on the transceiver layer 206. The one or more transceiver electrodes 208 may include an electrically conductive layer and one or more electrical interconnect traces that are coupled to the transceiver layer 206 and/or other interconnects of the fingerprint sensor device 200. For example, the one or more transceiver electrodes 208 may be coupled to the via 220. The one or more transceiver electrodes 208 may include one or more interconnects that are formed over the sensor substrate 202. In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal, ground signal or power signal). An interconnect may be part of a circuit. An interconnect may include more than one element or component.

The passivation layer 210 may be formed over at least portions of the one or more transceiver electrodes 208, the sensor circuits 204, interconnect traces, and the sensor substrate 202. The platen adhesive 209 may couple the fingerprint sensor device 200 to the platen 201. In some implementations, the platen adhesive 209 is part of the fingerprint sensor device 200.

Different implementations may use different materials for the platen 201. Examples of platen materials include plastic, ceramic, sapphire, composite materials, metal and metal alloys, metal-filled polymers, polycarbonate and glass. In some implementations, the platen 201 may be a cover plate (e.g., a cover glass or a cover lens for a display). In some implementations, the platen 201 may be a metal such as aluminum, an aluminum alloy, chrome-molybdenum, stainless steel, or a metal-filled polymer. In some implementations, a casing or housing for an electronic device may serve as a platen. In some implementations, a portion of the back, sides or front of a mobile device housing may serve as a platen. In some implementations, a coating layer such as a thin layer of urethane, acrylic, parylene or a diamond-like coating (DLC) may serve as a platen. In some implementations, an outer or inner surface of the platen 201 may include one or more coatings, acoustic coupling layers, acoustic matching layers, or protective layers. For example, the platen 201 may include one or more layers of paint for decoration, dark masking, or guiding a user's finger. In some implementations, the platen 201 may include a recess on one or both sides to aid in guiding a user's finger or positioning the fingerprint sensor device during assembly.

FIG. 2 illustrates a flexible printed circuit (FPC) 211 coupled to the sensor substrate 202. The FPC 211 may be known as a flex tape, a flex cable, or simply as a "flex". The FPC 211 may include one or more dielectric layers 212 and interconnects 214 (e.g., traces, vias and pads). The interconnects 214 may be coupled to the via 220 through an adhesive 203. The adhesive 203 may be an electrically conductive adhesive, such as anisotropic conductive film (ACF). However, different implementations may use different electrically conductive adhesives, solders, or connective means. In some implementations, the FPC 211 may be electrically coupled to a sensor controller or other circuitry (e.g., a control unit, control circuitry or an applications processor) for signal processing of signals to/from the sensor circuits 204.

In some implementations, the FPC 211 may include other functionality, such as one or more capacitive touch electrodes for low-power wakeup, menu selection and navigation functionality. In some implementations, the capacitive touch electrodes may include metallized regions for detecting the capacitance of a finger in proximity to the capacitive touch electrode (e.g. self-capacitance detection) or pairs of interdigitated or crossed electrodes for projected capacitive touch (PCT) detection (e.g. mutual capacitance detection). For example, the capacitive touch electrodes may be formed from one or more copper traces and/or pad regions of the FPC interconnects 214. Alternatively, the capacitive touch electrodes may be deposited, printed or laminated onto the FPC 211. Alternatively, all or a portion of the capacitive touch electrodes may be disposed on the inside surface of a platen 201 (e.g., using screen printing of electrically conductive paint or sputter depositing a thin metal through a shadow mask), directly or capacitively coupled to one or more interconnects 214 in the FPC 211 in operation. Conductive adhesive may be used to directly couple capacitive touch electrodes on the inside surface of the platen 201 to interconnects 214 in the FPC 211. In some implementations, the capacitive touch electrodes may be in the acoustic path of the generated and reflected ultrasonic waves, such as above an active area of the sensor substrate 202 where reflected ultrasonic signals are detected by the array of sensor circuits 204. In some implementations, the capacitive touch electrodes may be positioned on one or more sides of the sensor substrate 202 and positioned against the inner surface of the platen 201. One or more vias in the FPC 211 and/or the sensor substrate 202 may allow electrical connectivity from one interconnect layer of FPC 211 to another interconnect layer, the interconnect layers separated by one or more dielectric layers 212. In some implementations, a portion or all of the platen adhesive 209 may be electrically conductive to serve as a capacitive touch electrode.

FIG. 2 illustrates an example of a fingerprint sensor device with a reduced form factor by providing the transceiver layer 206 on one side of the sensor substrate 202 that can serve both as an ultrasonic transmitter and an ultrasonic receiver. In addition, the fingerprint sensor device 200 may have improved imagery capabilities over a fingerprint sensor device where the transmitter and the receiver are located on opposite sides of the sensor substrate. It is noted that additional improvements in imagery capabilities may be achieved by using other components and structures described in the present application.

Figure 3:
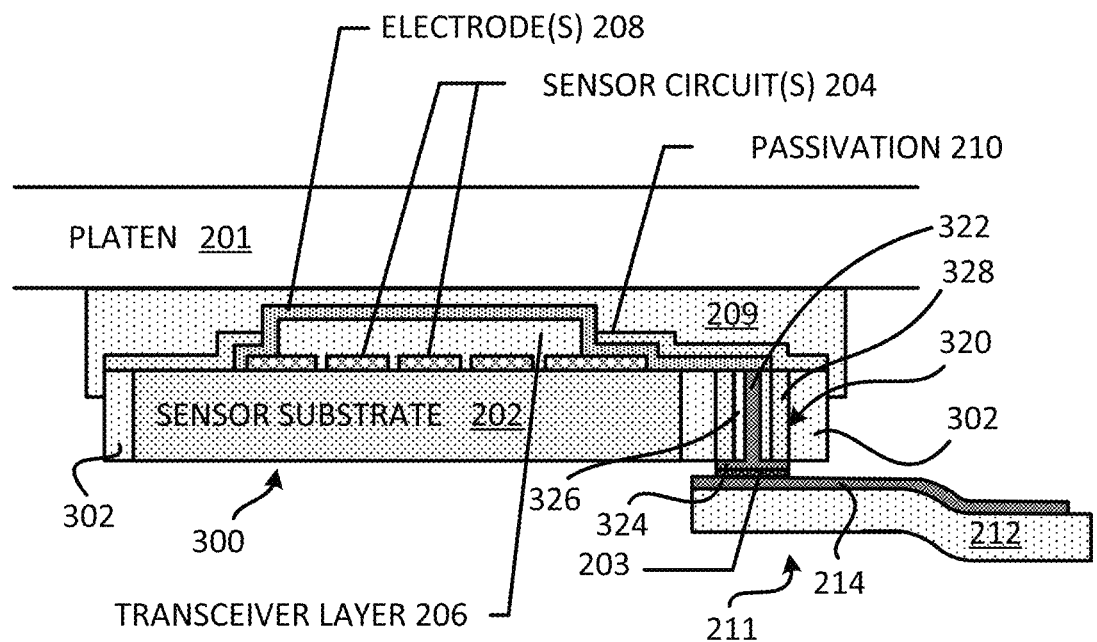
FIG. 3 illustrates a fingerprint sensor device that includes a transceiver layer over a sensor substrate, where the sensor substrate includes a molded via bar.

FIG. 3 illustrates a fingerprint sensor device 300. The fingerprint sensor device 300 is similar to the fingerprint sensor device 200. The fingerprint sensor device 300 includes a molded via bar 320. The via bar 320 may traverse an encapsulation layer 302 (e.g., mold compound). The encapsulation layer 302 may be coupled to the sensor substrate 202.

The via bar 320 may include a via 322, a capture pad 324, a dielectric layer 326 and an insulative or semi-insulative layer 328. The via 322 may be coupled to the one or more transceiver electrodes 208. The capture pad 324 may be coupled to the FPC 211 through the adhesive 203, such as conductive adhesive, ACF or solder. In some implementations, one or more vias 322 in the via bar 320 may be connected to portions of the sensor circuits 204 or associated addressing circuitry connected to the sensor circuits 204 for reading out image information. In some implementations, the via bar 320 may include one or more redistribution layers (not shown) to allow interconnections and desired spacing between various vias 322 in the via bar 320.

Figure 4:
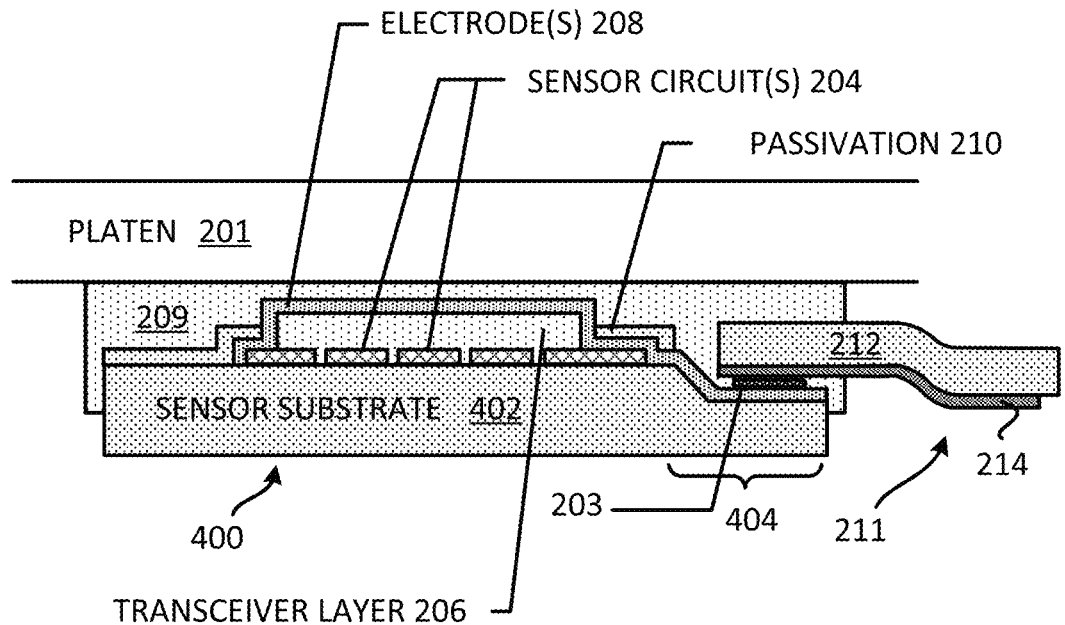
FIG. 4 illustrates a fingerprint sensor device that includes a transceiver layer over a sensor substrate, where the sensor substrate includes a recessed portion.

FIG. 4 illustrates a fingerprint sensor device 400. The fingerprint sensor device 400 is similar to the fingerprint sensor device 200. The fingerprint sensor device 400 includes a sensor substrate 402 that includes a recessed portion 404. The recessed portion 404 of the sensor substrate 402 allows FPC 211 to more readily fit between the sensor substrate 402 and the platen 201, thereby reducing the form factor of the fingerprint sensor device 400. As shown in FIG. 4, the FPC 211 may be coupled to the one or more transceiver electrodes 208 and sensor circuits 204 through the conductive adhesive 203. In some implementations, the recessed portion 404 may be formed using a laser removal process. In some implementations, a suitable etching process such as a KOH-based anisotropic etching process (for silicon) or an HF-based etching process (for glass) may be used to selectively remove a portion of the sensor substrate 402.

Figure 5:
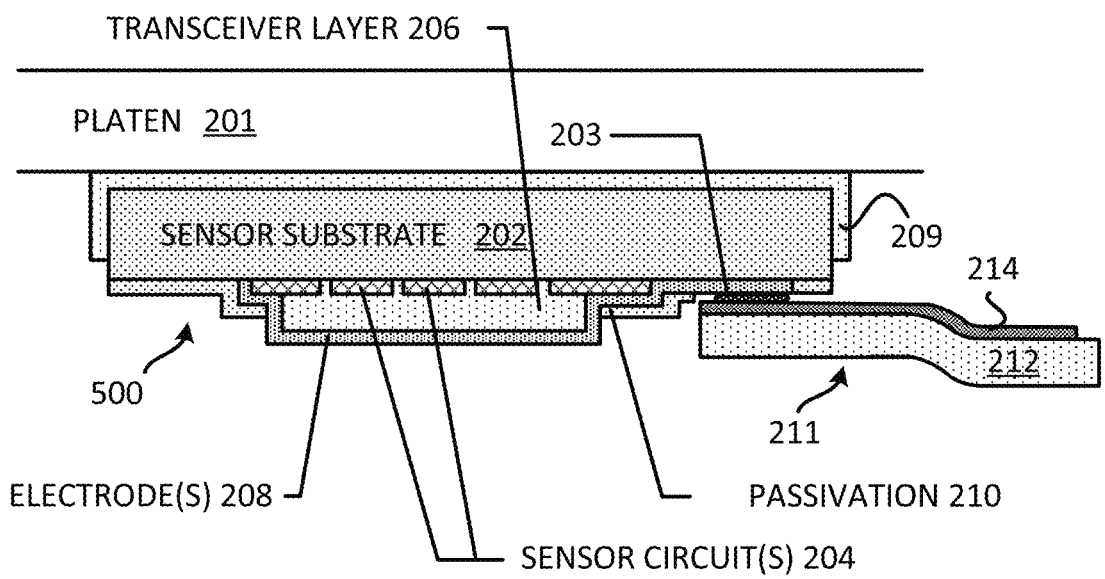
FIG. 5 illustrates an inverted fingerprint sensor device that includes a transceiver layer over a sensor substrate.

FIG. 5 illustrates a fingerprint sensor device 500. The fingerprint sensor device 500 is an inverted fingerprint sensor device. The fingerprint sensor device 500 is similar to the fingerprint sensor device 200. The fingerprint sensor device 500 is coupled to the platen 201 through the backside surface of the sensor substrate 202. As shown in FIG. 5, the platen adhesive 209 may couple the backside surface of the sensor substrate 202 to the platen 201, such that the front side surface or circuit side of the sensor substrate 202 is facing away from the platen 201. An inverted fingerprint sensor device, in some implementations, may generate and launch one or more ultrasonic waves through the sensor substrate 202 and receive reflected ultrasonic waves back through the sensor substrate 202 for ultrasonic imaging of a target object. In the inverted configurations, a backside or bottom side of the sensor substrate 202 may serve as a platen or be attached to a platen for fingerprint imaging.

Figure 6:
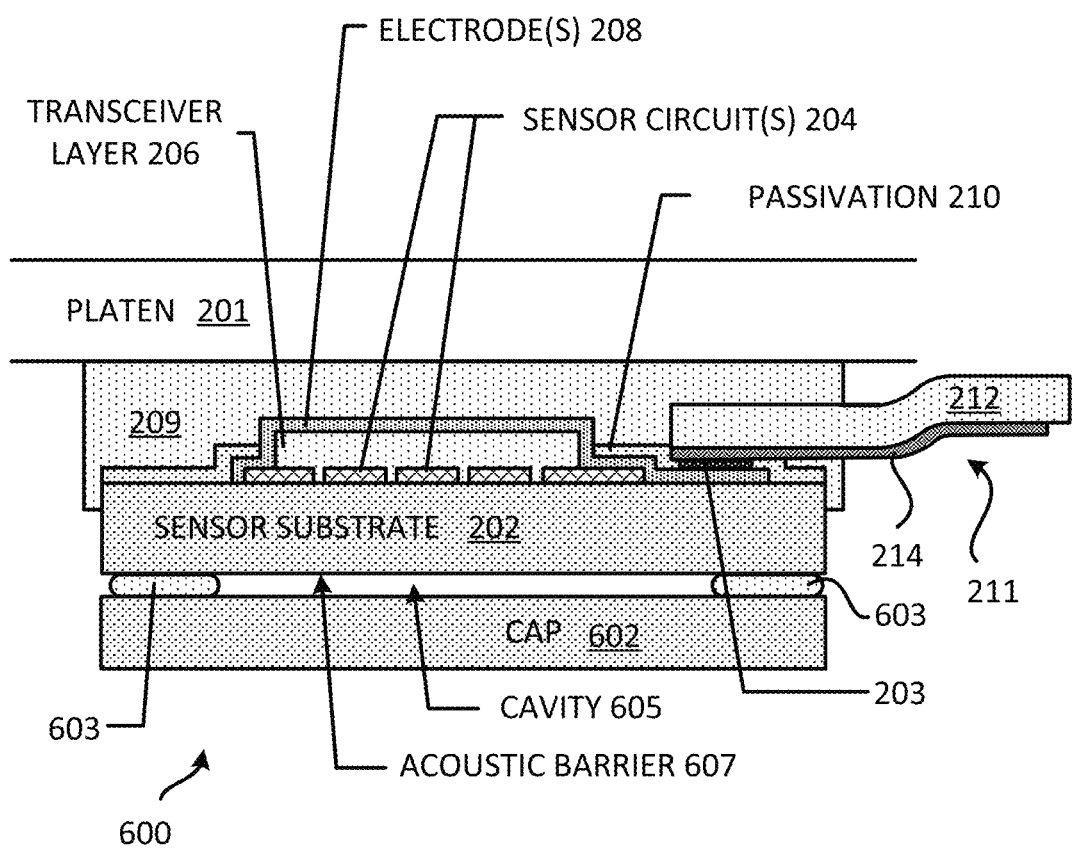
FIG. 6 illustrates a fingerprint sensor device that includes a transceiver layer over a sensor substrate, a cap, and a cavity formed between the sensor substrate and the cap.

FIG. 6 illustrates a fingerprint sensor device 600 that includes a cap 602. The cap 602 may be coupled to the backside of the sensor substrate 202 with an adhesive 603.

The cap 602 may be coupled to the sensor substrate 202 such that a cavity 605 is formed between the second surface (e.g., back surface) of the sensor substrate 202 and the cap 602. The cavity 605 may be a sealed cavity. In some implementations, the adhesive 603 may be dispensed or screened onto the sensor substrate 202 or cap 602 prior to assembly. In some implementations, the adhesive 603 may comprise a metal bond ring for eutectic attachment of the cap and substrate. In some implementations, the adhesive 603 may be applied to either the cap or the substrate, patterned and etched prior to bonding the cap and substrate together. In some implementations, the substrate-to-cap bond may include a thermoplastic adhesive, a pressure-sensitive adhesive (PSA), an epoxy, a UV-curable epoxy, a thermal curing epoxy, a glass frit, a metal seal, a eutectic bond, a thermocompression bond, a plasma bond, an anodic bond, etc. In some implementations, the cap may comprise a wafer, substrate, panel, sub-panel or layer of plastic, metal, glass, silicon, etc. In some implementations, a spacer may be used in the bonding process to control the gap height (e.g., the height of the cavity). In some implementations, the cap 602 may be attached as a wafer, substrate, panel, sub-panel or other layer to the sensor substrate 202 prior to dicing, cutting or otherwise singulating the sensor die into a form illustrated in FIG. 6. In some implementations, the cap 602 may be attached to the sensor substrate 202 near the edge of one, two, three or four sides of the sensor substrate 202, or in other suitable regions such as one or more sides of the sensor substrate 202 or directly against the platen 201.

A cap (e.g., cap means) provides many benefits and advantages for the fingerprint sensor device 600 or any other finger sensor device and variations described in the present application. For example, the cap 602 may prevent dust, dirt, objects, and/or other materials from coming into contact with the back surface of the sensor substrate 202. Without the cap 602, during an assembling of a device (e.g., mobile device), contamination of the sensor substrate 202 or contact with other components in the device can occur, which can affect how the ultrasonic waves bounce and reflect, thereby resulting in imagery interference. In some implementations, the cap 602 may be carefully placed over the sensor substrate 202 during assembly. In some implementations, the cap 602 may have one or more vent holes (not shown) to allow unwanted efflux from solvents, epoxies and other adhesives to be exhausted during assembly. The vent holes may be sealed as desired to provide environmental protection. In some implementations, the cap 602 may include one or more standoffs and/or sidewalls that cover one or more sides of the sensor substrate. In some implementations, a protective encapsulation layer such as an edge seal, mold compound, an epoxy or other adhesive may be included with the cap 602 and the platen adhesive 209 to further protect the sensor substrate 202 and other components of the fingerprint sensor device 600.

Acoustic Barrier

Another technical advantage of providing the cap 602 and the cavity 605 is that the interface between the sensor substrate 202 and the cavity 605 may act or be configured to operate as an acoustic barrier 607 (e.g., acoustic barrier means) for the fingerprint sensor device 600. The sensor substrate 202 generally has a high acoustic impedance, whereas the cavity 605 has a low acoustic impedance or a much lower acoustic impedance than the sensor substrate 202. This difference in acoustic impedance may act as an acoustic barrier, preventing a large portion of the ultrasonic waves generated by the transceiver layer 206 from being transmitted through the cavity 605. In addition, the acoustic barrier 607 may provide better or improved reflection of ultrasonic waves generated by the transceiver layer 206. Thus, an acoustic barrier (e.g., acoustic barrier means) may act as a barrier to prevent or minimize ultrasonic waves reflected from external objects and artifacts from interfering with the readings of the transceiver layer 206, while at the same time providing better reflection of ultrasonic waves generated by the transceiver layer 206, thereby providing a more accurate and precise imagery of the object that is in contact with the platen 201.

It is noted that the cavity 605 may be empty (e.g., in a vacuum) or filled with air or a gas such as nitrogen. How the cavity 605 is filled, if any, may affect the performance of the acoustic barrier (e.g., acoustic barrier 607) for the fingerprint sensor device 200. The cavity 605 may have different heights and/or depths. For example, the height or depth between the second surface of the sensor substrate 202 and the cap 602 may be between about 0.05 microns (μm) and 150 microns (μm), or larger.

Figure 7A:
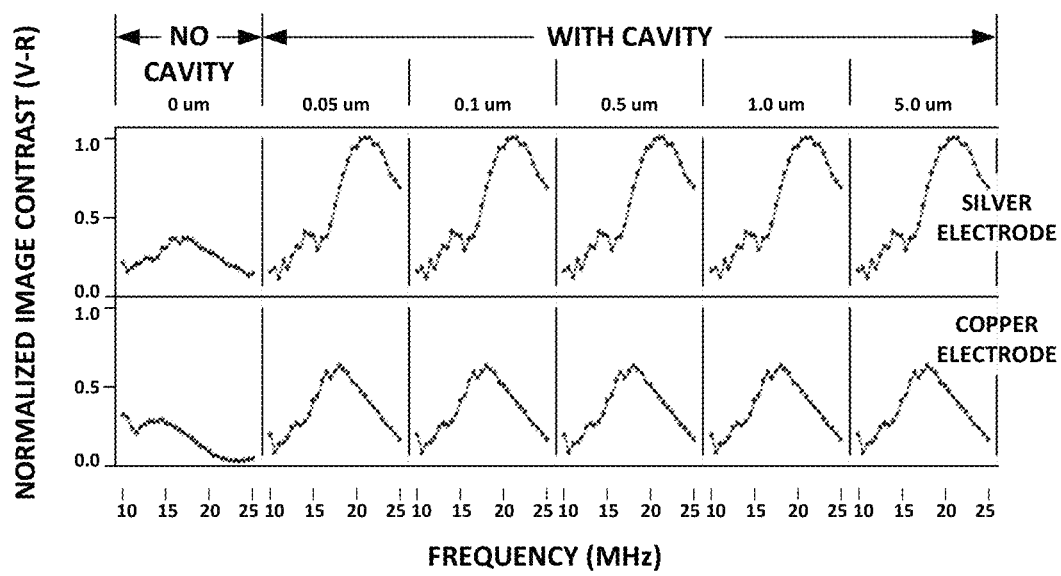
FIG. 7A illustrates exemplary graphs of image contrast for different cavity heights over a range of ultrasonic frequencies.

FIG. 7A illustrates a series of graphs showing image contrast for different cavity heights over a range of ultrasonic frequencies. The graphs show the difference in signal strength (e.g., image contrast) between valley regions of a finger and ridge regions of the finger, normalized to the maximum signal over the frequency range. Normalized image contrast (valley-ridge) for various transmission frequencies between about 10 MHz and about 25 MHz for two different transceiver electrode materials (silver and copper) are illustrated for a 50-um thick silicon sensor substrate and a 300-um thick silicon cap. The image contrast indicates how well the valleys and ridges of a fingerprint can be distinguished from each other. The higher the image contrast the better. As shown in FIG. 7A, when the cavity is at least about 0.05 microns (μm) deep, the contrast improves dramatically, particularly at values near about 20 MHz. The image contrast changes little when the cavity height is increased from about 0.05 micron to 0.1 um, 0.5 um, 1.0 um, 5.0 um, or larger. A fingerprint sensor device without a cavity (e.g., 0 um cavity height) has appreciably reduced image contrast. Thus, FIG. 7A illustrates how even a small, shallow cavity with a small height can make a big difference in terms of performance (e.g., imagery performance) of the fingerprint sensor device. Further increases in cavity height up to about 5 microns, 50 microns, 150 microns, or more have little additional impact on the device performance of the fingerprint sensor device over these frequency ranges, allowing for cavity height variability between sensor devices and within an individual sensor device. The roll-off in image contrast at higher frequencies and lower frequencies as can be seen in FIG. 7A indicates that the performance of the fingerprint sensor device may depend in part on the thickness of the sensor substrate.

Figure 7B:
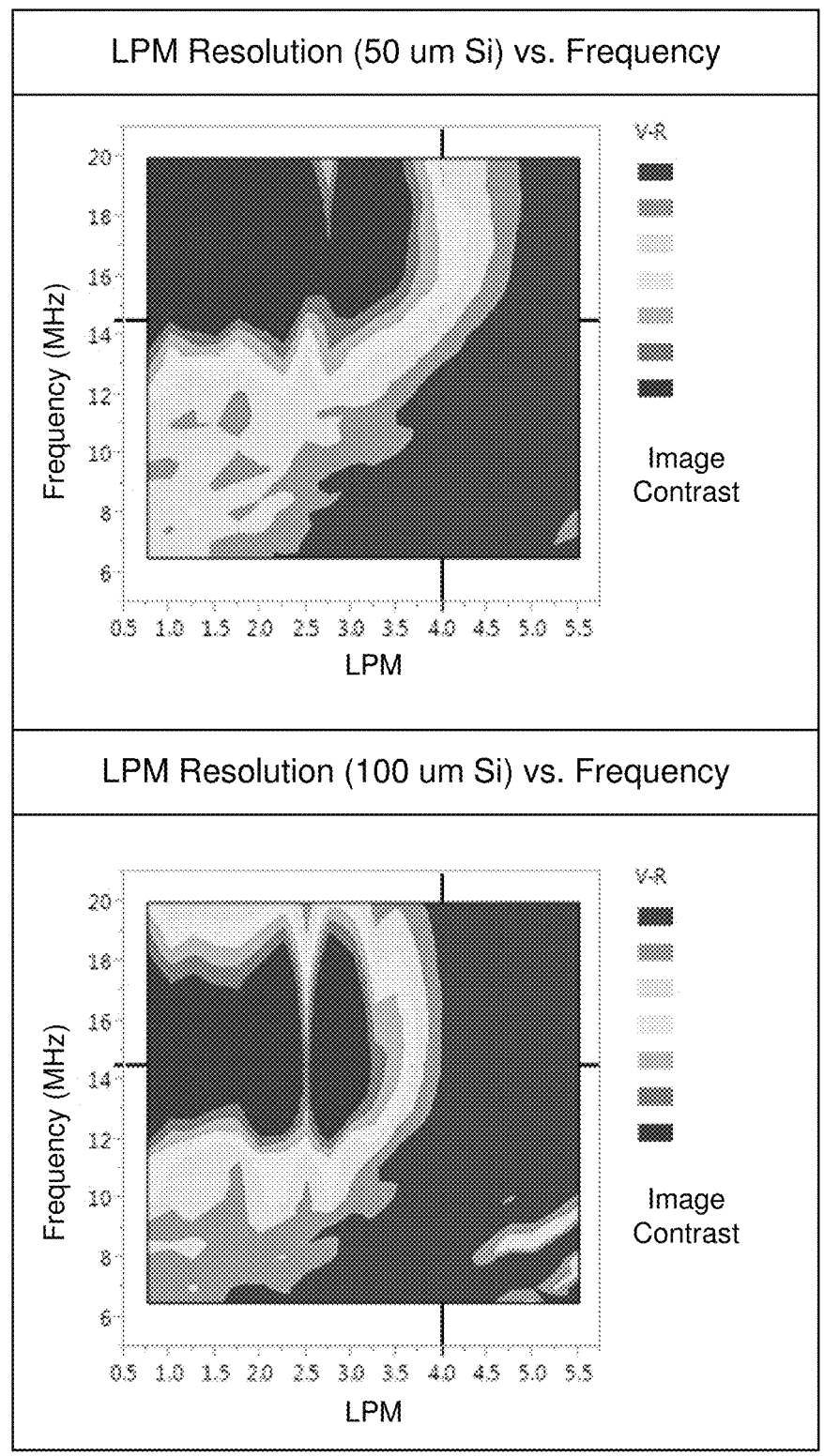
FIG. 7B illustrates contour plots showing image resolution of a fingerprint sensor device for various sensor substrate thicknesses and operating frequencies.

FIG. 7B illustrates contour plots showing image resolution of a fingerprint sensor device for various sensor substrate thicknesses and operating frequencies when imaging a finger through a relatively thick platen. The image resolution may be conveyed in terms of line-pairs per millimeter (LPM), which provides an indication of the resolution attainable with a fingerprint sensor device when imaging fingerprints. A resolution of 4 LPM may be obtainable with a 100-um thick silicon sensor substrate when operating at a frequency of about 14-18 MHz, whereas a resolution of 5 LPM may be obtainable with a 50-um thick silicon sensor substrate operating at about 16-20 MHz. In some implementations, a sensor substrate with a thickness between about 50 microns and about 150 microns is preferable. In some implementations, the sensor substrate may have a thickness between about 150 microns and 450 microns, depending in part on the ultrasonic transmitter excitation frequency. The thin substrates may be obtained, for example, by grinding and/or polishing a standard substrate down to the preferred thickness. Thin substrates may be more difficult to handle, however, and some of the methods for attaching a cap layer described below can supply additional rigidity for the thin substrates during processing and subsequent attachment to platens to avoid yield loss.

Generally speaking, thinner substrates (e.g., the sensor substrate) enable more sensitivity and therefore better performance at elevated ultrasonic frequencies. However, the same sensitivity will be impacted by what is on the backside of the sensor substrate. By providing a cap, a cavity and an acoustic barrier, the disclosed fingerprint sensor devices decrease and/or minimize the sensitivity to artifacts on the backside of the sensor substrate. In addition, the disclosed fingerprint sensor devices provide a structure that facilitate assembly of hundred-micron thick wafers/panels by increasing structural rigidity and handling ease. FIG. 7A illustrates how a cap 602 that has a small thickness can be an effective acoustic barrier, so long as a small cavity and spacing is provided between the sensor substrate 202 and the cap 602. Thus, there is no need to provide a big, thick and bulky cap in order to provide an effective acoustic barrier for the fingerprint sensor device.

Figure 7C:
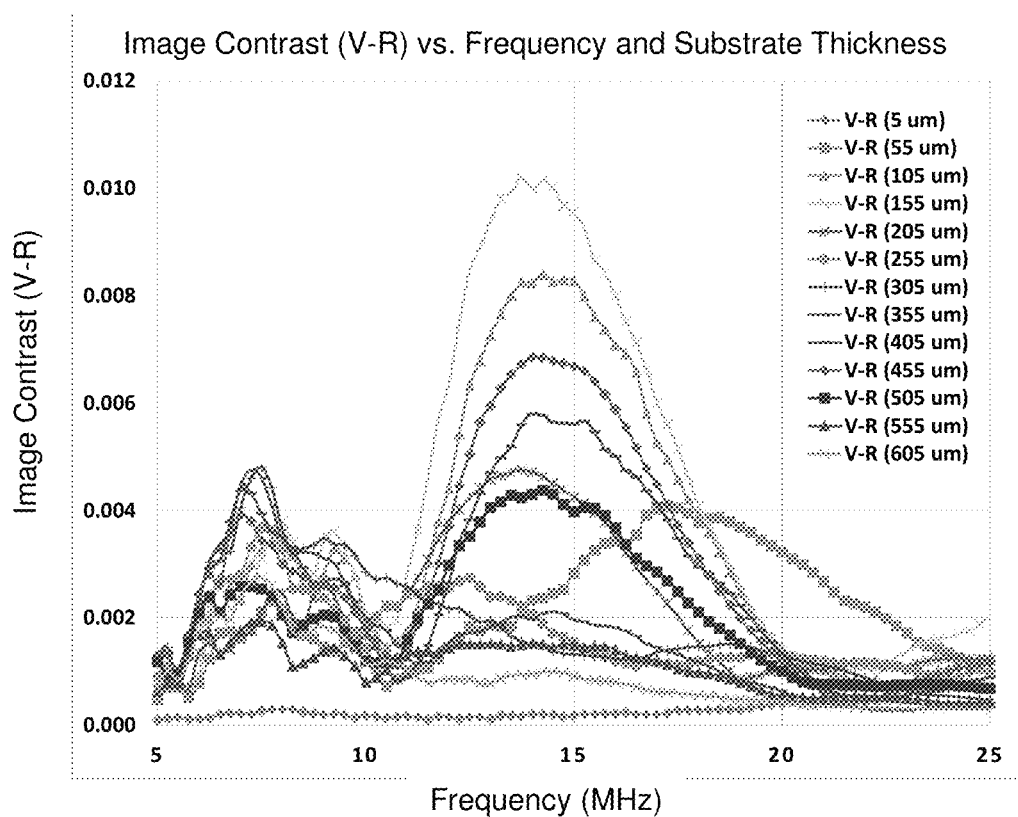
FIG. 7C illustrates an exemplary graph of image contrast for different sensor substrate thicknesses over a range of ultrasonic frequencies.

FIG. 7C illustrates an exemplary graph of image contrast for different sensor substrate thicknesses over a range of ultrasonic frequencies. As shown in FIG. 7C, in some implementations, when the sensor substrate includes silicon, a sensor substrate with a thickness between about 50 microns and about 500 microns may provide improved performance for the fingerprint sensor device for certain frequency ranges of ultrasonic waves. Higher values of image contrast can be seen for substrate thicknesses between about 55 microns and 205 microns that correspond to a range of ultrasonic transmitter excitation frequencies. A rolloff in image contrast can be seen for thicknesses between about 255 microns and 355 microns, which increases again for thicknesses between about 405 and 505 microns due in part to some destructive interference of ultrasonic waves reflecting from the first and second surfaces of the sensor substrate. With different sensor thicknesses, materials and configurations, the various responses such as image contrast, image resolution and image accuracy may differ from those shown in FIG. 7A, FIG. 7B and FIG. 7C.

Figure 8:
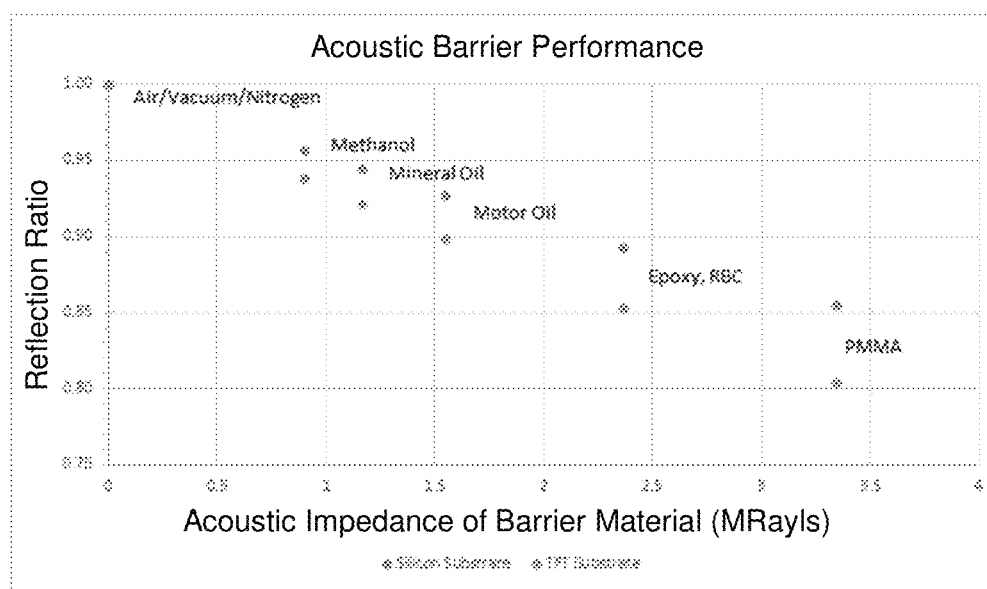
FIG. 8 illustrates an exemplary graph of various acoustic barrier performance for different materials.

The acoustic barrier 607 can be quantified in many ways. One way of quantifying the acoustic barrier 607 is the reflection ratio of the acoustic barrier 607. FIG. 8 illustrates exemplary reflection ratios for different combinations of substrates (e.g., silicon substrate, TFT substrate) and materials (e.g., air, vacuum, nitrogen and various liquids and solids). A reflection ratio of one means that the acoustic barrier 607 reflects all the ultrasonic waves. A reflection ratio of zero means that the acoustic barrier 607 transmits all the ultrasonic waves (e.g., no acoustic barrier). Table 1 illustrates various acoustic impedance values and reflection ratios for various materials and combinations of materials. The upper half of Table 1 shows the reflection ratio at the interface between silicon substrates and various cavity materials, while the lower half of Table 1 shows the reflection ratio at the interface between glass TFT substrates and various cavity materials. The values of the reflection ratio indicate that vacuum, air and other gases have a reflection ratio above about 98%, while some of the liquids and solids have a reflection ratio in excess of about 80%. These values hold for either silicon or TFT substrates, as shown in FIG.

8. Air cavities or cavities filled with other gases or vacuum are particularly attractive for effective acoustic barriers in part because the reflection ratio (e.g., reflection coefficient) is stable over a wide range of temperatures, which may be an issue for some materials such as plastic. An effective acoustic barrier allows the thickness of the sensor substrate to be tuned for maximizing the valley-ridge contrast (e.g., image contrast) and the spatial resolution (e.g., LPM, also known as line pairs per millimeter) as described above with respect to FIG. 7B. In some implementations, various backing layers may be attached to the backside of the sensor substrate prior to attaching a cap and forming the cavity to provide an effective acoustic barrier. For example, a thin substrate on the order of about 50 microns thick may be coupled to a backing layer having a thickness of about 500 microns of glass or plastic using an approximately 25-um thick adhesive layer to allow tuning of the sensor substrate thickness. A suitable backing layer may provide more support for a thin sensor substrate, which may aid when attaching the sensor die to platen with a platen adhesive.

TABLE 1

Acoustic impedance values and reflection ratios for various materials and combinations of materials

| Material | Acoustic Impedance (MRayls) | Reflection Ratio (%) |
|---|---|---|
| Silicon Substrate | 19.72 | — |
| Air | 0.00043 | 99.9978 |
| Vacuum | 0 | 100 |
| Nitrogen | 0.000406 | 99.9979 |
| Helium | 0.000174 | 99.9991 |
| Light Mineral Oil | 1.17 | 94.3992 |
| Motor Oil | 1.549 | 92.7171 |
| Methanol | 0.904 | 95.6168 |
| PMMA | 3.349 | 85.4827 |
| Epoxy, RBC | 2.365 | 89.2914 |
| TFT Substrate | 13.7 | — |
| Air | 0.00043 | 99.9969 |
| Vacuum | 0 | 100 |
| Nitrogen | 0.000406 | 99.9970 |
| Helium | 0.000174 | 99.9987 |
| Light Mineral Oil | 1.17 | 92.1318 |
| Motor Oil | 1.549 | 89.8420 |
| Methanol | 0.904 | 93.8099 |
| PMMA | 3.349 | 80.3566 |
| Epoxy, RBC | 2.365 | 85.2786 |

Different implementations may use different materials for the cap 602, such as silicon, glass, fiberglass, polyimide, plastic, metal, or a metal alloy. In some implementations, the cap 602 may be a wafer, a substrate, a panel, a sub-panel, a printed circuit board (PCB), a flexible printed circuit (FPC), an encapsulation layer, a stamped layer of metal, a plastic layer, and/or a combination thereof.

Having described various fingerprint sensor devices with different features and components, various finger sensors devices with different combinations of features and components will now be described below. The fingerprint sensor devices described in the present application may be coupled to (e.g., through the FPC 211) one or more sensor controller(s) or other circuitry (e.g., a control unit, control circuitry or an applications processor) for signal processing of signals to/from the sensor circuits.

Exemplary Fingerprint Sensor Devices Comprising Through-Substrate Vias (TSV)

Figure 9:
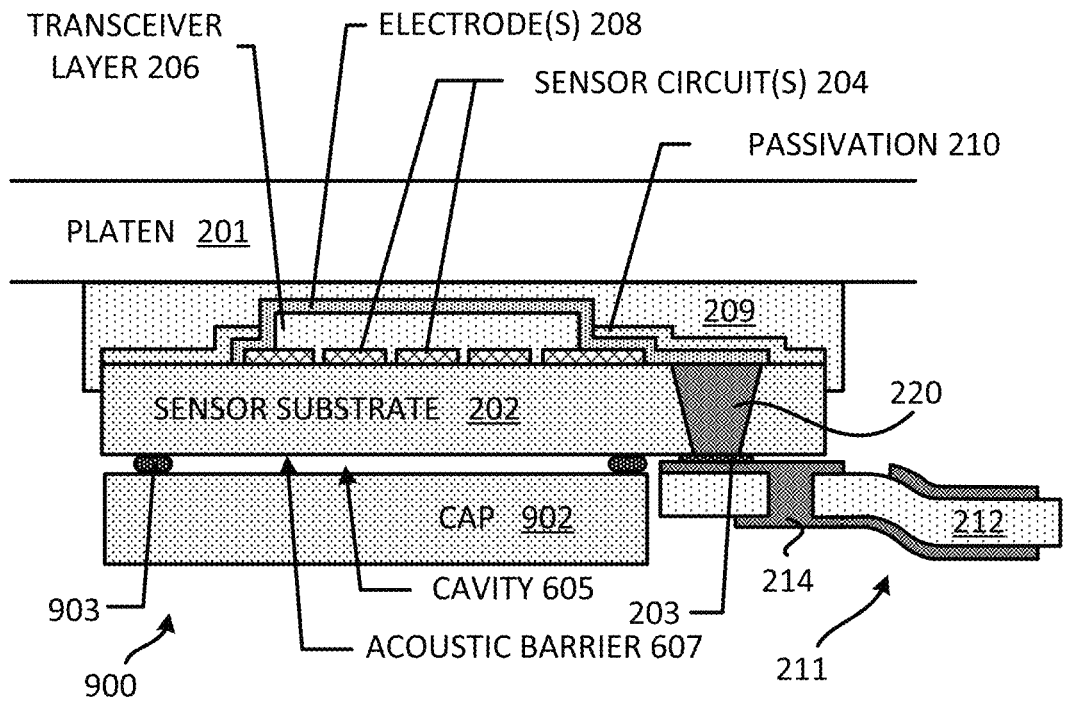
FIG. 9 illustrates a fingerprint sensor device that includes a transceiver layer over a sensor substrate, a via in the sensor substrate, and a cap.

FIG. 9 illustrates a fingerprint sensor device 900. The fingerprint sensor device 900 is similar to the fingerprint sensor device 200. The fingerprint sensor device 900 includes a cap 902, a cavity 605 and an acoustic barrier 607.

As shown in FIG. 9, the cap 902 may be locally coupled to the second surface of the sensor substrate 202 with an adhesive 903 disposed around a periphery of the cavity 605. In some implementations, the substrate-to-cap bond may include an adhesive 903 such as a thermoplastic adhesive, a pressure-sensitive adhesive (PSA), an epoxy, a UV-curable epoxy, a thermal curing epoxy, a glass frit, and more generally a metal seal, a eutectic bond, a thermocompression bond, a plasma bond, or an anodic bond. In some implementations, the cap 902 may be formed from a wafer, a substrate or a layer (e.g., silicon, TFT substrate, glass, ceramic, metal, plastic).

Figure 10:
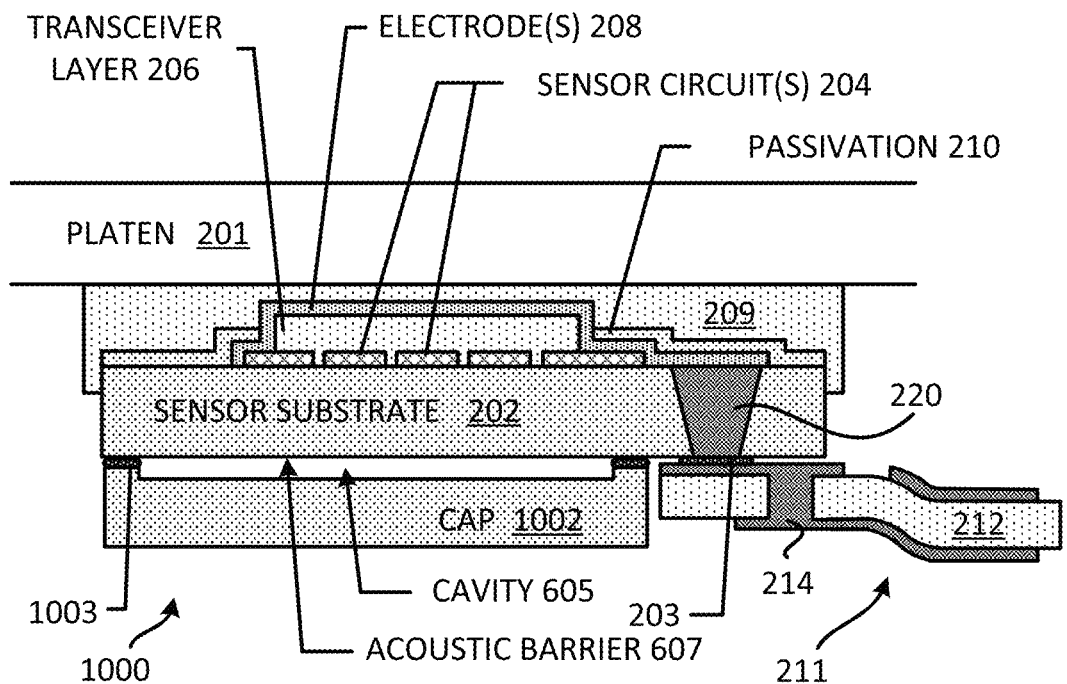
FIG. 10 illustrates a fingerprint sensor device that includes a transceiver layer over a sensor substrate, a via in the sensor substrate, and a cap.

FIG. 10 illustrates a fingerprint sensor device 1000. The fingerprint sensor device 1000 is similar to the fingerprint sensor device 200. The fingerprint sensor device 1000 includes a cap 1002, a cavity 605 and an acoustic barrier 607. As shown in FIG. 10, the cap 1002 may be coupled to the second surface of the sensor substrate 202 with an adhesive 1003. The adhesive 1003 may include a thermoplastic adhesive, a pressure-sensitive adhesive (PSA), an epoxy, a UV-curable epoxy, a thermal curing epoxy, a glass frit, and more generally a metal seal, a eutectic bond, a thermocompression bond, a plasma bond, or an anodic bond. In some implementations, the cap 1002 may be formed from a wafer or substrate (e.g., a silicon, TFT, glass, ceramic, metal, or plastic substrate) where portions of the cap, wafer or substrate have been removed (e.g., etched) to create more spacing between the sensor substrate 202 and the cap 1002.

Figure 11:
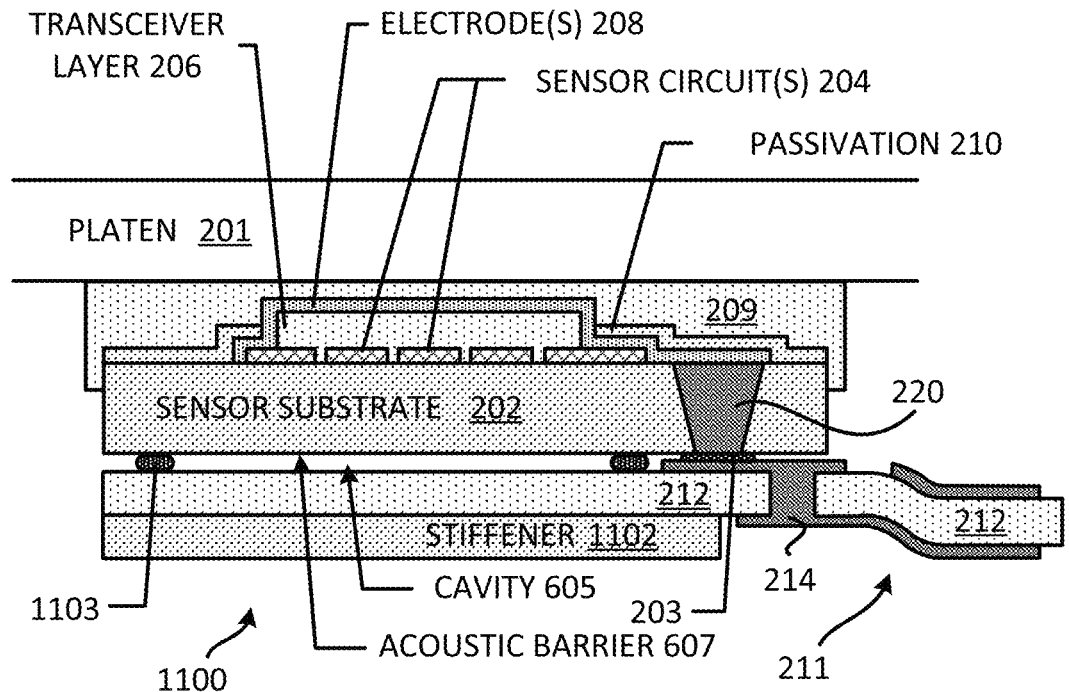
FIG. 11 illustrates a fingerprint sensor device that includes a transceiver layer over a sensor substrate, a via in the sensor substrate, and a flexible printed circuit (FPC).

FIG. 11 illustrates a fingerprint sensor device 1100. The fingerprint sensor device 1100 is similar to the fingerprint sensor device 200. The fingerprint sensor device 1100 includes a stiffener 1102, a cavity 605 and an acoustic barrier 607. The FPC 211 has an extended portion that is configured to be used as a cap. As shown in FIG. 11, the FPC 211 may include one or more dielectric layers 212 that are coupled to the second surface of the sensor substrate 202 with an adhesive 1103. The stiffener 1102 may be optionally coupled to the FPC 211 in order to provide additional structural support, since the FPC 211 is flexible. The stiffener 1102 may be construed from a number of materials, such as aluminum, stainless steel, a metal-filled polymer, plastic, metal, a metal alloy, a glass, or a composite material. In some implementations, the stiffener 1102 may be a relatively thin sheet of material, attached with a suitable epoxy or other adhesive. In some implementations, one or more backing layers (not shown), adhesive layers or other layers may be attached to the sensor substrate 202.

Figure 12:
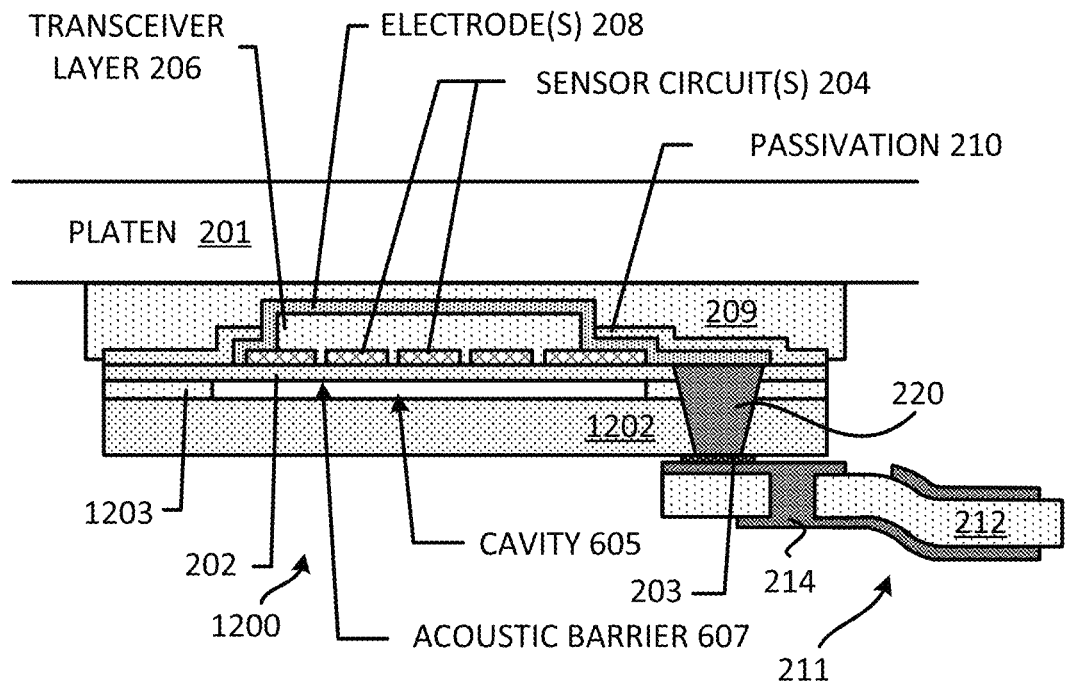
FIG. 12 illustrates a fingerprint sensor device that includes a transceiver layer over a sensor substrate, a via in the sensor substrate, and a cavity in the sensor substrate.

FIG. 12 illustrates a fingerprint sensor device 1200. The fingerprint sensor device 1200 is similar to the fingerprint sensor device 200. The fingerprint sensor device 1200 includes a substrate 1202, a cavity 605 and an acoustic barrier 607. As shown in FIG. 12, the substrate 1202 may be coupled to the second surface of the sensor substrate 202 through a bond region 1203, such as an insulative layer of silicon dioxide. The substrate 1202 (e.g., silicon-on-insulator substrate or SOI) may incorporate the sensor substrate 202 as an active layer where electronic circuits may be fabricated. FIG. 12 also illustrates that the via 220 traverses through the sensor substrate 202, the adhesive 603 and the substrate 1202.

Figure 13:
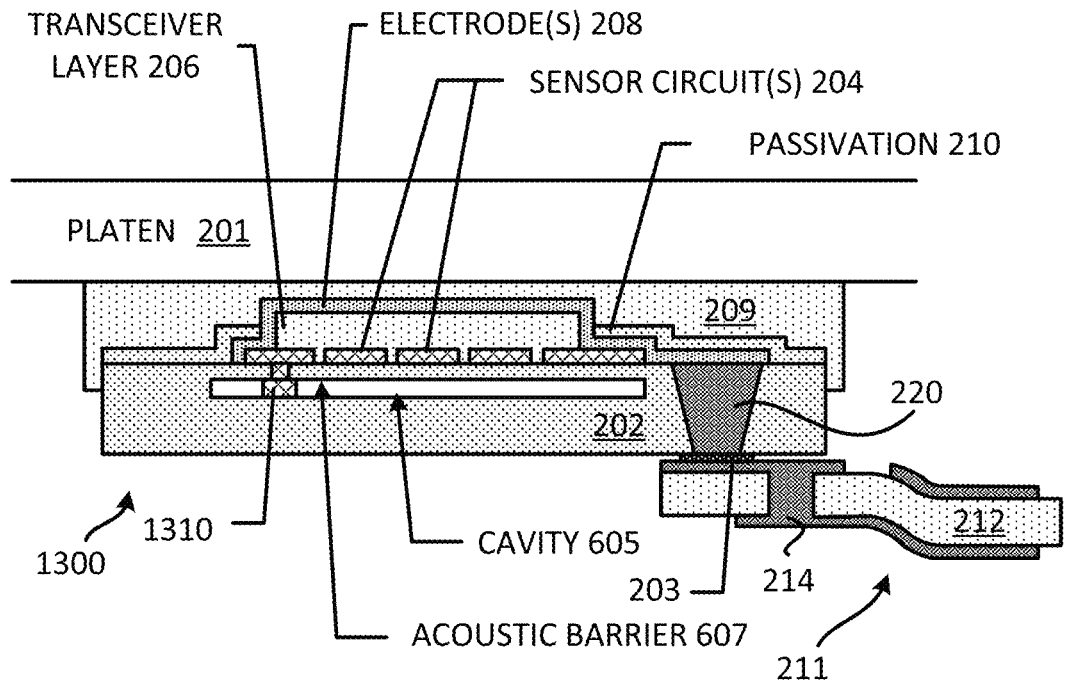
FIG. 13 illustrates a fingerprint sensor device that includes a transceiver layer over a sensor substrate, a via in the sensor substrate, and a cavity in the sensor substrate.

FIG. 13 illustrates a fingerprint sensor device 1300. The fingerprint sensor device 1300 is similar to the fingerprint sensor device 200. The fingerprint sensor device 1300 includes a cavity 605 and an acoustic barrier 607. As shown in FIG. 13, the cavity 605 may be formed inside the sensor substrate 202. In some implementations, a sacrificial layer may be formed in the sensor substrate 202 and subsequently removed to form the cavity 605. A plug 1310 may be used to close and seal the cavity 605. In some implementations, the plug 1310 may comprise a portion of a metal or dielectric layer.

Figure 14:
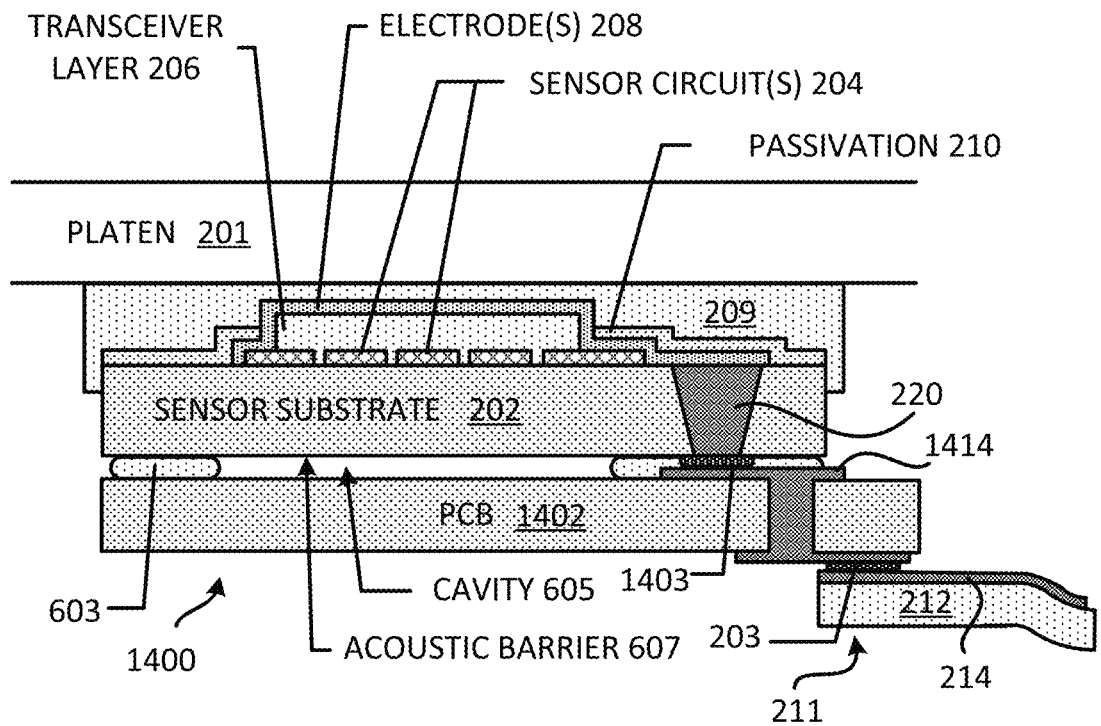
FIG. 14 illustrates a fingerprint sensor device that includes a transceiver layer over a sensor substrate, a via in the sensor substrate, and a printed circuit board (PCB).

FIG. 14 illustrates a fingerprint sensor device 1400. The fingerprint sensor device 1400 is similar to the fingerprint sensor device 200. The fingerprint sensor device 900 includes a printed circuit board (PCB) 1402, a cavity 605 and an acoustic barrier 607. As shown in FIG. 14, a portion of the PCB 1402 may be coupled to the second surface of the sensor substrate 202 with an adhesive 603. In some implementations, PCB 1402 acts as a cap for the fingerprint sensor device 1400. The PCB 1402 may include one or more interconnects 1414. The interconnects 1414 may be coupled to the via 220 with an adhesive 1403 (e.g., electrically conductive adhesive, ACF or solder). The interconnects 1414 of the PCB 1402 may be coupled to the FPC 211 with a conductive adhesive 203.

Figure 15:
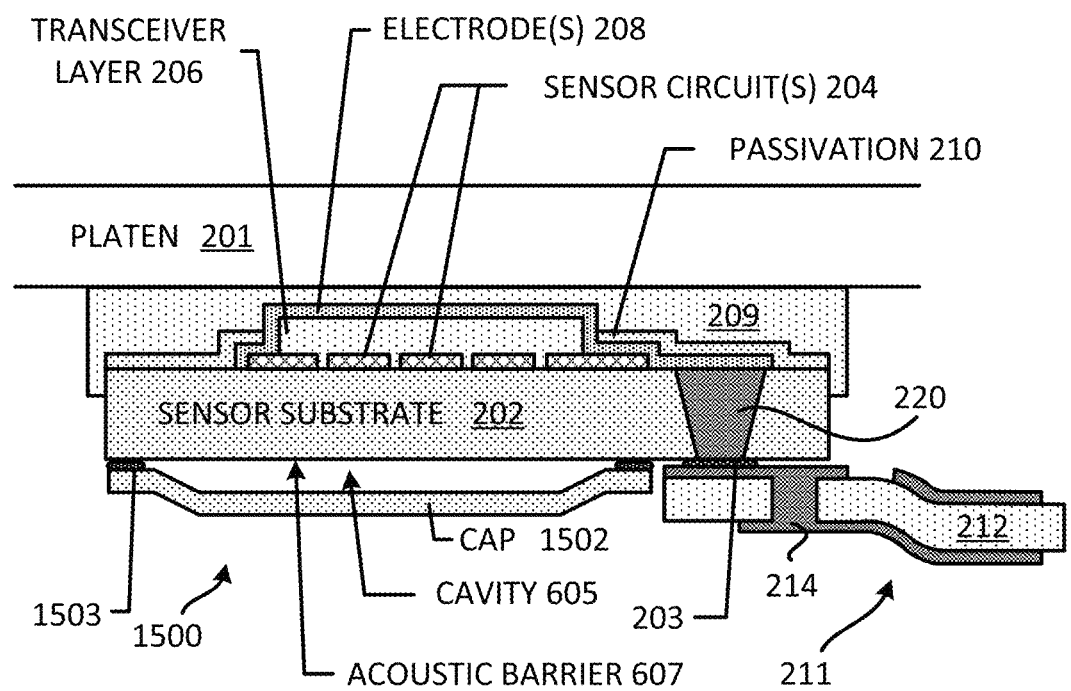
FIG. 15 illustrates a fingerprint sensor device that includes a transceiver layer over a sensor substrate, a via in the sensor substrate, and a cap.

FIG. 15 illustrates a fingerprint sensor device 1500. The fingerprint sensor device 1500 is similar to the fingerprint sensor device 200. The fingerprint sensor device 1500 includes a cap 1502, a cavity 605 and an acoustic barrier 607. As shown in FIG. 15, the cap 1502 may be coupled to the second surface of the sensor substrate 202 with an adhesive 1503 similar to adhesive 603 described above with respect to FIG. 6. In some implementations, the cap 1502 may be formed from a layer of stamped metal.

Exemplary Fingerprint Sensor Devices Comprising a Molded Via Bar

Figure 16:
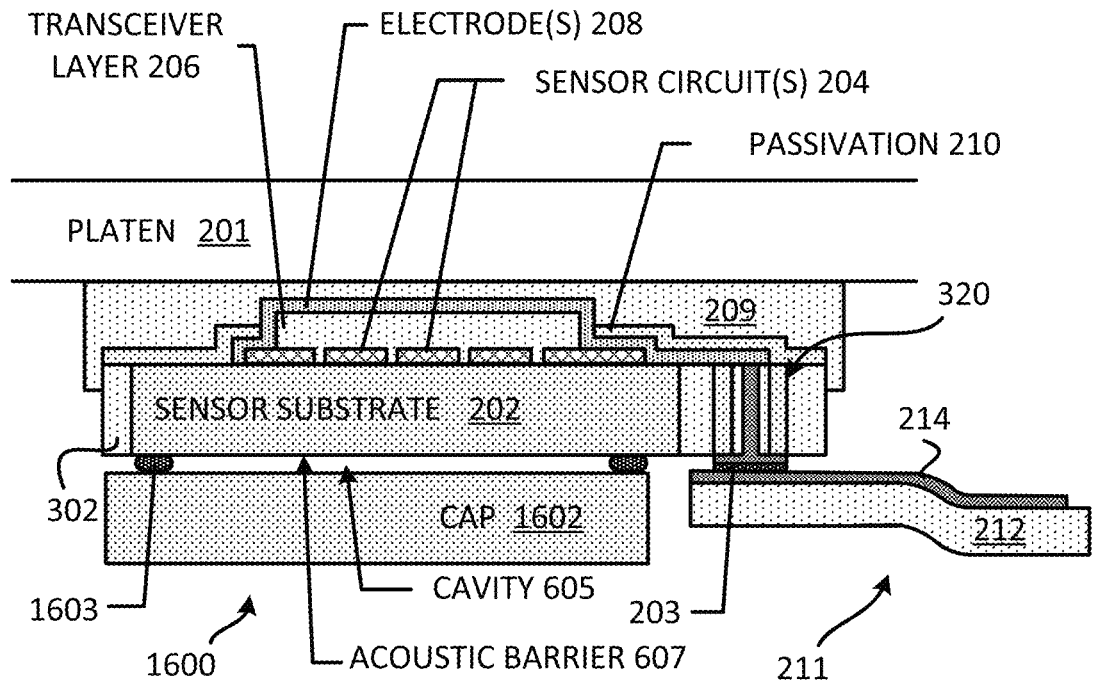
FIG. 16 illustrates a fingerprint sensor device that includes a transceiver layer over a sensor substrate, a molded via bar in the sensor substrate, and a cap.

FIG. 16 illustrates a fingerprint sensor device 1600. The fingerprint sensor device 1600 is similar to the fingerprint sensor device 300. The fingerprint sensor device 1600 includes a cap 1602, a cavity 605 and an acoustic barrier 607. As shown in FIG. 16, the cap 1602 may be coupled to the second surface of the sensor substrate 202 with an adhesive 1603. In some implementations, the cap 1602 may be formed from a wafer or substrate (e.g., silicon, TFT substrate, glass, ceramic, metal, or plastic).

Figure 17:
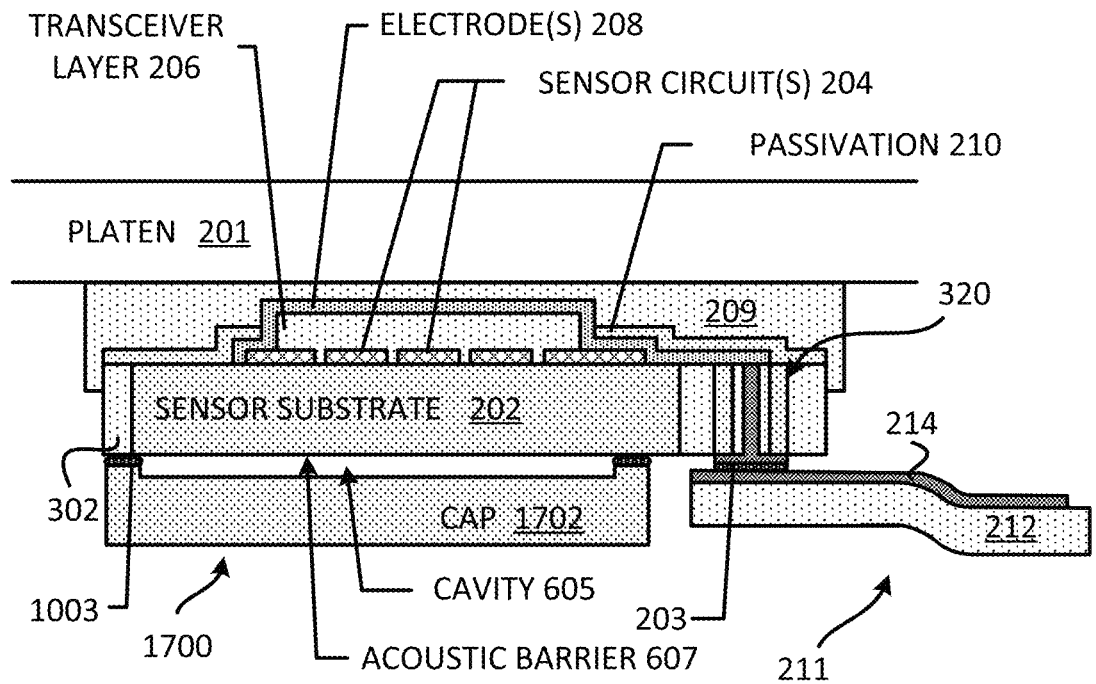
FIG. 17 illustrates a fingerprint sensor device that includes a transceiver layer over a sensor substrate, a molded via bar in the sensor substrate, and a cap.

FIG. 17 illustrates a fingerprint sensor device 1700. The fingerprint sensor device 1700 is similar to the fingerprint sensor device 300. The fingerprint sensor device 1700 includes a cap 1702, a cavity 605 and an acoustic barrier 607. As shown in FIG. 17, the cap 1702 may be coupled to the second surface of the sensor substrate 202 with an adhesive 1003 described above with respect to FIG. 10. In some implementations, the cap 1702 may be formed from a wafer or substrate (e.g., silicon, TFT substrate, glass, ceramic, metal, plastic) where portions of the cap, wafer or substrate have been removed (e.g., etched) to create more spacing between the sensor substrate 202 and the cap 1702 in the cavity 605.

Figure 18:
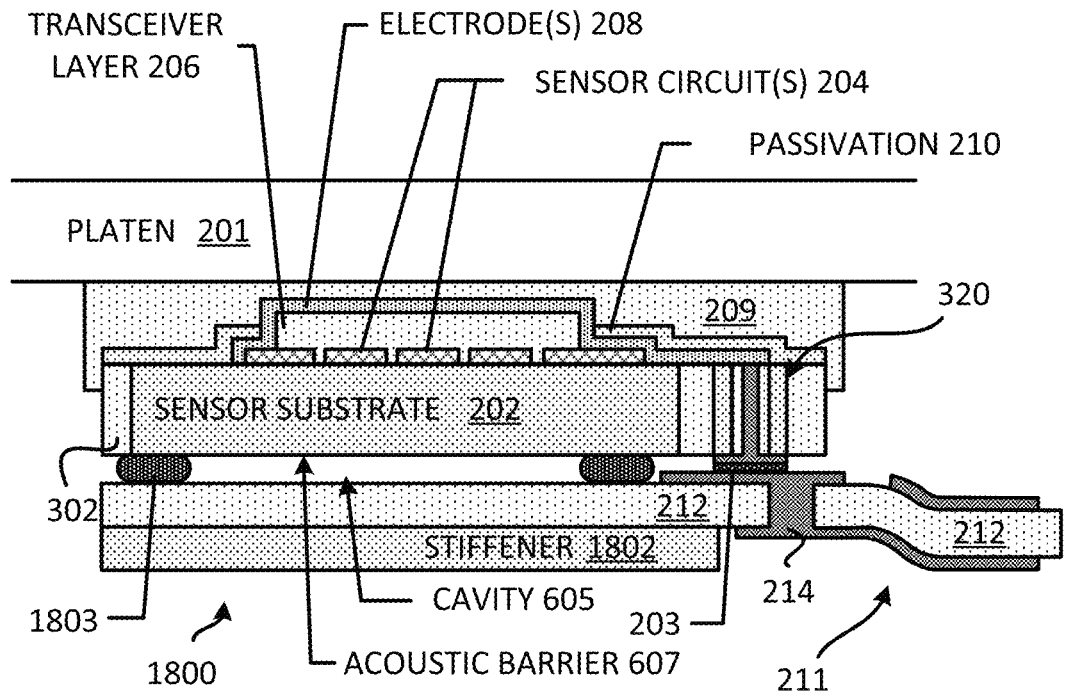
FIG. 18 illustrates a fingerprint sensor device that includes a transceiver layer over a sensor substrate, a molded via bar in the sensor substrate, and a flexible printed circuit (FPC).

FIG. 18 illustrates a fingerprint sensor device 1800. The fingerprint sensor device 1800 is similar to the fingerprint sensor device 300. The fingerprint sensor device 1800 includes a stiffener 1802, a cavity 605 and an acoustic barrier 607. The FPC 211 has an extended portion that is configured to be used as a cap. As shown in FIG. 18, the FPC 211 includes one or more dielectric layers 212 that may be coupled to the second surface of the sensor substrate 202 with an adhesive 1803. The stiffener 1802 may be optionally coupled to the FPC 211 in order to provide structural support, since the FPC 211 is flexible.

Figure 19:
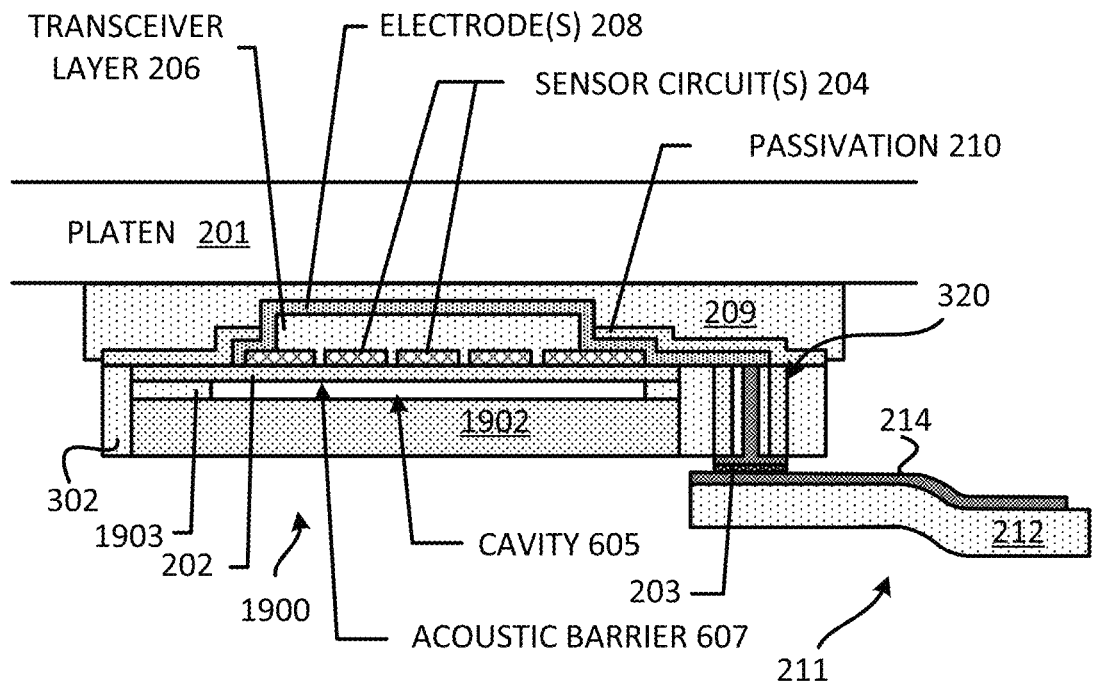
FIG. 19 illustrates a fingerprint sensor device that includes a transceiver layer over a sensor substrate, a molded via bar, and a cavity in the sensor substrate.

FIG. 19 illustrates a fingerprint sensor device 1900. The fingerprint sensor device 1900 is similar to the fingerprint sensor device 300. The fingerprint sensor device 1900 includes a substrate 1902, a cavity 605 and an acoustic barrier 607. As shown in FIG. 19, the substrate 1902 may be coupled to the second surface of the sensor substrate 202 through a bond region 1903, such as an insulative layer of silicon dioxide. The substrate 1902 (e.g., a silicon-on-insulator substrate or SOI) may incorporate the sensor substrate 202 as an active layer where electronic circuits may be fabricated. FIG. 19 also illustrates a molded via bar 320 with one or more vias that traverse through an encapsulation layer 302 in a reconstituted portion of the substrate 1902.

Figure 20:
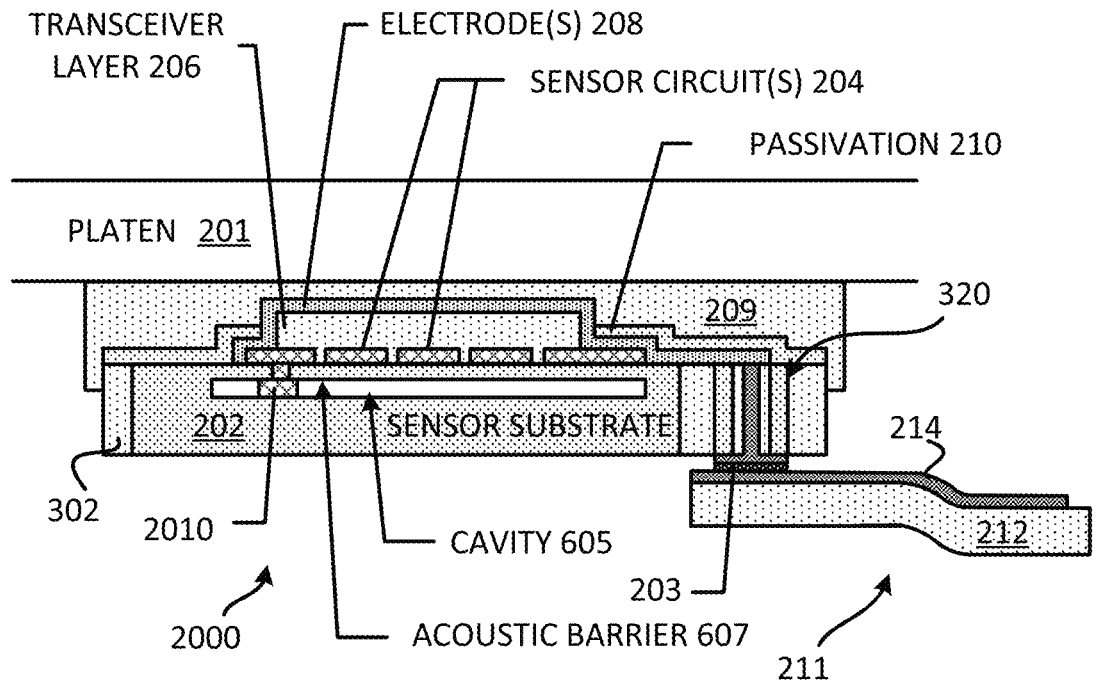
FIG. 20 illustrates a fingerprint sensor device that includes a transceiver layer over a sensor substrate, a molded via bar, and a cavity in the sensor substrate.

FIG. 20 illustrates a fingerprint sensor device 2000. The fingerprint sensor device 2000 is similar to the fingerprint sensor device 300. The fingerprint sensor device 2000 includes a cavity 605 and an acoustic barrier 607. As shown in FIG. 20, the cavity 605 may be formed inside the sensor substrate 202. In some implementations, a sacrificial layer may be formed in the sensor substrate 202 and subsequently removed to form the cavity 605. A plug 2010 may be used to close and seal the cavity 605. In some implementations, the plug 2010 may comprise a portion of a metal or dielectric layer.

Figure 21:
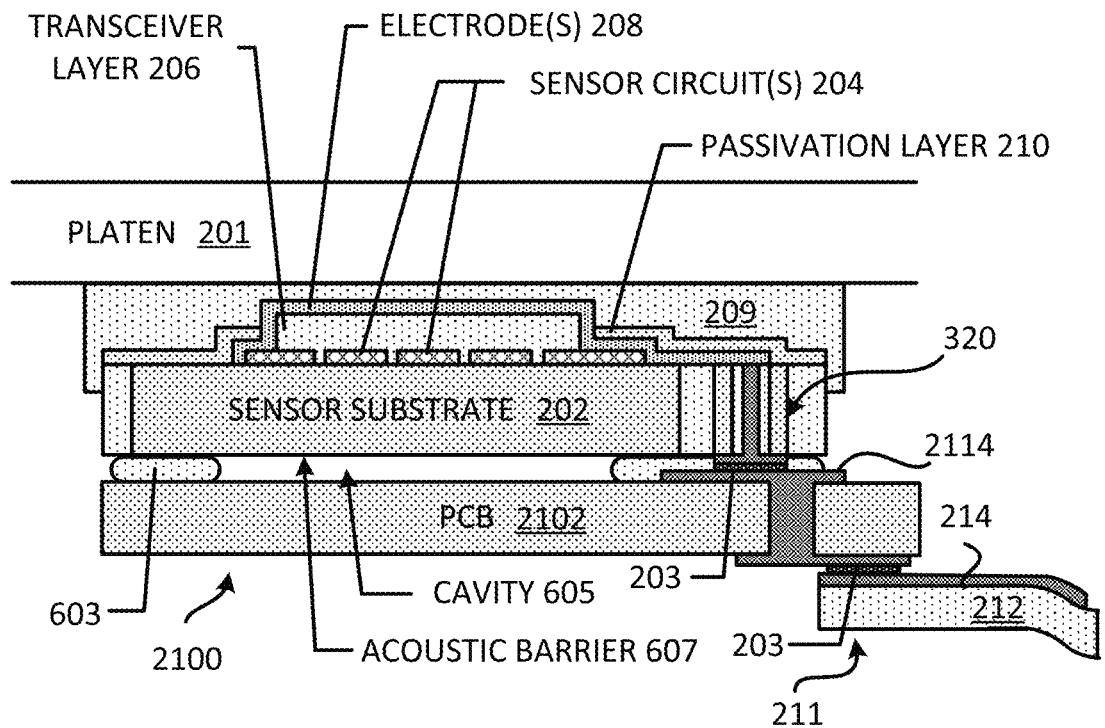
FIG. 21 illustrates a fingerprint sensor device that includes a transceiver layer over a sensor substrate, a molded via bar in the sensor substrate, and a printed circuit board (PCB).

FIG. 21 illustrates a fingerprint sensor device 2100. The fingerprint sensor device 2100 is similar to the fingerprint sensor device 300. The fingerprint sensor device 2100 includes a printed circuit board (PCB) 2102, a cavity 605 and an acoustic barrier 607. As shown in FIG. 21, a portion of the PCB 2102 may be coupled to the second surface of the sensor substrate 202 with an adhesive 603. In some implementations, PCB 2102 acts as the cap for the fingerprint sensor device 2100. The PCB 2102 may include one or more interconnects 2114. The interconnects 2114 may be coupled to vias in the via bar 320 with an adhesive 203 (e.g., electrically conductive adhesive, ACF or solder). One or more interconnects 2114 of the PCB 2102 may be coupled to the FPC 211 through conductive adhesive 203.

Figure 22:
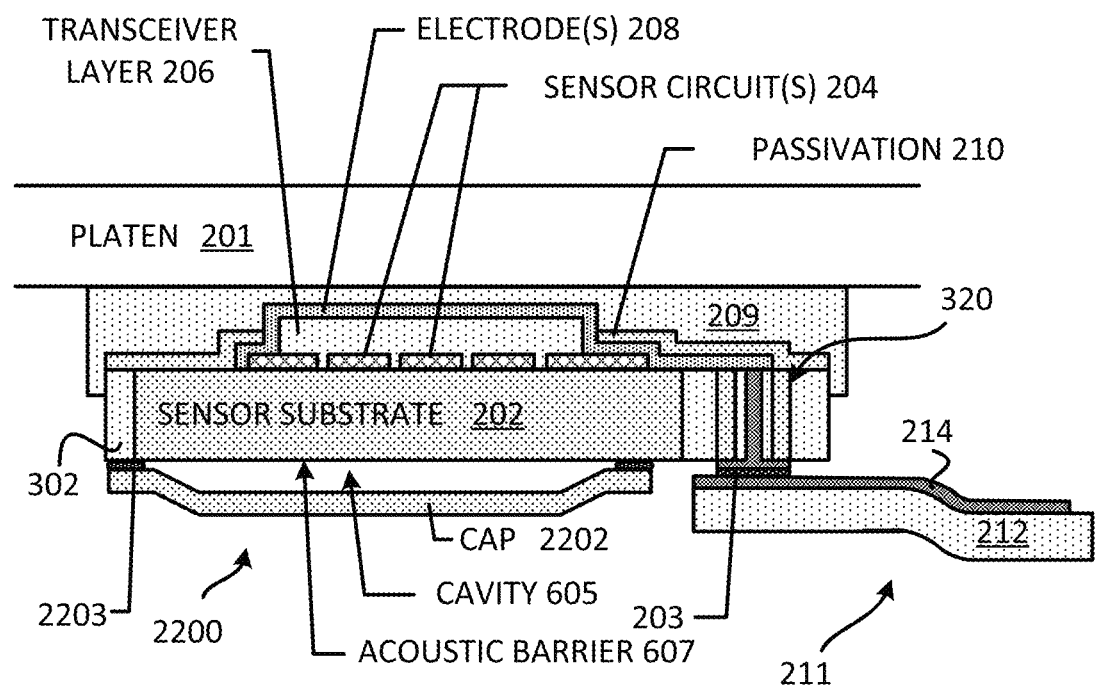
FIG. 22 illustrates a fingerprint sensor device that includes a transceiver layer over a sensor substrate, a via in the sensor substrate, and a cap.

FIG. 22 illustrates a fingerprint sensor device 2200. The fingerprint sensor device 2200 is similar to the fingerprint sensor device 300. The fingerprint sensor device 2200 includes a cap 2202, a cavity 605 and an acoustic barrier 607. As shown in FIG. 22, the cap 2202 may be coupled to the second surface of the sensor substrate 202 with an adhesive 2203. In some implementations, the cap 2202 may be formed from a layer of stamped metal.

Exemplary Fingerprint Sensor Devices Comprising a Recessed Portion

Figure 23:
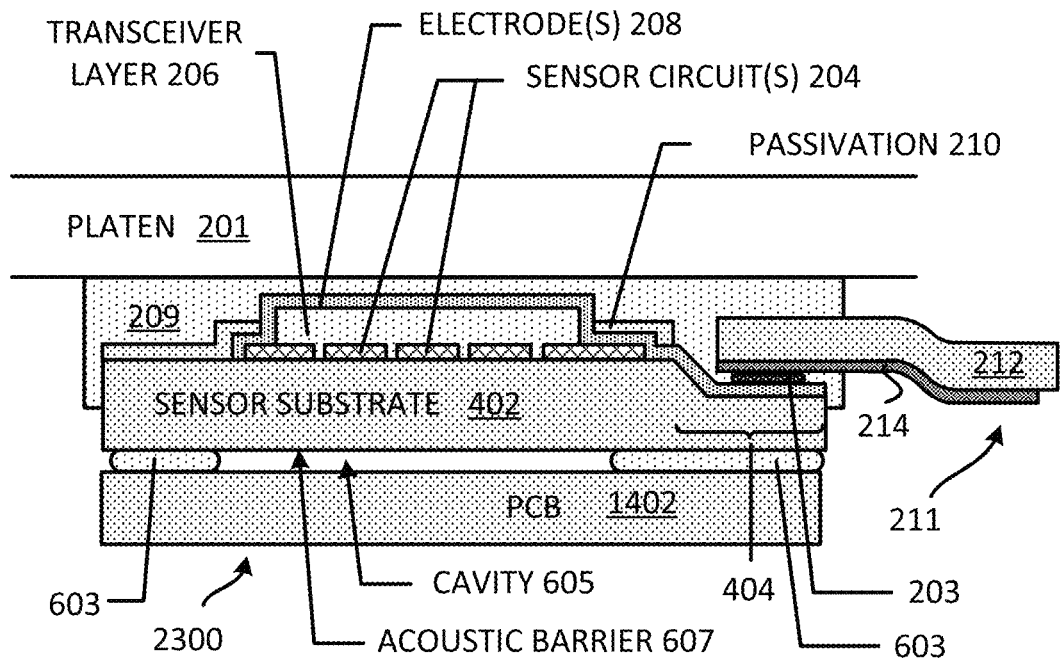
FIG. 23 illustrates a fingerprint sensor device that includes a transceiver layer over a sensor substrate, a recessed portion in the sensor substrate, and a printed circuit board (PCB).

FIG. 23 illustrates a fingerprint sensor device 2300. The fingerprint sensor device 2300 is similar to the fingerprint sensor device 400. The fingerprint sensor device 2300 includes a printed circuit board (PCB) 1402, a cavity 605 and an acoustic barrier 607. As shown in FIG. 23, the PCB 1402 may be coupled to the second surface of the sensor substrate 202 with an adhesive 603. In some implementations, PCB 1402 acts as a cap for the fingerprint sensor device 2300. As shown in FIG. 23, the FPC 211 may be coupled to the one or more transceiver electrodes 208 and sensor circuits 204 with the conductive adhesive 203. Note that in this implementation and other implementations with a recessed portion 404, through-substrate vias traversing the sensor substrate may be omitted.

Figure 24:
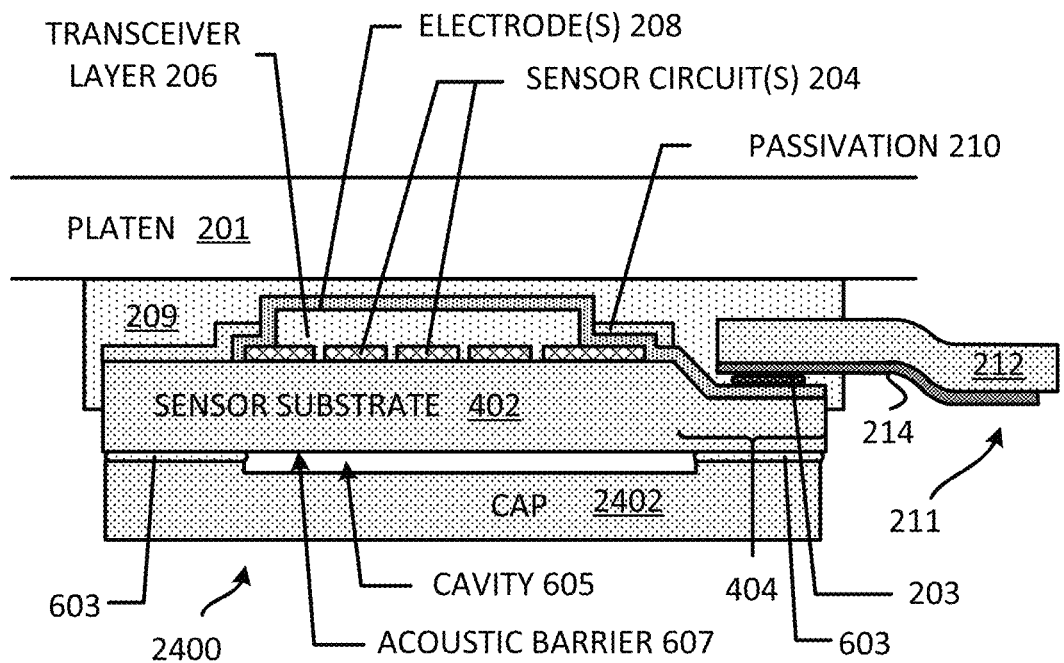
FIG. 24 illustrates a fingerprint sensor device that includes a transceiver layer over a sensor substrate, a recessed portion in the sensor substrate, and a cap.

FIG. 24 illustrates a fingerprint sensor device 2400. The fingerprint sensor device 2400 is similar to the fingerprint sensor device 400. The fingerprint sensor device 2400 includes a cap 2402, a cavity 605 and an acoustic barrier 607. As shown in FIG. 24, the cap 2402 may be coupled to the second surface of the sensor substrate 202 with an adhesive 603. In some implementations, the cap 2402 may be formed from a wafer or substrate (e.g., silicon, TFT substrate, glass, ceramic, metal, or plastic) where portions of the cap, wafer or substrate have been removed (e.g., etched)

to create more spacing between the sensor substrate 202 and the cap 2402 in the cavity 605.

Figure 25:
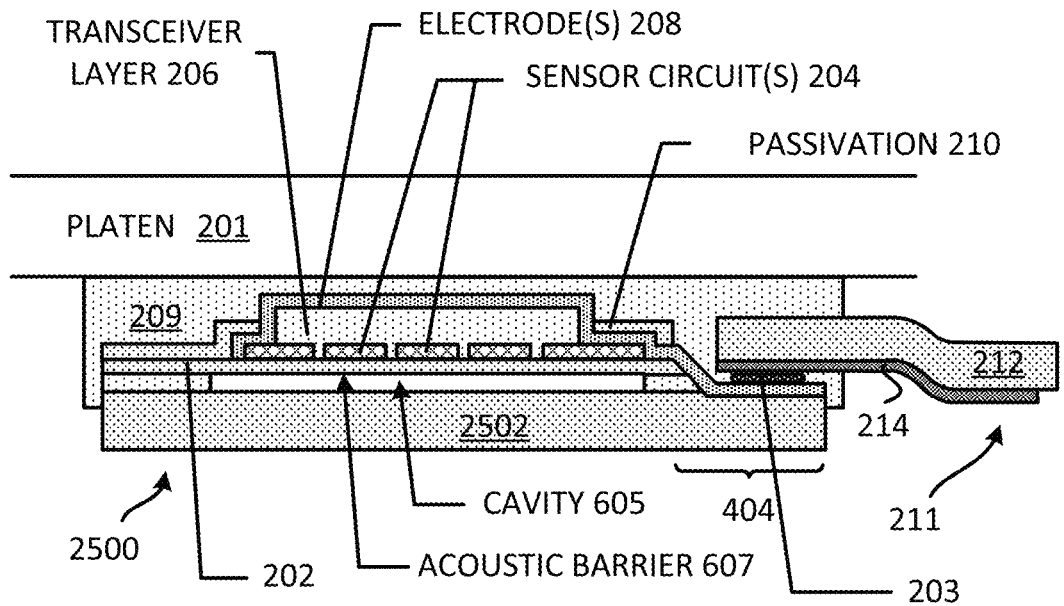
FIG. 25 illustrates a fingerprint sensor device that includes a transceiver layer over a sensor substrate, a recessed portion in the sensor substrate, and a cavity in the sensor substrate.

FIG. 25 illustrates a fingerprint sensor device 2500. The fingerprint sensor device 2500 is similar to the fingerprint sensor device 400. The fingerprint sensor device 2500 includes a substrate 2502, a cavity 605 and an acoustic barrier 607. As shown in FIG. 25, the substrate 2502 may be coupled to the second surface of the sensor substrate 202 through the adhesive 603. The substrate 2502 (e.g., silicon-on-insulator substrate or SOI) may be similar to the sensor substrate 202.

Figure 26:
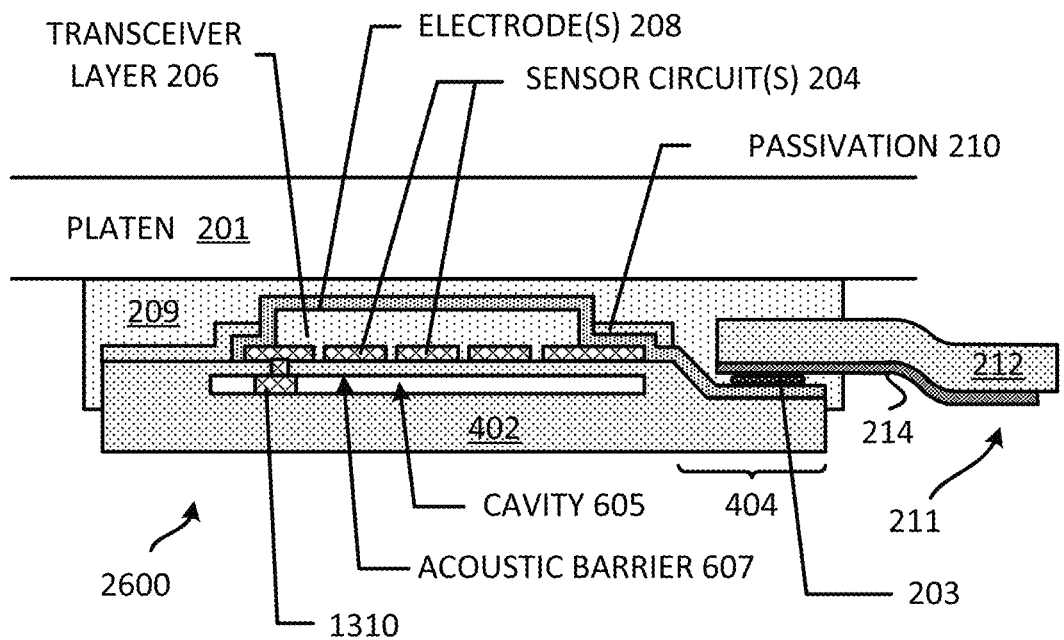
FIG. 26 illustrates a fingerprint sensor device that includes a transceiver layer over a sensor substrate, a recessed portion in the sensor substrate, and a cavity in the sensor substrate.

FIG. 26 illustrates a fingerprint sensor device 2600. The fingerprint sensor device 2600 is similar to the fingerprint sensor device 400. The fingerprint sensor device 2600 includes a cavity 605 and an acoustic barrier 607. As shown in FIG. 26, the cavity 605 may be formed inside the sensor substrate 402. In some implementations, a sacrificial layer may be formed in the sensor substrate 402 and subsequently removed to form the cavity 605. A plug 1310 may be used to close and seal the cavity 605. In some implementations, the plug 1310 may comprise a portion of a metal or dielectric layer.

Figure 27:
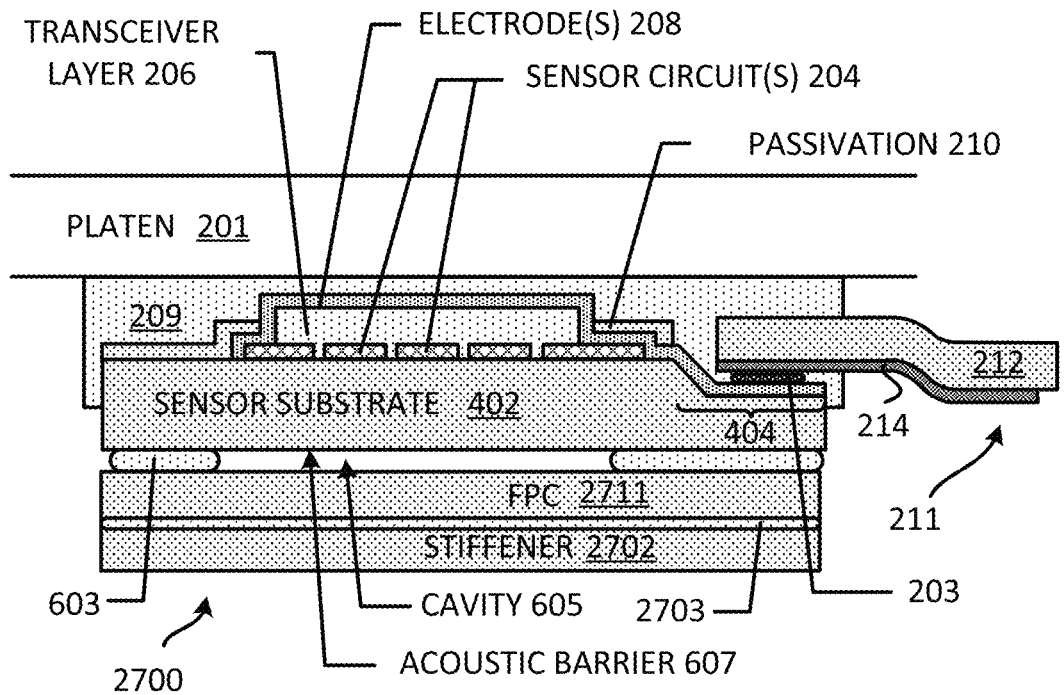
FIG. 27 illustrates a fingerprint sensor device that includes a transceiver layer over a sensor substrate, a recessed portion in the sensor substrate, and a flexible printed circuit (FPC).

FIG. 27 illustrates a fingerprint sensor device 2700. The fingerprint sensor device 2700 is similar to the fingerprint sensor device 400. The fingerprint sensor device 2700 includes a stiffener 2702, a flexible printed circuit (FPC) 211, a cavity 605 and an acoustic barrier 607. The FPC 211 may have an extended portion referred to as FPC 2711 that is configured to be used as a cap. The FPC 211 includes one or more dielectric layers 212 that may be coupled to the second surface of the sensor substrate 402 with an adhesive 603. The stiffener 2702 may be optionally coupled to the FPC 2711 with an adhesive 2703 in order to provide structural support, since the FPC 2711 is flexible. In some implementations, a second FPC 2711 disjoint from FPC 211 may be used to form the cap and the cavity 605. The second FPC 2711 may include an optional stiffener 2702 and adhesive 2703 as shown.

Figure 28:
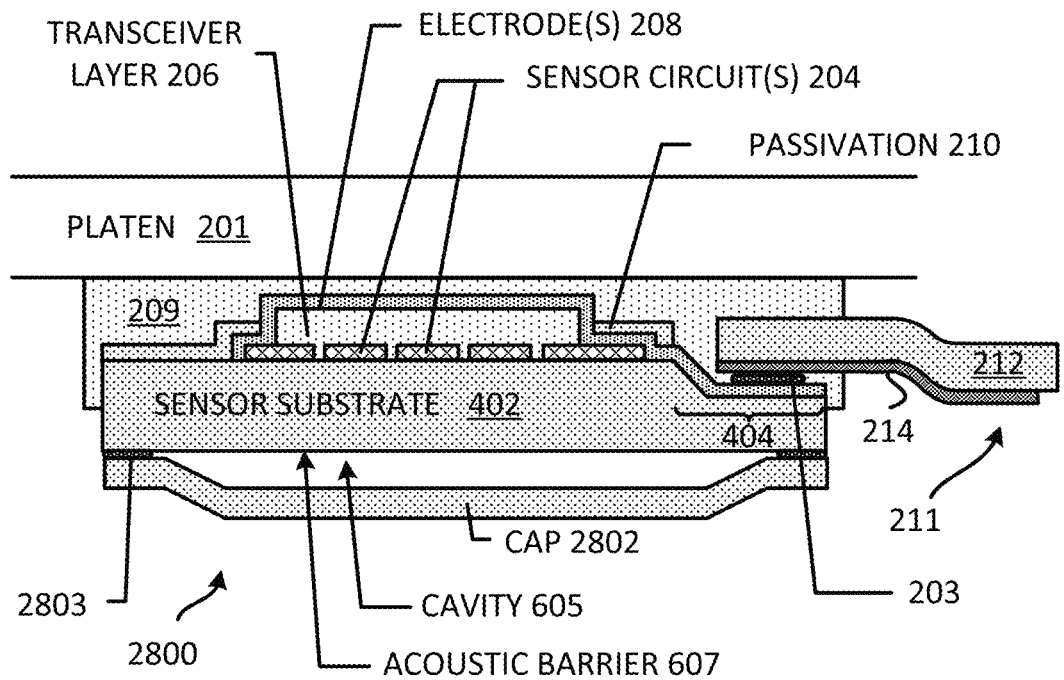
FIG. 28 illustrates a fingerprint sensor device that includes a transceiver layer over a sensor substrate, a recessed portion in the sensor substrate, and a cap.

FIG. 28 illustrates a fingerprint sensor device 2800. The fingerprint sensor device 2800 is similar to the fingerprint sensor device 400. The fingerprint sensor device 2800 includes a cap 2802, a cavity 605 and an acoustic barrier 607. As shown in FIG. 28, the cap 2802 may be coupled to the second surface of the sensor substrate 402 with an adhesive 2803. In some implementations, the cap 2802 may be formed from a layer of stamped metal.

Exemplary Inverted Fingerprint Sensor Devices

Figure 29:
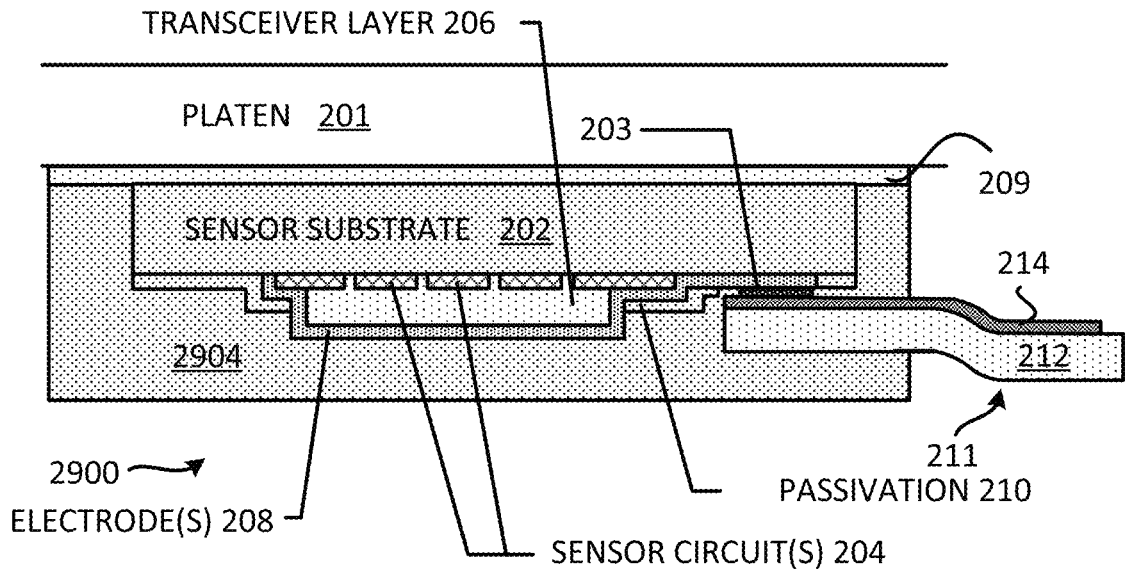
FIG. 29 illustrates an inverted fingerprint sensor device that includes a transceiver layer over a sensor substrate and an encapsulation layer.

FIG. 29 illustrates a fingerprint sensor device 2900 that is inverted. The fingerprint sensor device 2900 is similar to the fingerprint sensor device 500. The fingerprint sensor device 2900 includes an encapsulation layer 2904. The encapsulation layer 2904 at least partially encapsulates the FPC 211, the sensor substrate 202, the one or more transceiver electrodes 208, and/or the transceiver layer 206.

Figure 30:
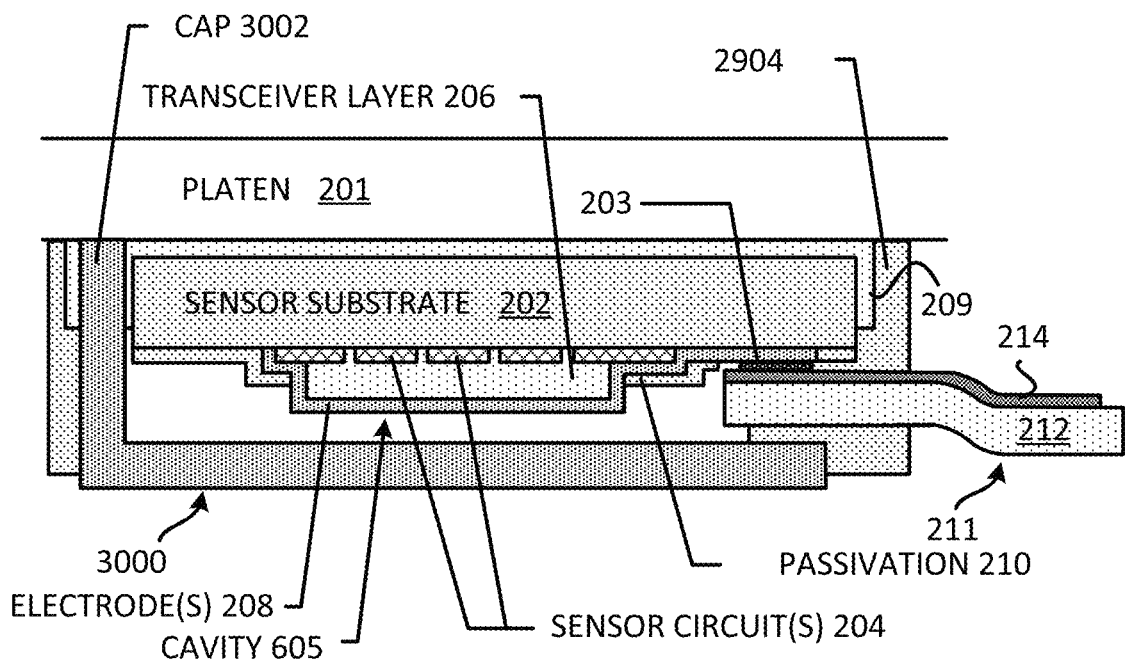
FIG. 30 illustrates an inverted fingerprint sensor device that includes a transceiver layer over a sensor substrate, an encapsulation layer, a cap and a cavity.

FIG. 30 illustrates a fingerprint sensor device 3000 that is inverted. The fingerprint sensor device 3000 is similar to the fingerprint sensor device 500. The fingerprint sensor device 3000 includes a cap 3002, an encapsulation layer 2904, a cavity 605 and an acoustic barrier 607. The encapsulation layer 2904 may be configured as an edge seal. In some implementations, the cap 3002 may surround the rectangular-shaped sensor substrate 202 on one, two or three sides, with the fourth side accessible for the connection of FPC 211 to the one or more transceiver electrodes 208 and the sensor circuits 204 on the sensor substrate 202. The acoustic barrier 607 may be formed at the interface of the one or more transceiver electrodes 208 and the cavity 605.

Figure 31:
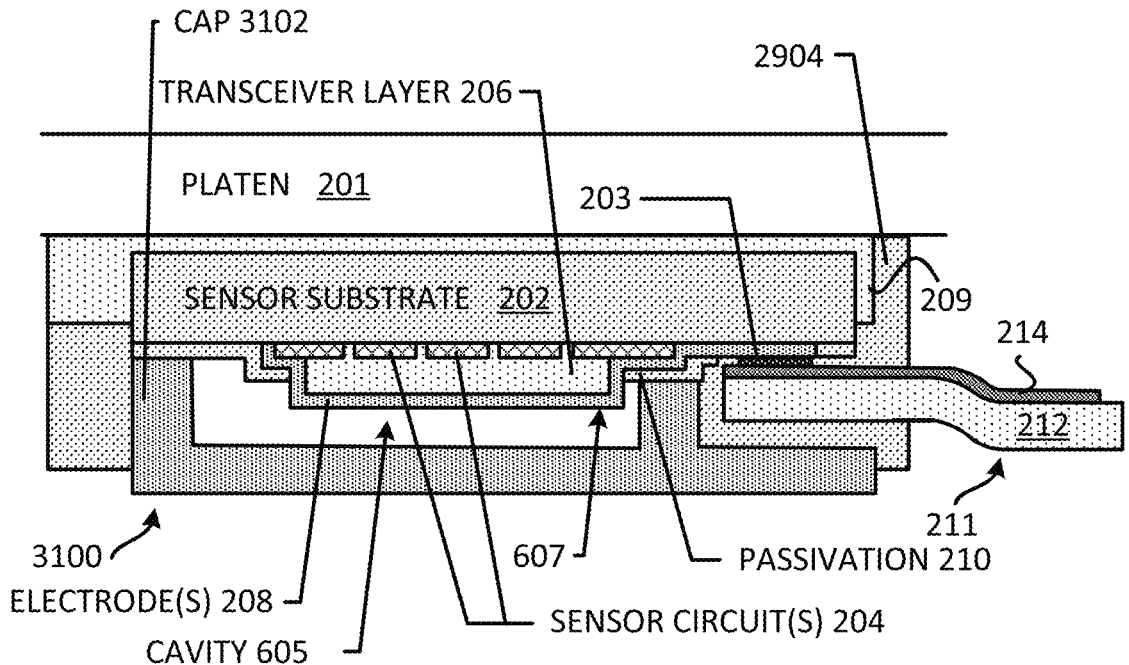
FIG. 31 illustrates an inverted fingerprint sensor device that includes a transceiver layer over a sensor substrate, an encapsulation layer, a cap and a cavity.

FIG. 31 illustrates a fingerprint sensor device 3100 that is inverted. The fingerprint sensor device 3100 is similar to the fingerprint sensor device 500. The fingerprint sensor device 3100 includes a cap 3102, an encapsulation layer 2904, a cavity 605 and an acoustic barrier 607. The encapsulation layer 2904 may be configured as an edge seal. In some implementations, the cap 3102 may be mounted on a surface of the sensor substrate 202, with portions of the cap 3102 forming a ring or partial ring around the sensor circuits 204 and also forming one or more sides of the cavity 605. A portion of the cap 3102 may extend over a portion of the FPC 211 and the overlapping region may be filled with an adhesive, an edge seal material, an encapsulant, a portion of the encapsulation layer 2904, or other suitable material.

Figure 32:
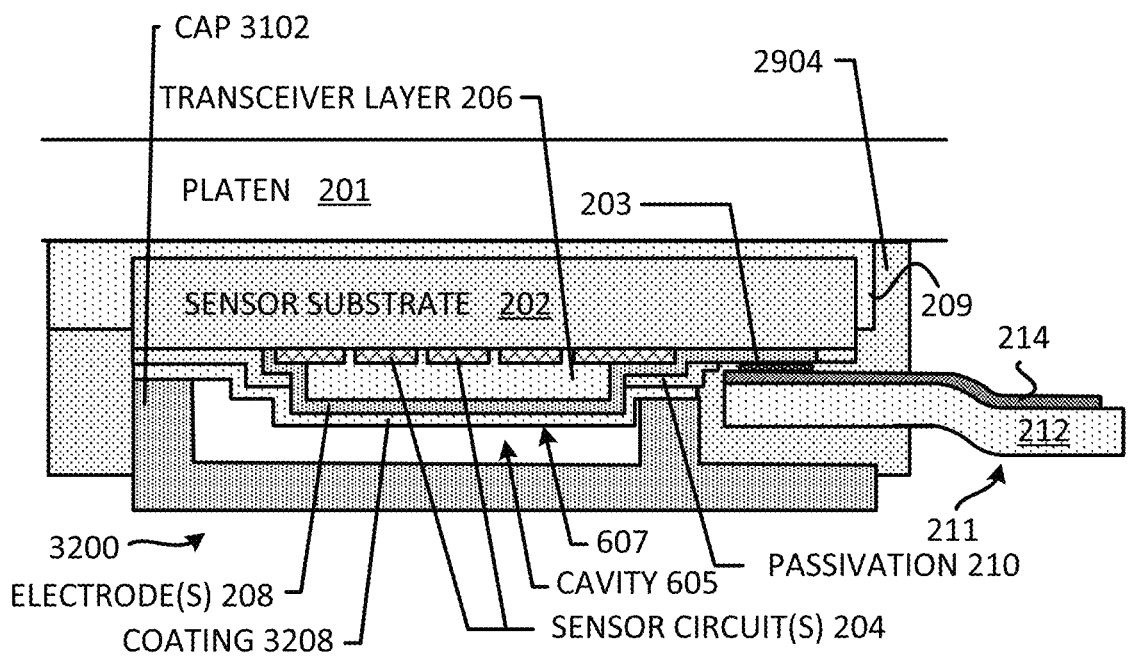
FIG. 32 illustrates an inverted fingerprint sensor device that includes a transceiver layer over a sensor substrate, a coating layer, an encapsulation layer, a cap and a cavity.

FIG. 32 illustrates a fingerprint sensor device 3200 that is inverted. The fingerprint sensor device 3200 is similar to the fingerprint sensor device 500. The fingerprint sensor device 3200 includes a cap 3102, an encapsulation layer 2904, a cavity 605 and an acoustic barrier 607. The encapsulation layer 2904 may be configured as an edge seal. A coating layer 3208 such as an optically clear adhesive (OCA), a pressure-sensitive adhesive (PSA) or a thermally or UV-curable epoxy may be disposed on portions of or across an outer surface of the sensor substrate 202 to aid in the attachment of the cap 3102. The acoustic barrier 607 may be formed at the interface of one or more coating layers 3208 and the cavity 605.

Figure 33:
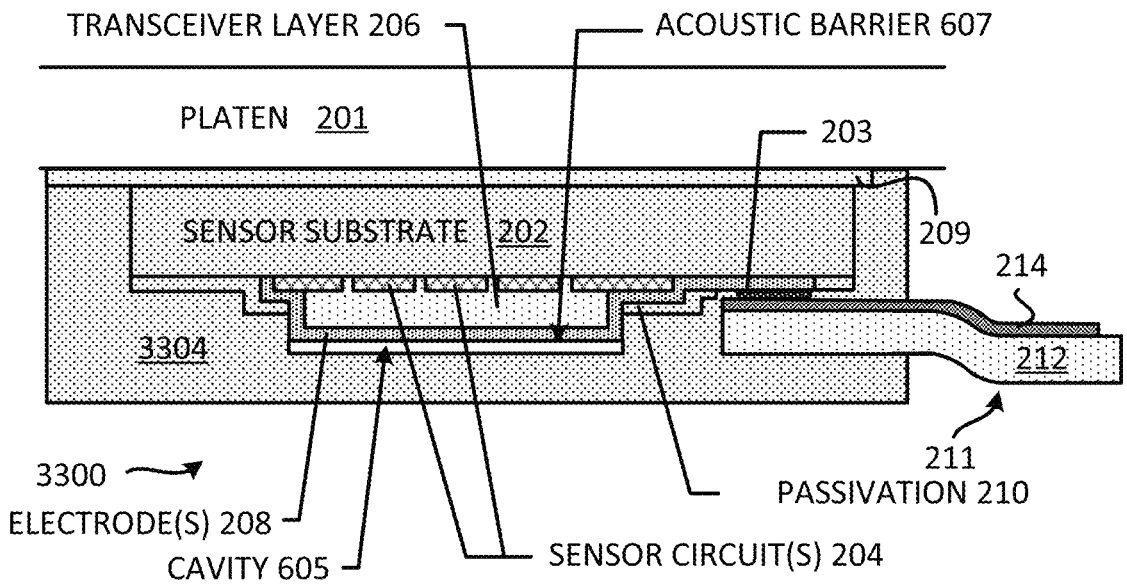
FIG. 33 illustrates an inverted fingerprint sensor device that includes a transceiver layer over a sensor substrate, an encapsulation layer, and a cavity in the encapsulation layer.

FIG. 33 illustrates a fingerprint sensor device 3300 that is inverted. The fingerprint sensor device 3300 is similar to the fingerprint sensor device 500. The fingerprint sensor device 3300 includes an encapsulation layer 3304, a cavity 605 and an acoustic barrier 607. The cavity 605 may be formed in the encapsulation layer 3304. The acoustic barrier 607 may be defined by the interface of the one or more transceiver electrodes 208 and the cavity 605. In some implementations, the cavity 605 may be formed in the encapsulation layer 2904 during a molding process to form the acoustic barrier 607. The cavity 605 may be formed within the encapsulation layer 2904, for example, using transfer molding or injection molding.

Figure 34:
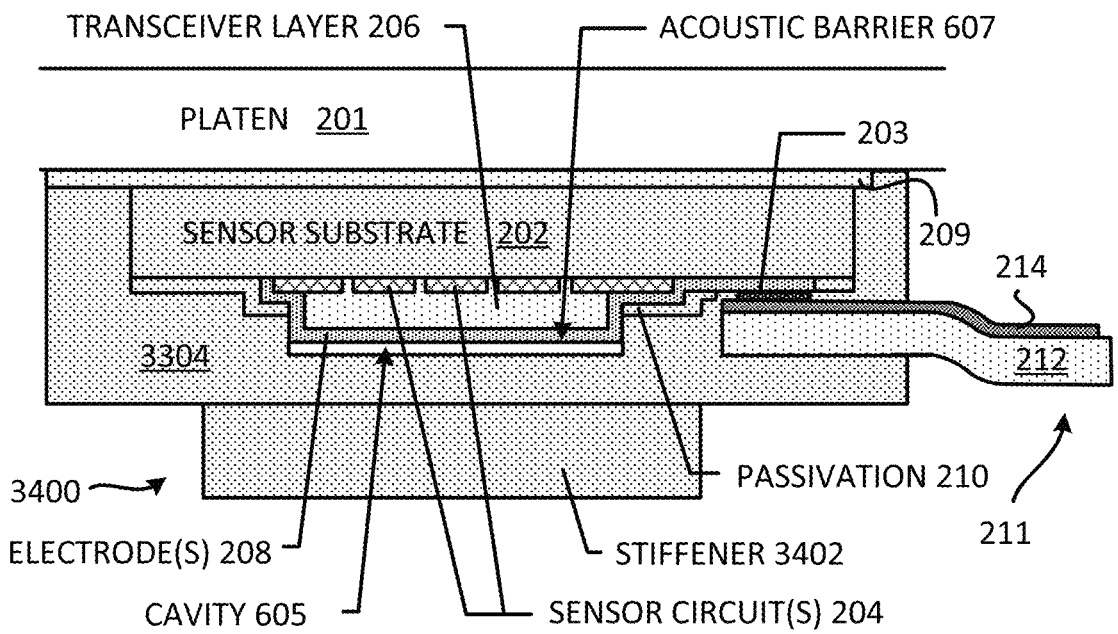
FIG. 34 illustrates an inverted fingerprint sensor device that includes a transceiver layer over a sensor substrate, an encapsulation layer, a cavity in the encapsulation layer, and a stiffener.

FIG. 34 illustrates a fingerprint sensor device 3400 that is inverted. The fingerprint sensor device 3400 is similar to the fingerprint sensor device 3300. The fingerprint sensor device 3400 includes a stiffener 3402 that is embedded in or otherwise coupled to the encapsulation layer 3304 with an adhesive or other attachment mechanism (not shown).

Figure 35:
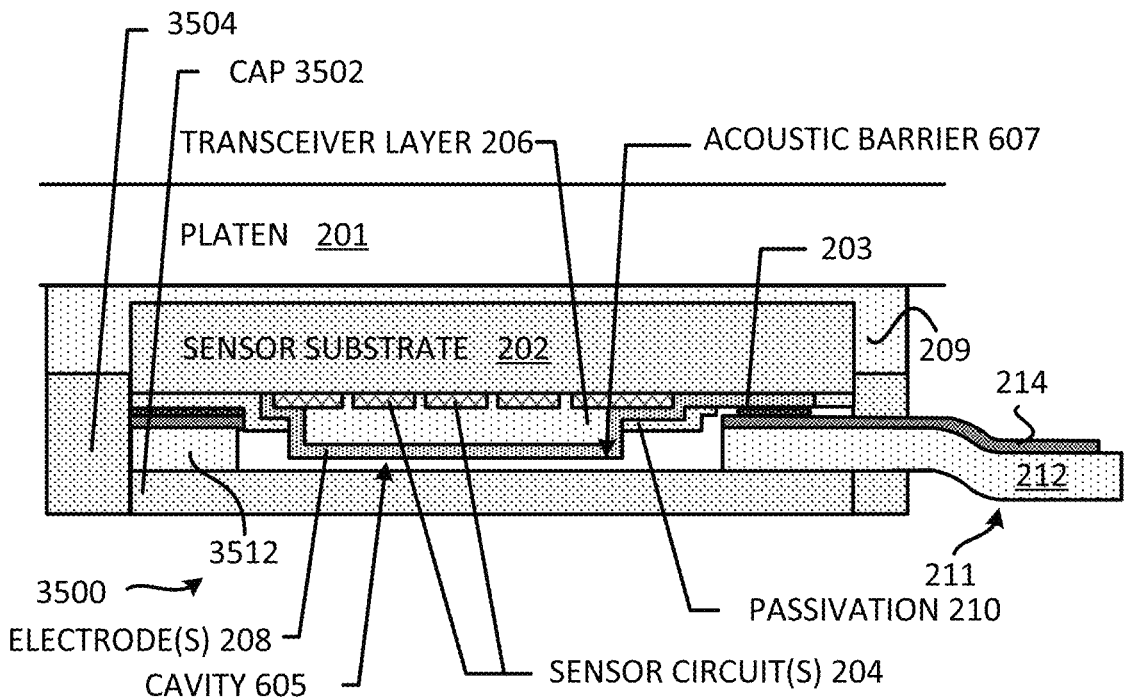
FIG. 35 illustrates an inverted fingerprint sensor device that includes a transceiver layer over a sensor substrate, an encapsulation layer, a flexible printed circuit (FPC), and a cavity in the FPC.

FIG. 35 illustrates a fingerprint sensor device 3500 that is inverted. The fingerprint sensor device 3500 is similar to the fingerprint sensor device 500. The fingerprint sensor device 3500 includes a cap 3502, an encapsulation layer 3504, a cavity 605 and an acoustic barrier 607. The cap 3502 may include one or more dielectric layers 3512 and/or metal electrode layers associated with FPC 211. For example, one or more dielectric layers 3512 and/or metal electrode layers of FPC 211 may stretch over a ringed or framed cavity region formed from a cutout region in dielectric layer 212 of FPC 211. Alternatively, the cap 3502 may be a stiffener, coverlay or other material suspended over a cutout region in the dielectric layer 212 of FPC 211. Coverlays, shields and other protective elements may be included on one or both sides of the FPC 211 to provide mechanical support.

Figure 36:
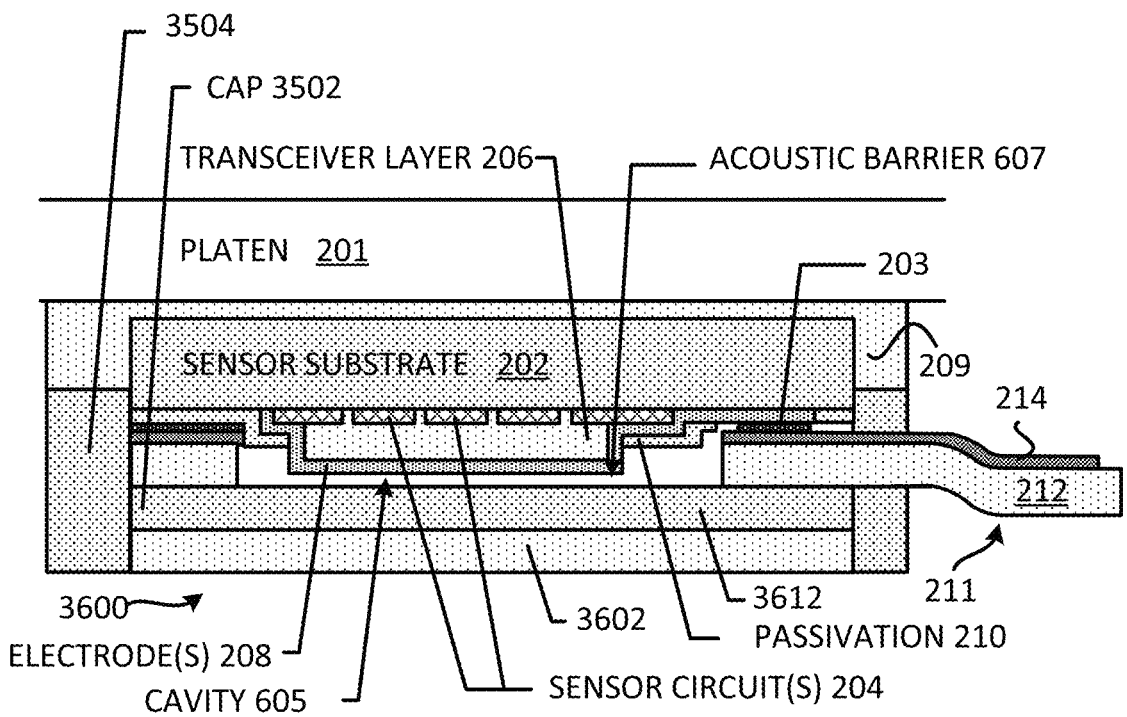
FIG. 36 illustrates an inverted fingerprint sensor device that includes a transceiver layer over a sensor substrate, an encapsulation layer, a flexible printed circuit (FPC), a cavity in the FPC, and a stiffener.

FIG. 36 illustrates a fingerprint sensor device 3600 that is inverted. The fingerprint sensor device 3600 is similar to the fingerprint sensor device 3500. The fingerprint sensor device 3600 includes a stiffener 3602 that is coupled to the cap 3502. In some implementations, the stiffener 3602 may be attached to one or more dielectric and/or metal electrode layers 3612 of FPC 211 to augment cap 3502.

In some implementations, electrode features formed in or on FPC 211 may extend over and couple to the transceiver layer 206 to serve as the transceiver electrode 208. Fingerprint sensor devices with a transceiver electrode 208 as part of FPC 211 may be configured, for example, from the fingerprint sensor devices shown in FIGS. 4-5 and FIGS. 23-36 and elsewhere with corresponding adjustments.

Exemplary Inverted Fingerprint Sensor Devices Comprising a Molded Via Bar

Figure 37:
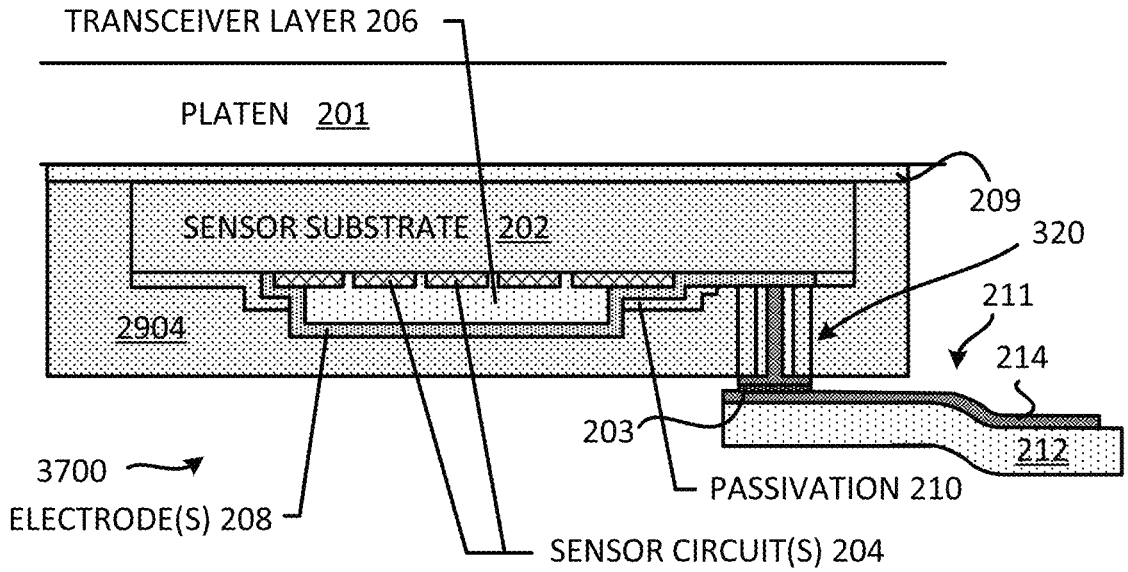
FIG. 37 illustrates an inverted fingerprint sensor device that includes a transceiver layer over a sensor substrate, an encapsulation layer, and a molded via bar.

FIG. 37 illustrates a fingerprint sensor device 3700 that is inverted. The fingerprint sensor device 3700 is similar to the fingerprint sensor device 500. The fingerprint sensor device 3700 includes a molded via bar 320 in the encapsulation layer 2904. The molded via bar 320 may be coupled to the FPC 211 and the one or more transceiver electrodes 208 or other portions of the sensor substrate 202.

Figure 38:
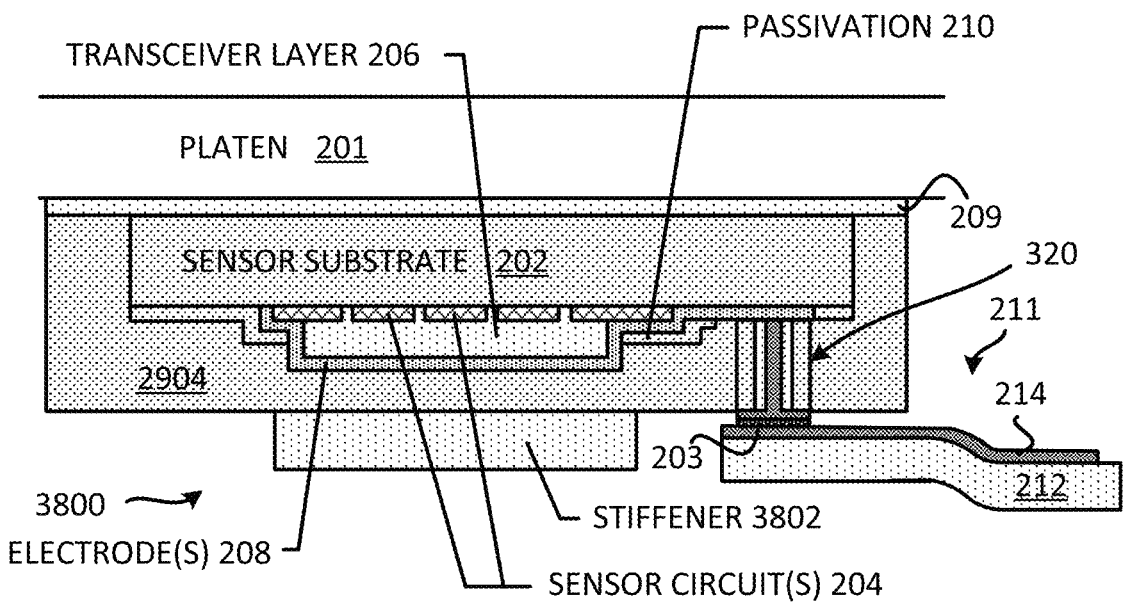
FIG. 38 illustrates an inverted fingerprint sensor device that includes a transceiver layer over a sensor substrate, an encapsulation layer, a stiffener, and a molded via bar.

FIG. 38 illustrates a fingerprint sensor device 3800 that is inverted. The fingerprint sensor device 3800 is similar to the fingerprint sensor device 3700. The fingerprint sensor device 3800 includes a stiffener 3802 that may be embedded in or otherwise coupled to the encapsulation layer 2904 with an adhesive or other attachment mechanism (not shown).

Figure 39:
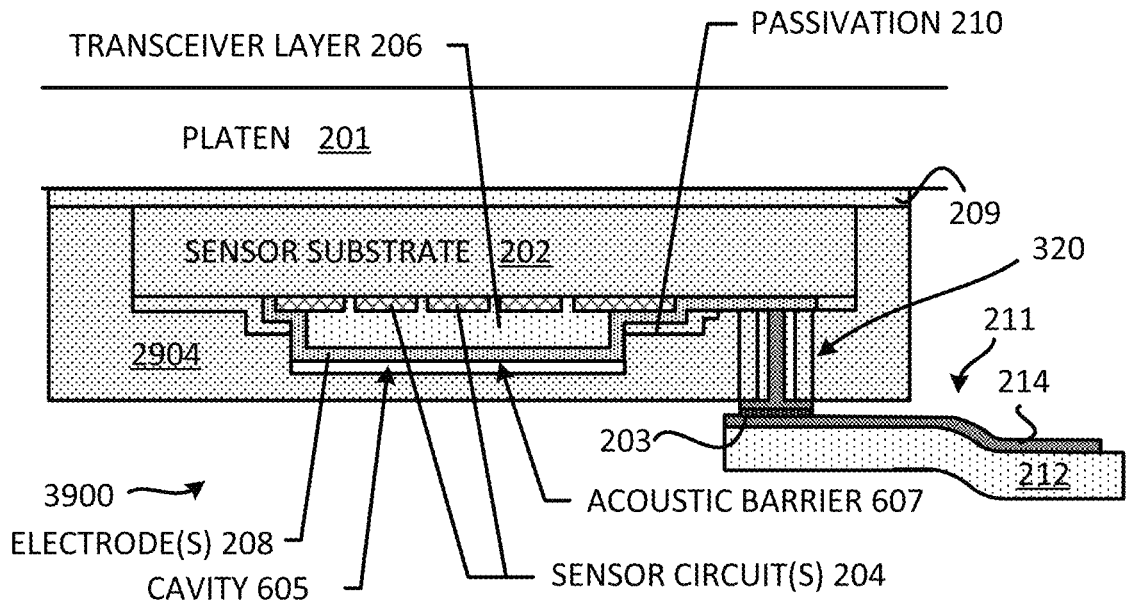
FIG. 39 illustrates an inverted fingerprint sensor device that includes a transceiver layer over a sensor substrate, an encapsulation layer, a cavity in the encapsulation layer, and a molded via bar.

FIG. 39 illustrates a fingerprint sensor device 3900 that is inverted. The fingerprint sensor device 3900 is similar to the fingerprint sensor device 3700. The fingerprint sensor device 3800 includes a cavity 605 in the encapsulation layer 2904 and an acoustic barrier 607. The acoustic barrier 607 may be formed at the interface between the one or more transceiver electrodes 208 and the cavity 605. In some implementations, the cavity 605 may be formed in the encapsulation layer 2904 during a molding process to form the acoustic barrier 607 using, for example, transfer molding or injection molding.

Figure 40:
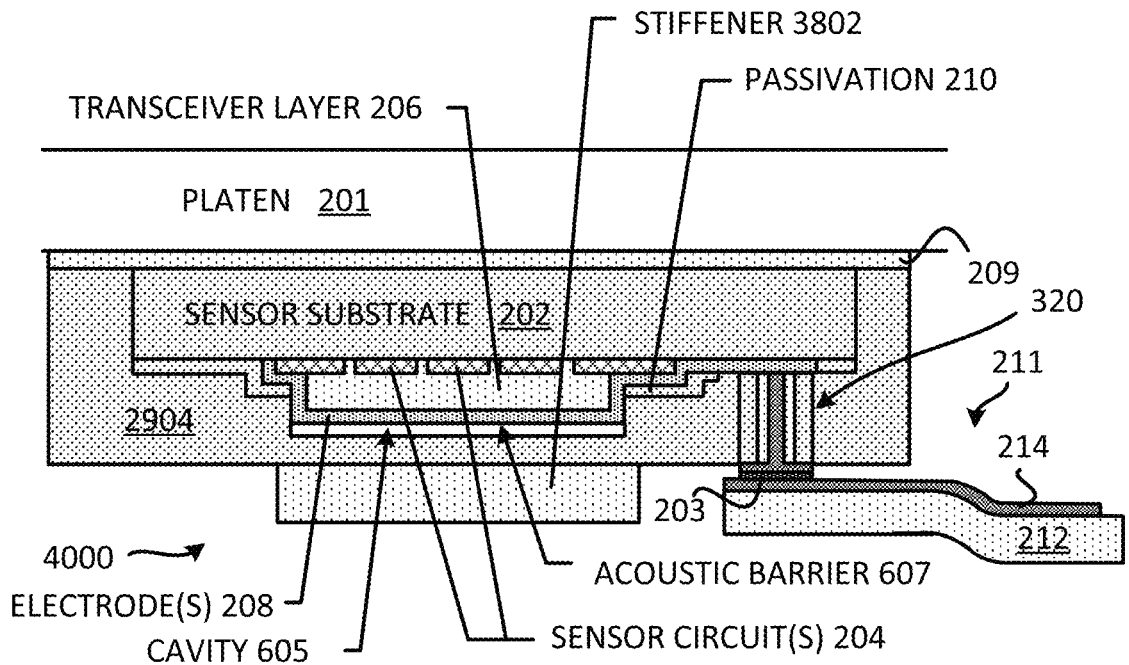
FIG. 40 illustrates an inverted fingerprint sensor device that includes a transceiver layer over a sensor substrate, an encapsulation layer, a cavity in the encapsulation layer, a stiffener, and a molded via bar.

FIG. 40 illustrates a fingerprint sensor device 4000 that is inverted. The fingerprint sensor device 4000 is similar to the fingerprint sensor device 3900. The fingerprint sensor device 4000 includes a stiffener 3802 that may be embedded in or otherwise coupled to the encapsulation layer 2904 with an adhesive or other attachment mechanism (not shown).

Exemplary Piezoelectric Transceivers

Different implementations may use different transceiver configurations. As previously mentioned above, in some implementations, a transceiver layer 206 may include a piezoelectric layer and a transceiver electrode that are configured to operate as a transmitter and as a receiver. For example, in some implementations, the same piezoelectric layer(s) of the transceiver layer 206 may be used to generate and detect ultrasonic waves/signals. As an example, during a first time period (e.g., a first operational mode), the piezoelectric layer of the transceiver layer 206 may be configured to generate ultrasonic waves/signals, and during a second time period (e.g., a second operational mode), the same piezoelectric layer may be configured to receive ultrasonic waves/signals. However, other transceiver configurations are possible.

Figure 41:
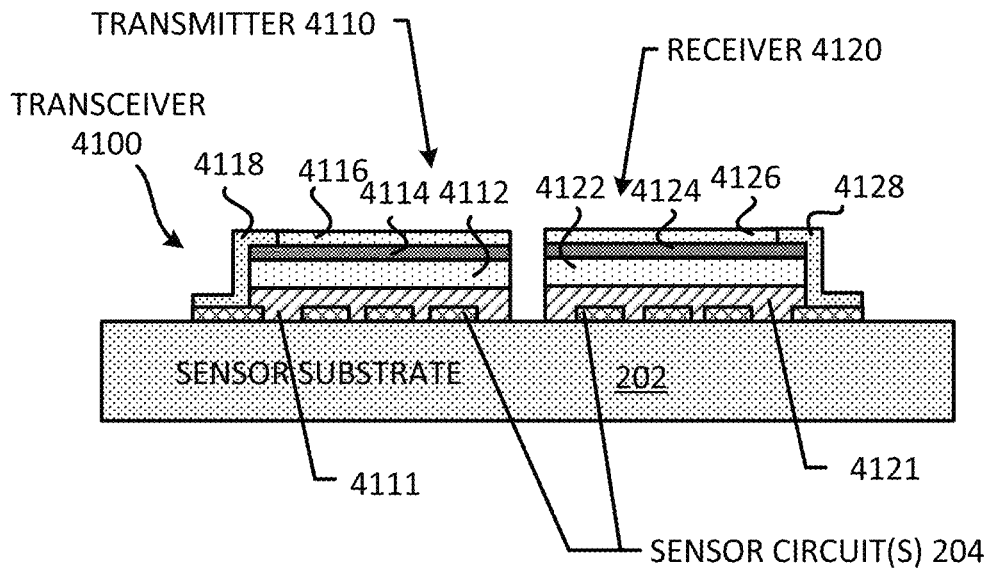
FIG. 41 illustrates an example of a transceiver configuration.
Figure 42:
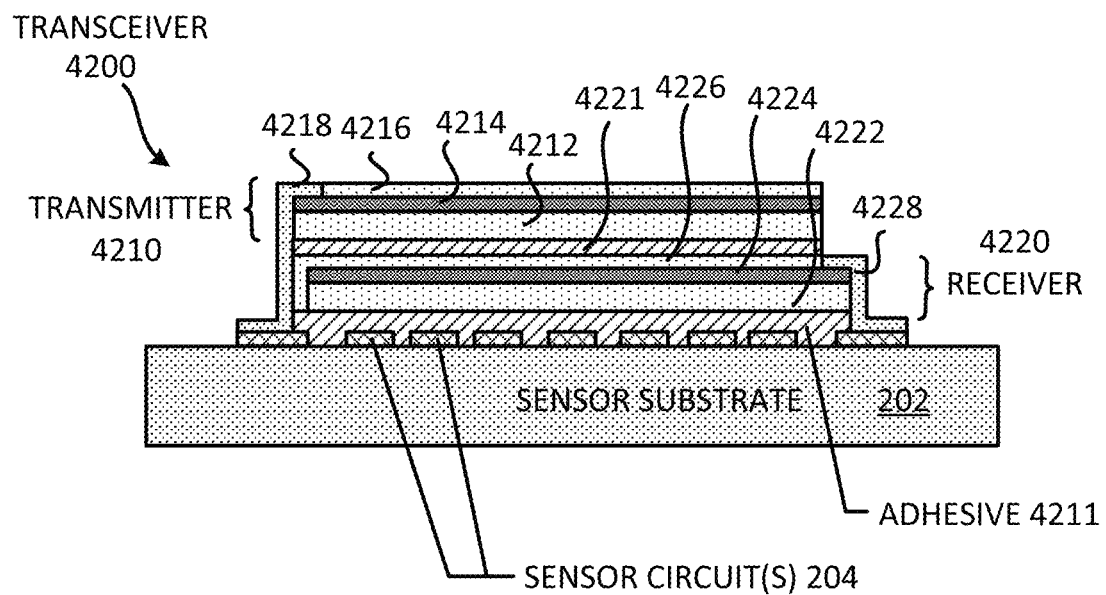
FIG. 42 illustrates another example of a transceiver configuration.

FIGS. 41 and 42 illustrate two examples of transceiver configurations that may be used in any of the fingerprint sensor devices described in the present disclosure. For example, in some implementations, the transceiver configuration 4100 of FIG. 41 or the transceiver configuration 4200 of FIG. 42 may substitute for the sensor substrate 202, the sensor circuits 204, the transceiver layer 206, the one or more transceiver electrodes 208, the passivation layer 210 and associated adhesives and electrical connections of the fingerprint sensor devices described in the present disclosure. In some implementations, the transceiver layer (e.g., 206) described in the present disclosure may include or more of the transceiver configurations 4100 and/or 4200. Thus, for example, the transceiver layer 206 may include a plurality of transceiver configurations 4100 (e.g., array of transceiver configurations 4100) and/or a plurality of transceiver configurations 4200 (e.g., array of transceiver configurations 4200). Similarly, the transceiver layer 206 may comprises a plurality of transceiver layers (e.g., array of transceiver layers).

FIG. 41 illustrates a transceiver configuration 4100 (e.g., transceiver means) that includes a segmented transmitter 4110 and a segmented receiver 4120. The transceiver configuration 4100 may be a piezoelectric transceiver with one or more piezoelectric layers. The transmitter 4110 (e.g., transmitter means) may be a piezoelectric transmitter and the receiver 4120 (e.g., receiver means) may be a piezoelectric receiver. The segmented transmitter 4110 and segmented receiver 4120 may be formed over the first surface of the sensor substrate 202 and the plurality of sensor circuits 204.

The segmented transmitter 4110 may include a first piezoelectric layer 4112, a first transceiver electrode 4114 (e.g., transmitter electrode), and a first coating layer 4116 (e.g., an acrylic layer). The segmented transmitter 4110 may be coupled to the sensor substrate 202 through a first adhesive 4111 or disposed directly thereon. In some implementations, the first piezoelectric layer 4112 of the segmented transmitter 4110 may be sprayed, spun, dispensed, coated or otherwise formed directly on the sensor circuits 204 with or without the first adhesive 4111. A first interconnect 4118 may be coupled (e.g., electrically coupled) to the first transceiver electrode 4114.

The segmented receiver 4120 may include a second piezoelectric layer 4122, a second transceiver electrode 4124 (e.g., receiver electrode), and a second coating layer 4126 (e.g., an acrylic layer). The segmented receiver 4120 may be coupled to the sensor substrate 202 through a second adhesive 4121 or disposed directly thereon. In some implementations, the second piezoelectric layer 4122 of the segmented receiver 4120 may be sprayed, spun, dispensed, coated or otherwise formed directly on the sensor circuits 204 with or without the second adhesive 4121. A second interconnect 4128 may be coupled (e.g., electrically coupled) to the second transceiver electrode 4124. In some implementations, the first piezoelectric layer 4122 and the second piezoelectric layer 4122 may be formed from the same deposited or bonded piezoelectric layer, using a masking, etching or other patterning technique to delineate the various transmitter, receiver or transceiver segments.

In some implementations, the segmented transmitter 4110 may be configured to generate ultrasonic waves and the segmented receiver 4120 may be configured to receive ultrasonic waves. In some implementations, the segmented transmitter 4110 may be configured to generate ultrasonic waves in a first operational mode and to receive ultrasonic waves in a second operational mode. In some implementations, the segmented receiver 4120 may be configured to generate ultrasonic waves in a first operational mode and to receive ultrasonic waves in a second operational mode.

FIG. 41 illustrates that the piezoelectric layer 4112 (e.g., first segmented piezoelectric layer) of the segmented transmitter 4110 is substantially coplanar with the piezoelectric layer 4122 (e.g., second segmented piezoelectric layer) of the segmented receiver 4120. However, in some implementations, the piezoelectric layer of the transmitter may not be coplanar with the piezoelectric layer of the receiver.

FIG. 42 illustrates a transceiver configuration 4200 (e.g., transceiver means) that includes a segmented transmitter 4210 and a segmented receiver 4220, where the segmented transmitter 4210 is formed over the segmented receiver 4220. The transceiver configuration 4200 may be a piezoelectric transceiver with a plurality of piezoelectric layers. The transmitter 4210 (e.g., transmitter means) may be a piezoelectric transmitter and the receiver 4220 (e.g., receiver means) may be a piezoelectric receiver. The segmented transmitter 4210 and the segmented receiver 4220 may be formed over the first surface of the sensor substrate 202 and the plurality of sensor circuits 204.

The segmented transmitter 4210 (e.g., transmitter means) may include a first piezoelectric layer 4212, a first transceiver electrode 4214, and a first coating layer 4216 (e.g., an acrylic layer). In some implementations, the first piezoelectric layer 4212 of the segmented transmitter 4210 may be coupled to the segmented receiver 4220 via an adhesive 4221. Alternatively, the first piezoelectric layer 4212 of the segmented transmitter 4210 may be sprayed, spun, dispensed, coated or otherwise formed directly on the segmented receiver 4220. A first interconnect 4218 may be coupled (e.g., electrically coupled) to the first transceiver electrode 4214.

The segmented receiver 4220 may include a second piezoelectric layer 4222, a second transceiver electrode 4224, and a second coating layer 4226 (e.g., an acrylic layer). The segmented receiver 4220 may be coupled to the sensor substrate 202 through a second adhesive 4221 or alternatively, disposed directly on the sensor substrate 202. In some implementations, the second piezoelectric layer 4222 of the segmented receiver 4220 may be sprayed, spun, dispensed, coated or otherwise formed directly on the sensor circuits 204 with or without the adhesive 4221. In some implementations, the transmitter 4210 is formed over the receiver 4220, and instead of the second adhesive, the transmitter 4210 is formed over a dielectric layer or in some implementations directly on the transceiver electrode 4224. A second interconnect 4228 may be coupled (e.g., electrically coupled) to the second transceiver electrode 4224.

Different implementations may use different materials for the piezoelectric layer. In some implementations, the piezoelectric layer may include piezoelectric polymers that have appropriate acoustic properties, (e.g., an acoustic impedance between about 2.5 MRayls and 5 MRayls). In some implementations, the piezoelectric layer may include a ferroelectric polymer such as polyvinylidene fluoride (PVDF) or a polyvinylidene fluoride-trifluoroethylene (PVDF-TrFE) copolymer. Examples of PVDF copolymers include 60:40 (molar percent) PVDF-TrFE, 70:30 PVDF-TrFE, 80:20 PVDF-TrFE, and 90:10 PVDR-TrFE. Other examples of piezoelectric materials that may be employed include Teflon® and other PTFE polymers, polyvinylidene chloride (PVDC) homopolymers and copolymers, polytetrafluoroethylene (PTFE) homopolymers and copolymers, and diisopropylammonium bromide (DIPAB).

Different implementations may use a piezoelectric layer with different thicknesses to generate and detect ultrasonic waves. In some implementations, an ultrasonic wave is a wave that has a frequency in the range of about 5 megahertz (MHz) and about 50 megahertz (MHz). In some implementations, the thickness of the piezoelectric layer may be between about 9 microns and about 110 microns.

Exemplary Sequence for Fabricating a Fingerprint Sensor Device

In some implementations, providing/fabricating a fingerprint sensor device includes several processes. FIG. 43 (which includes FIGS. 43A-43C) illustrates an exemplary sequence for providing/fabricating a fingerprint sensor device. In some implementations, the sequence of FIGS. 43A-43C may be used to fabricate the fingerprint sensor device of FIGS. 2-6 and/or 9-40 in the present disclosure. However, for the purpose of simplification, FIGS. 43A-43C will be described in the context of fabricating a fingerprint sensor device of FIG. 9. In particular, FIGS. 43A-43C will be described in the context of fabricating the fingerprint sensor device 900 of FIG. 9.

Figure 43A:
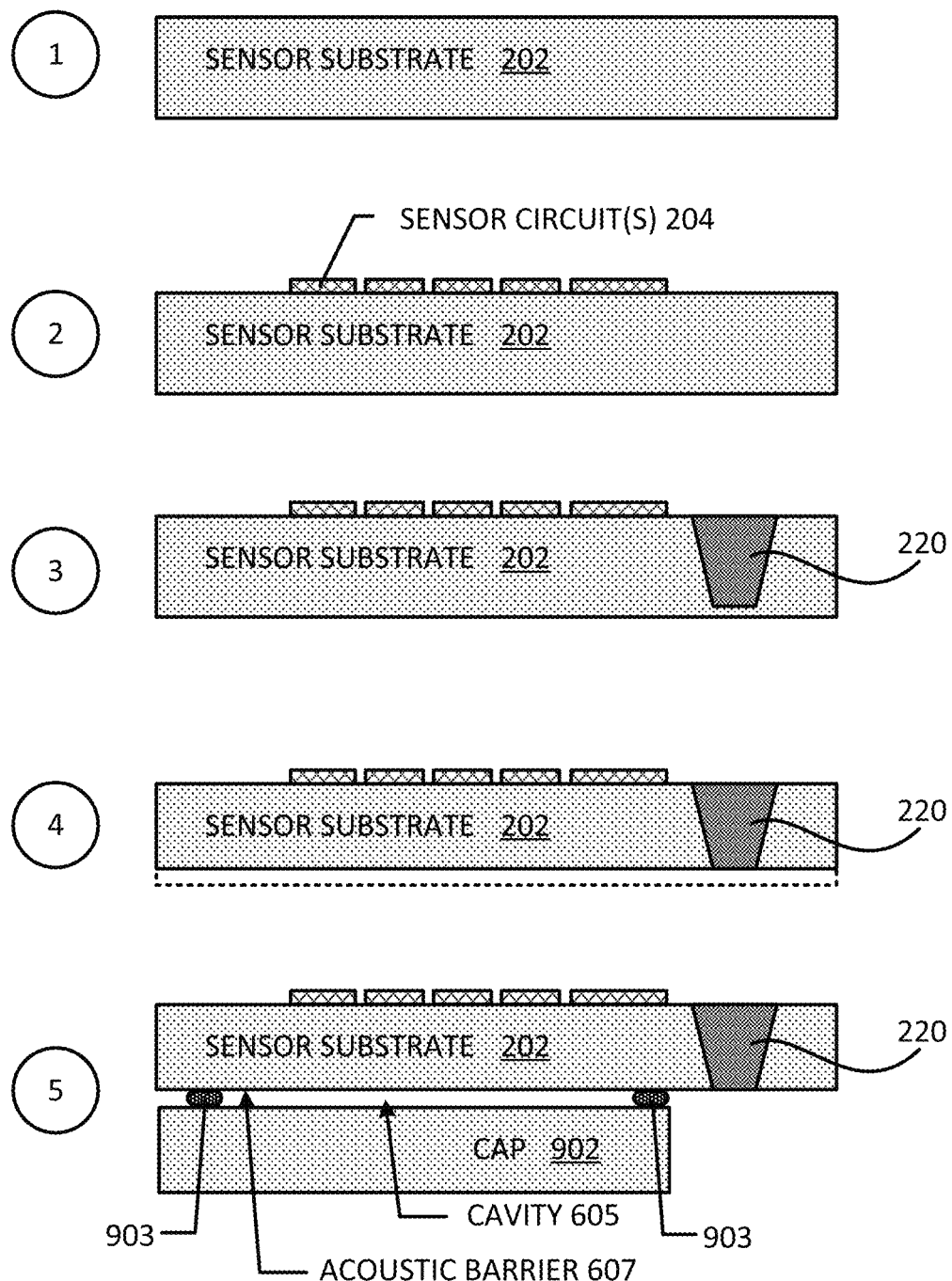
FIG. 43 (which includes FIGS. 43A-43C) illustrates an example of a sequence for fabricating a fingerprint sensor device that includes a transceiver layer over a sensor substrate.
Figure 43B:
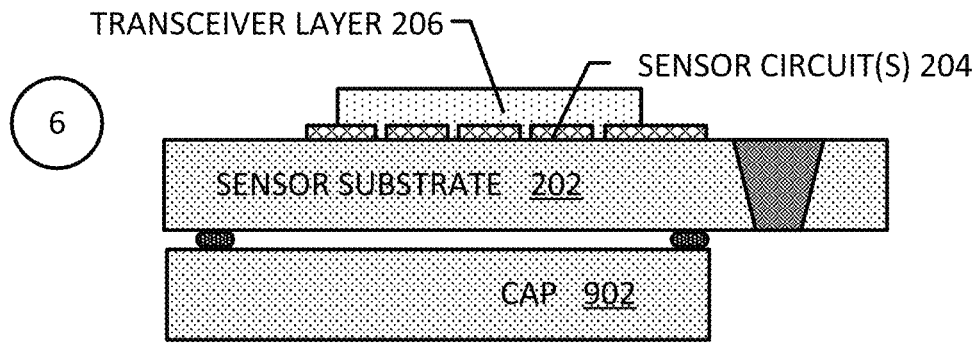
Figure 43B:
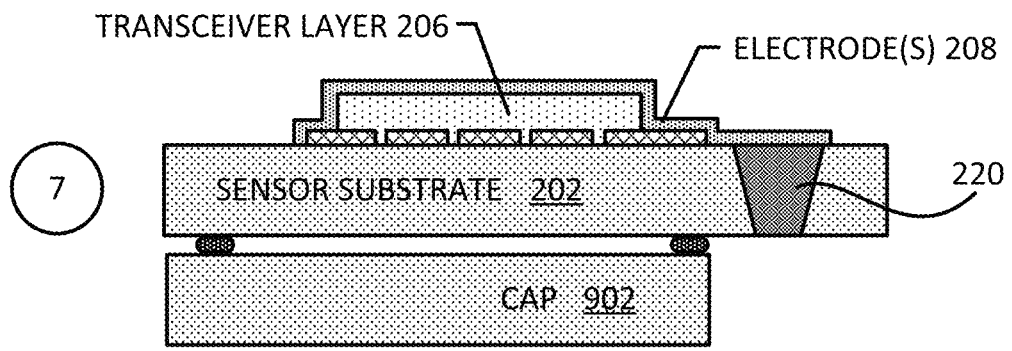
Figure 43B:
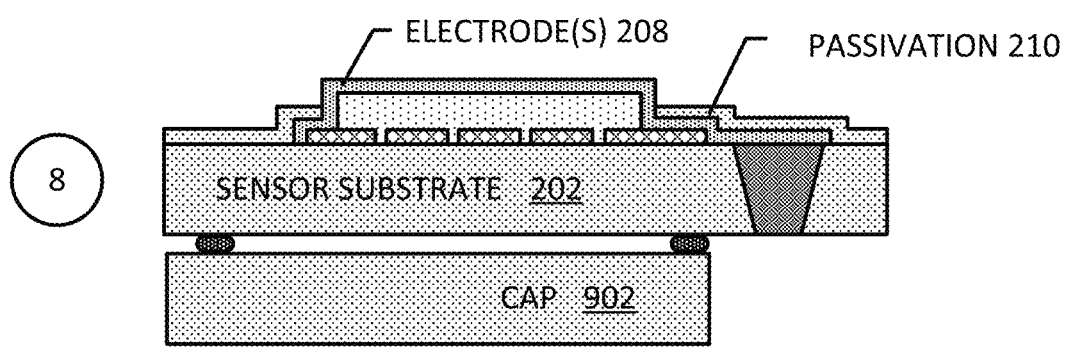
Figure 43C:
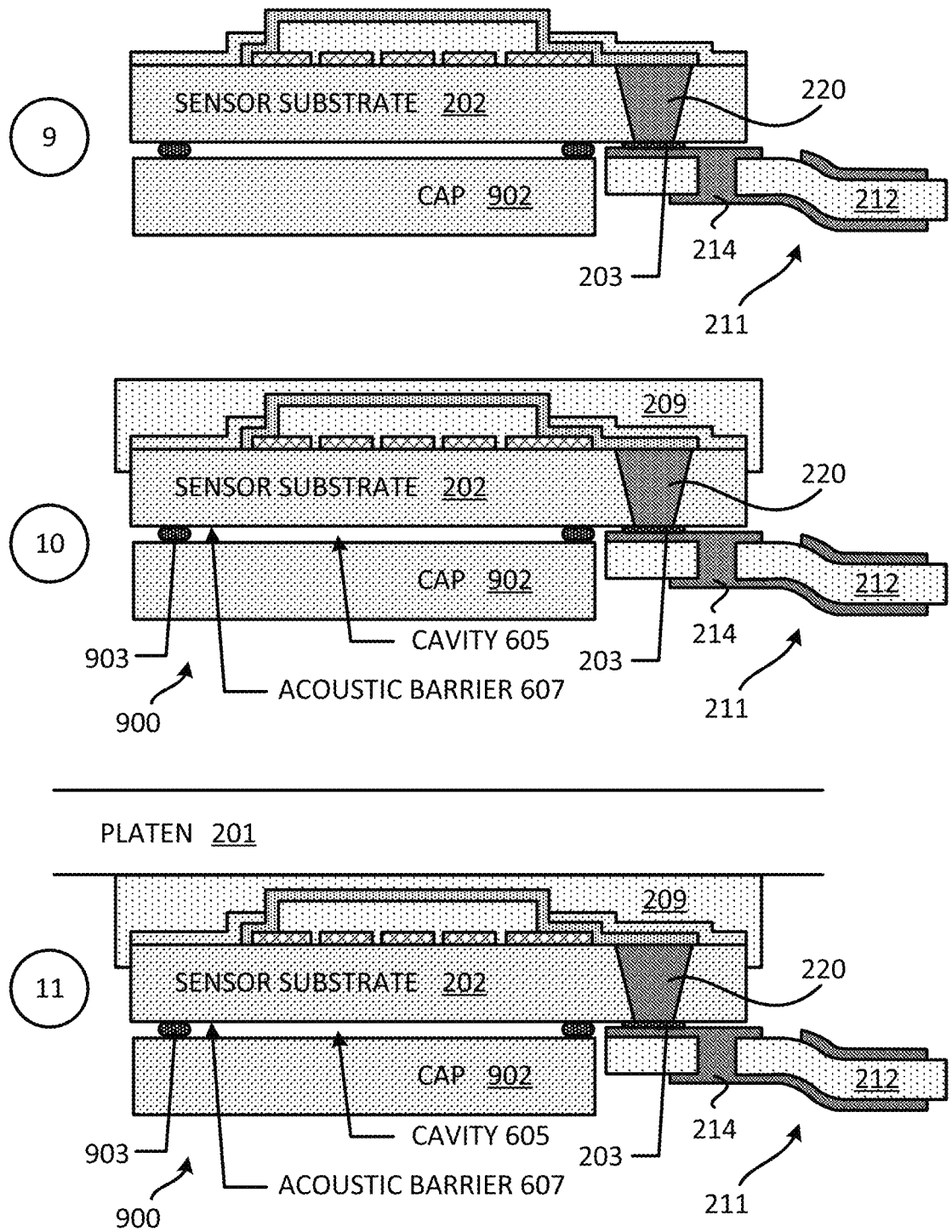

It should be noted that the sequence of FIGS. 43A-43C may combine one or more stages in order to simplify and/or clarify the sequence for providing a fingerprint sensor device. In some implementations, the order of the processes may be changed or modified.

Stage 1, as shown in FIG. 43A, illustrates a state after a sensor substrate 202 is formed or provided by a supplier. In some implementations, the sensor substrate 202 may be a silicon substrate, a TFT substrate, a glass substrate or a plastic substrate. In some implementations, the sensor substrate 202 may be a display substrate such as an LCD or OLED display substrate.

Stage 2 illustrates a state after the plurality of sensor circuits 204 are formed over (e.g., in or on) a first surface of the sensor substrate 202. Different implementations may use different processes for forming the plurality of sensor circuits 204. For example, some implementations may use microelectromechanical systems (MEMS) and thin-film processes for forming and fabricating the plurality of sensor circuits. Some implementations may use CMOS or TFT substrates. Some implementations may use SOI or cavity-SOI substrates.

Stage 3 illustrates a state after one or more vias 220 are formed in the sensor substrate 202. In some implementations, forming the via 220 may include creating a cavity (e.g., using laser ablation, mechanical etching, chemical etching or photo-etching) and then performing a plating process to form the via 220 in the cavity. The via 220 may include a metal material such as electroless or electroplated copper.

Stage 4 illustrates a state after a portion of the sensor substrate 202 is removed. In some implementations, the portion of the sensor substrate 202 may be etched or ground away. In some implementations, the backside of the sensor substrate 202 may be polished.

Stage 5 illustrates a state after a cap 902 is coupled to a second surface of the sensor substrate 202 with an adhesive 903. The cap 902 may be coupled to the sensor substrate 202 such that the cavity 605 and the acoustic barrier 607 are formed. As previously described, different implementations may use different materials for the cap 902.

Stage 6, as shown in FIG. 43B, illustrates a state after the transceiver layer 206 is disposed on the sensor substrate 202. Different implementations may use different transceiver configurations, such as transceiver configuration 4100 or transceiver configuration 4200. In some implementations, the transceiver layer 206 may be approximately nine microns thick.

Stage 7 illustrates a state after one or more transceiver electrodes 208 are formed over the transceiver layer 206. In some implementations, a plating process such as electroless or electroplated copper may be used to form the electrodes over the transceiver layer 206. In some implementations, one or more metal layers may be deposited on the transceiver layer 206, patterned and etched to form the one or more transceiver electrodes 208 and various metal interconnections. For example, the transceiver electrode 208 may be formed by depositing a layer of copper (~20 nm) and nickel (~200 nm) on top of the transceiver layer 206. In some implementations, one or more layers of silver-urethane (Ag-Ur) ink or other conductive material may be disposed on the transceiver layer 206 to form the one or more transceiver electrodes 208 and associated interconnections. For example, a nine-micron thick layer of silver ink may be applied to the transceiver layer 206 and other portions of the sensor substrate 202 such as a bond pad region or a via region over a through-substrate via 220. In some implementations, an additional seven-micron thick layer of silver ink may be applied on top of the nine-micron thick layer in regions directly above the sensor circuits 204.

Stage 8 illustrates a state after a passivation layer 210 is formed over portions of the one or more transceiver electrodes 208. The passivation layer 210 may be formed over at least portions of the one or more transceiver electrodes 208, the sensor circuits 204, interconnect traces, and the sensor substrate 202.

Stage 9, as shown in FIG. 43C, illustrates a state after a flexible printed circuit (FPC) 211 is coupled to the via 220 of the sensor substrate 202 with an adhesive 203. The adhesive 203 may be an electrically conductive adhesive, anisotropic conductive film, solder, or other electrically conductive means. In some implementations, FPC 211 may be connected to one or more vias 220 in sensor substrate 202. The FPC 211 may have one or more dielectric layers 212 and interconnects 214. In some implementations, Stage 9 illustrates the fingerprint sensor device 900.

Stage 10 illustrates a state after a platen adhesive 209 is coupled to the fingerprint sensor device 900. More specifically, the platen adhesive 209 may be coupled to the front side of the fingerprint sensor device 900. That is, the platen adhesive 209 may be coupled to the one or more transceiver electrodes 208 and the passivation layer 210.

Stage 11 illustrates a state after the fingerprint sensor device 900 is coupled to the platen 201 with the platen adhesive 209. In some implementations, the platen adhesive 209 may be applied to a portion of the platen 201 and then the fingerprint sensor device 900 may be positioned on the platen adhesive 209 and the platen adhesive cured.

Exemplary Sequence for Fabricating a Fingerprint Sensor Device

In some implementations, providing/fabricating a fingerprint sensor device includes several processes. FIG. 44 (which includes FIGS. 44A-44C) illustrates an exemplary sequence for providing/fabricating a fingerprint sensor device. In some implementations, the sequence of FIGS. 44A-44C may be used to fabricate the fingerprint sensor device of FIGS. 2-6 and/or 9-40 in the present disclosure. However, for the purpose of simplification, FIGS. 44A-44C will be described in the context of fabricating a fingerprint sensor device of FIG. 27. In particular, FIGS. 44A-44C will be described in the context of fabricating the fingerprint sensor device 2700 of FIG. 27.

Figure 44A:
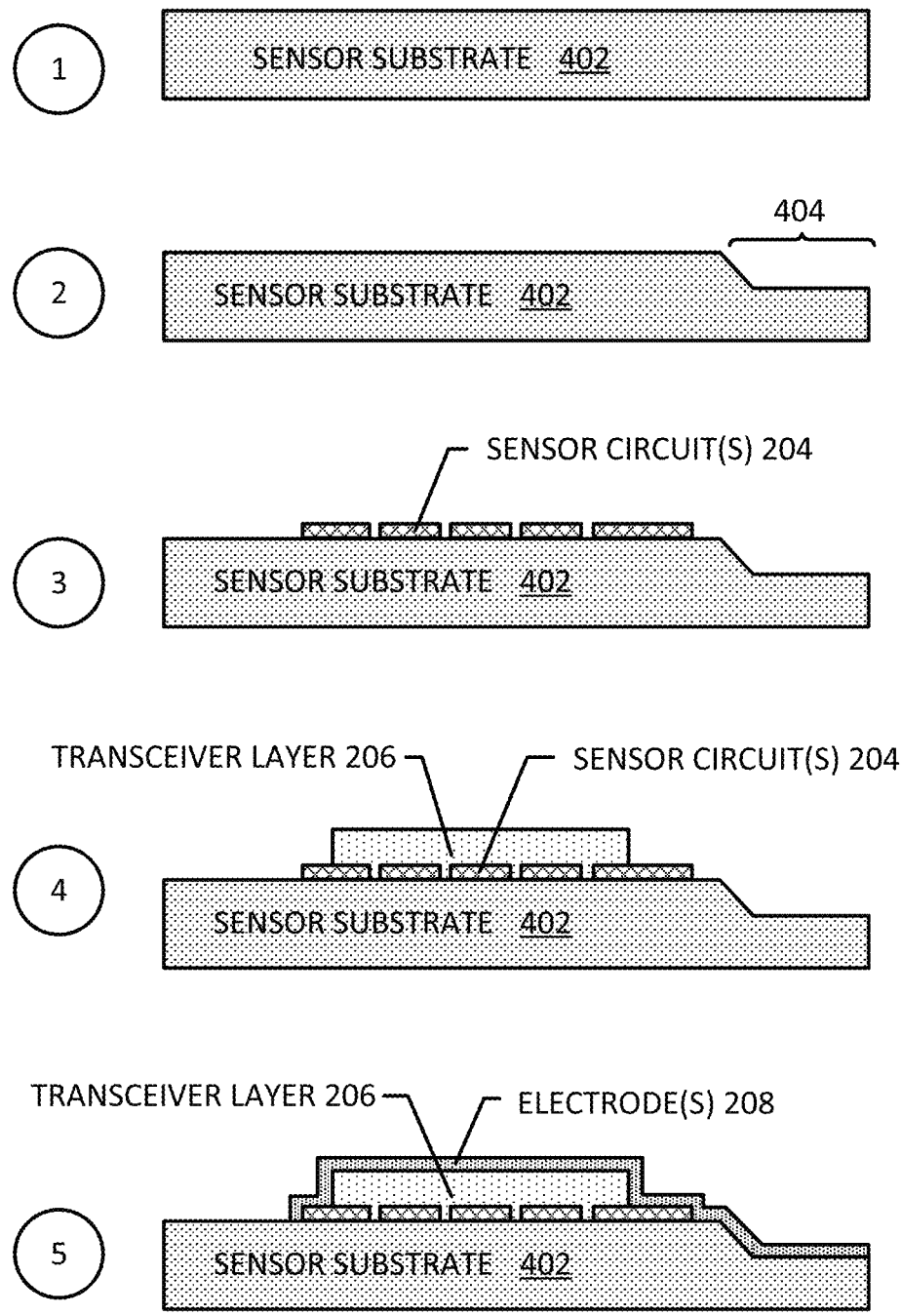
FIG. 44 (which includes FIGS. 44A-44C) illustrates another example of a sequence for fabricating a fingerprint sensor device that includes a transceiver layer over a sensor substrate.
Figure 44B:
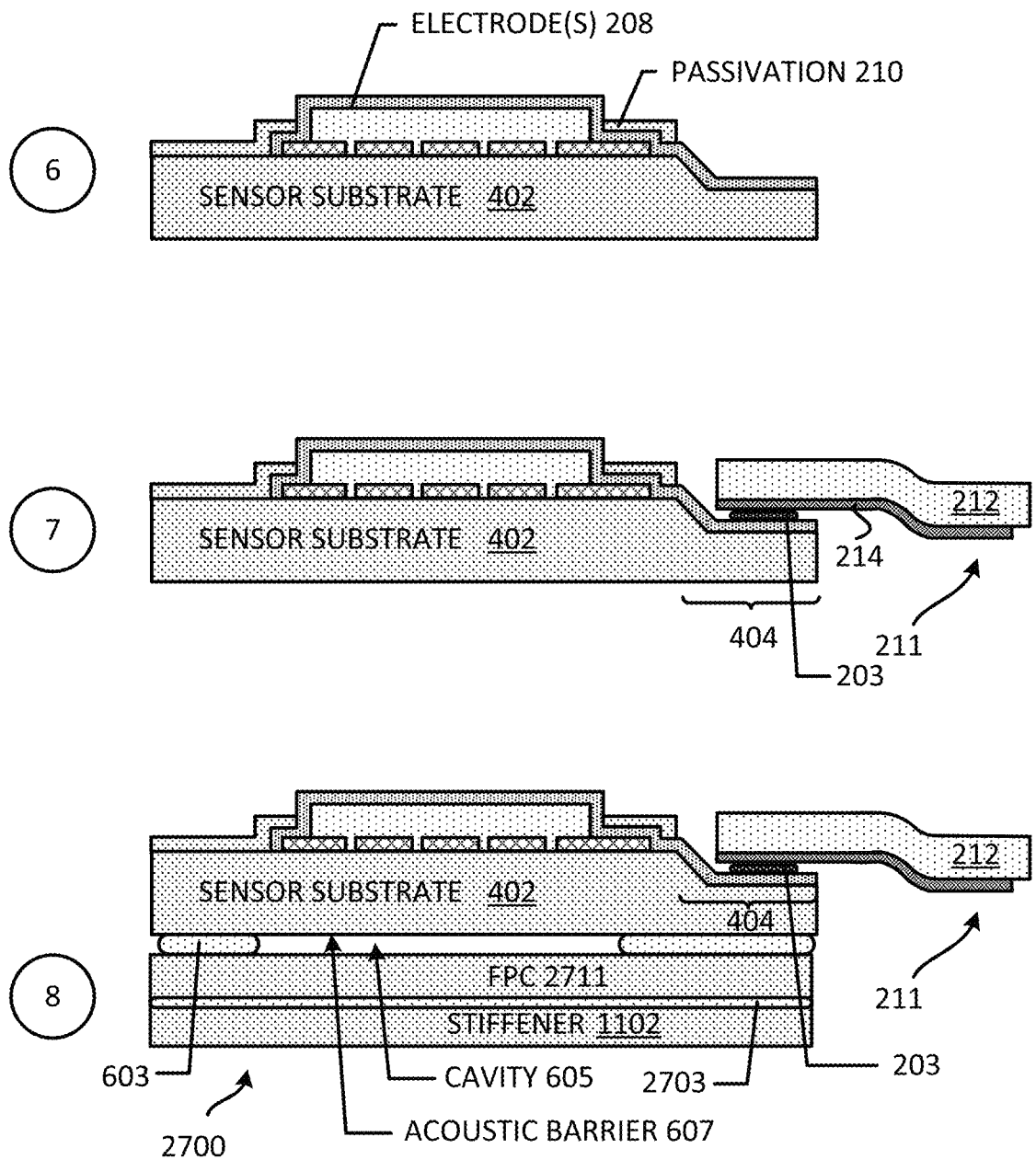
Figure 44C:
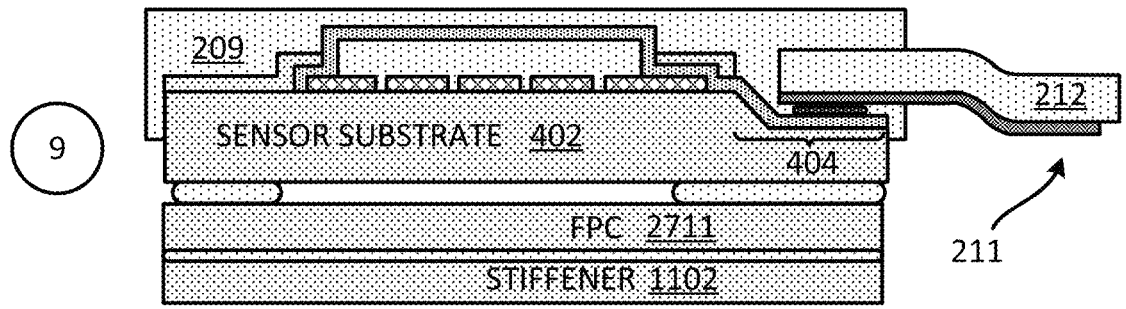
Figure 44C:
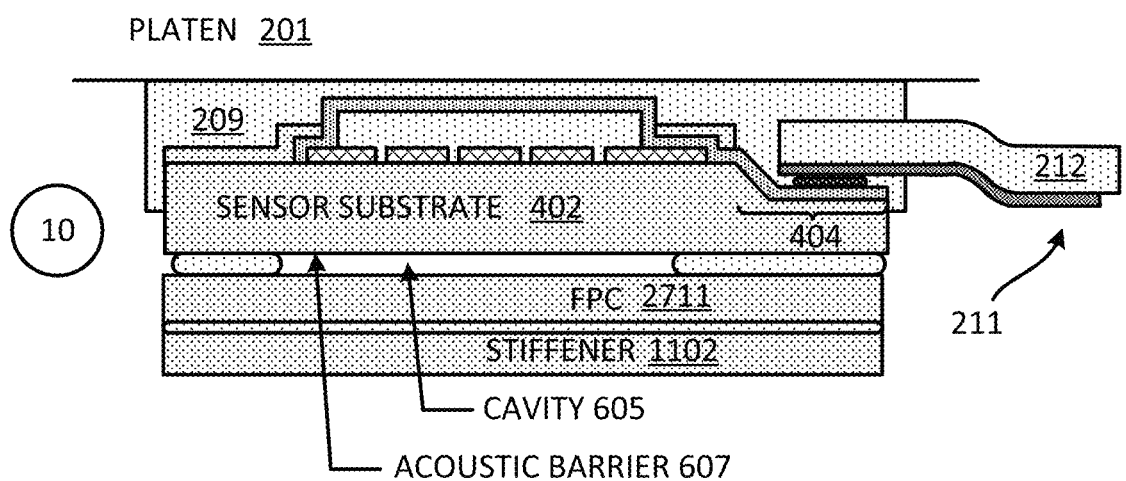

It should be noted that the sequence of FIGS. 44A-44C may combine one or more stages in order to simplify and/or clarify the sequence for providing a fingerprint sensor device. In some implementations, the order of the processes may be changed or modified.

Stage 1, as shown in FIG. 44A, illustrates a state after a sensor substrate 402 is formed or provided by a supplier. In some implementations, the sensor substrate 202 may be a silicon substrate, a TFT substrate, a glass substrate or a plastic substrate. In some implementations, the sensor substrate 402 may be a display substrate such as an LCD or OLED display substrate.

Stage 2 illustrates a state after a portion of the sensor substrate 402 is removed, leaving behind a recessed portion or recessed region. Different implementations may use different processes for removing a portion of the sensor substrate 402. In some implementations, a laser process or etching process such as an HF-based etching process (for glass) or a KOH-based anisotropic etching process (for silicon) may be used to remove a portion of the sensor substrate 402. In some implementations, formation of the recessed portions or regions may be done during or after formation of the sensor circuits 204 (e.g. after Stage 3 has been completed)

Stage 3 illustrates a state after the plurality of sensor circuits 204 are formed over (e.g., in or on) a first surface of the sensor substrate 402. Different implementations may use different processes for forming the plurality of sensor circuits 204. For example, some implementations may use microelectromechanical systems (MEMS) and thin-film processes for forming and fabricating the plurality of sensor circuits. Some implementations may use CMOS or TFT substrates. Some implementations may use SOI or cavity-SOI substrates.

Stage 4 illustrates a state after the transceiver layer 206 is provided on the sensor substrate 402. In some implementations, transceiver layer 206 may be bonded to or disposed on the sensor substrate 402 and sensor circuits 204. Different implementations may use different transceiver configurations, such as transceiver configuration 4100 or transceiver configuration 4200.

Stage 5 illustrates a state after one or more transceiver electrodes 208 are formed over the transceiver layer 206. In some implementations, a plating process, a deposition and etch process, or a screening process may be used to form the electrodes over the transceiver layer 206.

Stage 6, as shown in FIG. 44B, illustrates a state after the passivation layer 210 is formed over portions of the one or more transceiver electrodes 208. The passivation layer 210 may be formed over at least portions of the one or more transceiver electrodes 208, the sensor circuits 204, interconnect traces, and the sensor substrate 402.

Stage 7 illustrates a state after a flexible printed circuit (FPC) 211 is coupled to the one or more transceiver electrodes 208 and sensor circuits 204 of the sensor substrate 402 with an adhesive 203. The adhesive 203 may be an electrically conductive adhesive, anisotropic conductive film, solder, or other electrically conductive means. The FPC 211 may have one or more dielectric layers 212 and interconnects 214.

Stage 8 illustrates a state after a flexible printed circuit (FPC) 2711 and an optional stiffener 1102 are coupled to the sensor substrate 402. The stiffener 1102 may be coupled to the FPC 2711 with an adhesive 2703. The FPC 2711 may be coupled to the sensor substrate 402 with an adhesive 603. In some implementations, FPC 2711 may be an extended portion of FPC 211. In some implementations, FPC 2711 may be disjoint from FPC 211 and used to form the cap and the cavity 605. Stage 8 may illustrate the fingerprint sensor device 2700.

Stage 9, as shown in FIG. 44C, illustrates a state after a platen adhesive 209 is coupled to the fingerprint sensor device 2700. More specifically, the platen adhesive 209 may be coupled to the front side of the fingerprint sensor device 2700. That is, the platen adhesive 209 may be coupled to the one or more transceiver electrodes 208 and the passivation layer 210.

Stage 10 illustrates a state after the fingerprint sensor device 2700 is coupled to a platen 201 with the platen adhesive 209. In some implementations, the platen adhesive 209 may be applied to a portion of the platen 201 and then the fingerprint sensor device 900 may be positioned on the platen adhesive 209 and the platen adhesive cured.

Exemplary Sequence for Fabricating a Fingerprint Sensor Device

Figure 45A:
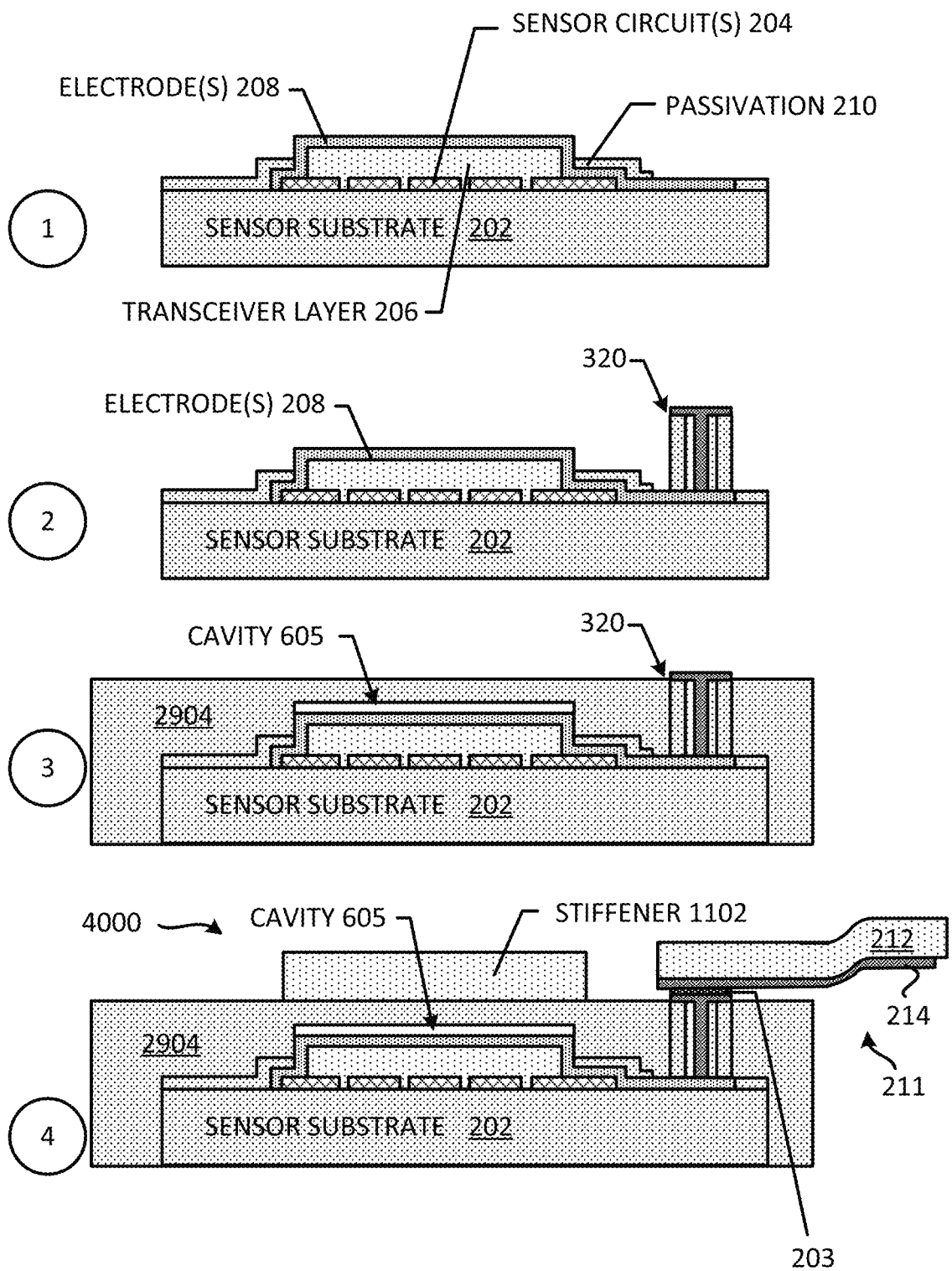
FIG. 45 (which includes FIGS. 45A-45B) illustrates another example of a sequence for fabricating a fingerprint sensor device that includes a transceiver layer over a sensor substrate.
Figure 45B:
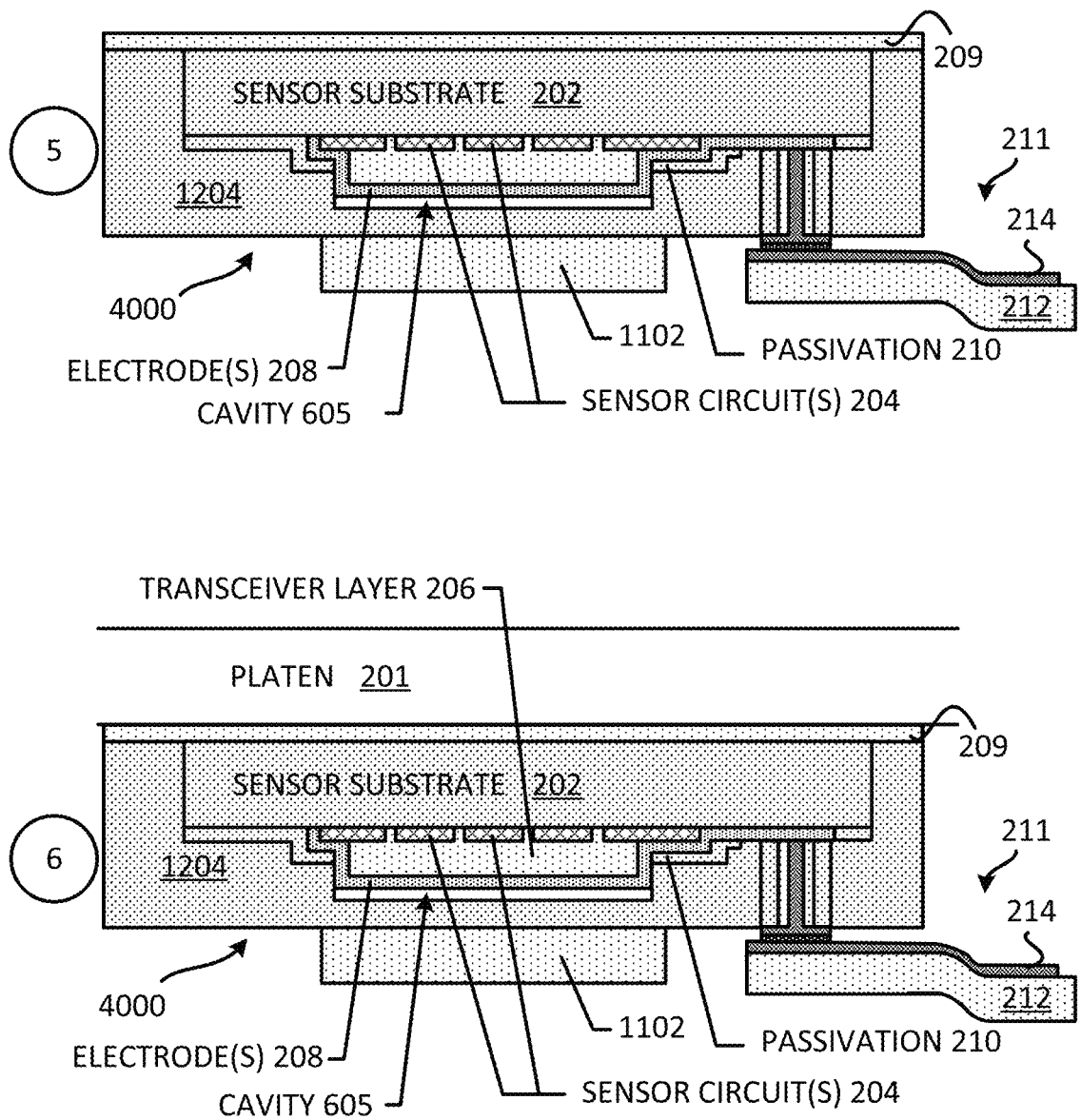

In some implementations, providing/fabricating a fingerprint sensor device includes several processes. FIG. 45 (which includes FIGS. 45A-45B) illustrates an exemplary sequence for providing/fabricating a fingerprint sensor device. In some implementations, the sequence of FIGS. 45A-45B may be used to fabricate the fingerprint sensor device of FIGS. 2-6 and/or 9-40 in the present disclosure. However, for the purpose of simplification, FIGS. 45A-45B will be described in the context of fabricating a fingerprint sensor device of FIG. 38. In particular, FIGS. 45A-45B will be described in the context of fabricating the fingerprint sensor device 4000 of FIG. 40.

It should be noted that the sequence of FIGS. 45A-45B may combine one or more stages in order to simplify and/or clarify the sequence for providing a fingerprint sensor device. In some implementations, the order of the processes may be changed or modified.

Stage 1, as shown in FIG. 45A, illustrates a state of the fingerprint sensor device 4000 that includes a sensor substrate 202, a plurality of sensor circuits 204, a transceiver layer 206, one or more transceiver electrodes 208, and a passivation layer 210.

Stage 2 illustrates a state after a via bar 320 is disposed on interconnection regions to the one or more transceiver electrodes 208 and the sensor circuits 204. In some implementations, an adhesive (e.g., electrically conductive adhesive, ACF or solder) may be used to couple the via bar 320 to the one or more transceiver electrodes 208 and underlying pads.

Stage 3 illustrates a state after an encapsulation layer 2904 is formed such that the encapsulation layer 2904 encapsulates the via bar 320, portions of the sensor substrate 202, sensor circuits 204, the one or more transceiver electrodes 208, the passivation layer 210 and associated electrical interconnects. In some implementations, a cavity 605 may be formed in the encapsulation layer 2904 during the molding process to form an acoustic barrier within the sensor device. The cavity 605 may be formed within the encapsulation layer 2904, for example, using transfer molding or injection molding. In some implementations, a grinding step may grind back the encapsulation layer 2904 to expose a top surface of via bar 320. In some implementations, the grinding step may expose one or more landing pads or connective vias in via bar 320.

Stage 4 illustrates a state after a flexible printed circuit (FPC) 211 is coupled to the molded via bar 320 with an adhesive 203, and after a stiffener 1102 is coupled to the encapsulation layer 2904. The stiffener 1102 may be coupled to the encapsulation layer 2904 with an adhesive (not shown). In some implementations, the adhesive 203 may be an electrically conductive adhesive, an ACF or a solder.

Stage 5, as shown in FIG. 45B, illustrates a state after a platen adhesive 209 is coupled to the fingerprint sensor device 4000. More specifically, the platen adhesive 209 may be coupled to the backside of the fingerprint sensor device 4000. That is, the platen adhesive 209 may be coupled to the second surface of the sensor substrate 202.

Stage 6 illustrates a state after the fingerprint sensor device 4000 is coupled to a platen 201 with the platen adhesive 209. In some implementations, the platen adhesive 209 may be applied to a portion of the platen 201 and then the fingerprint sensor device 4000 may be positioned on the platen adhesive 209 and the platen adhesive cured.

Exemplary Method for Fabricating a Fingerprint Sensor Device

Figure 46:
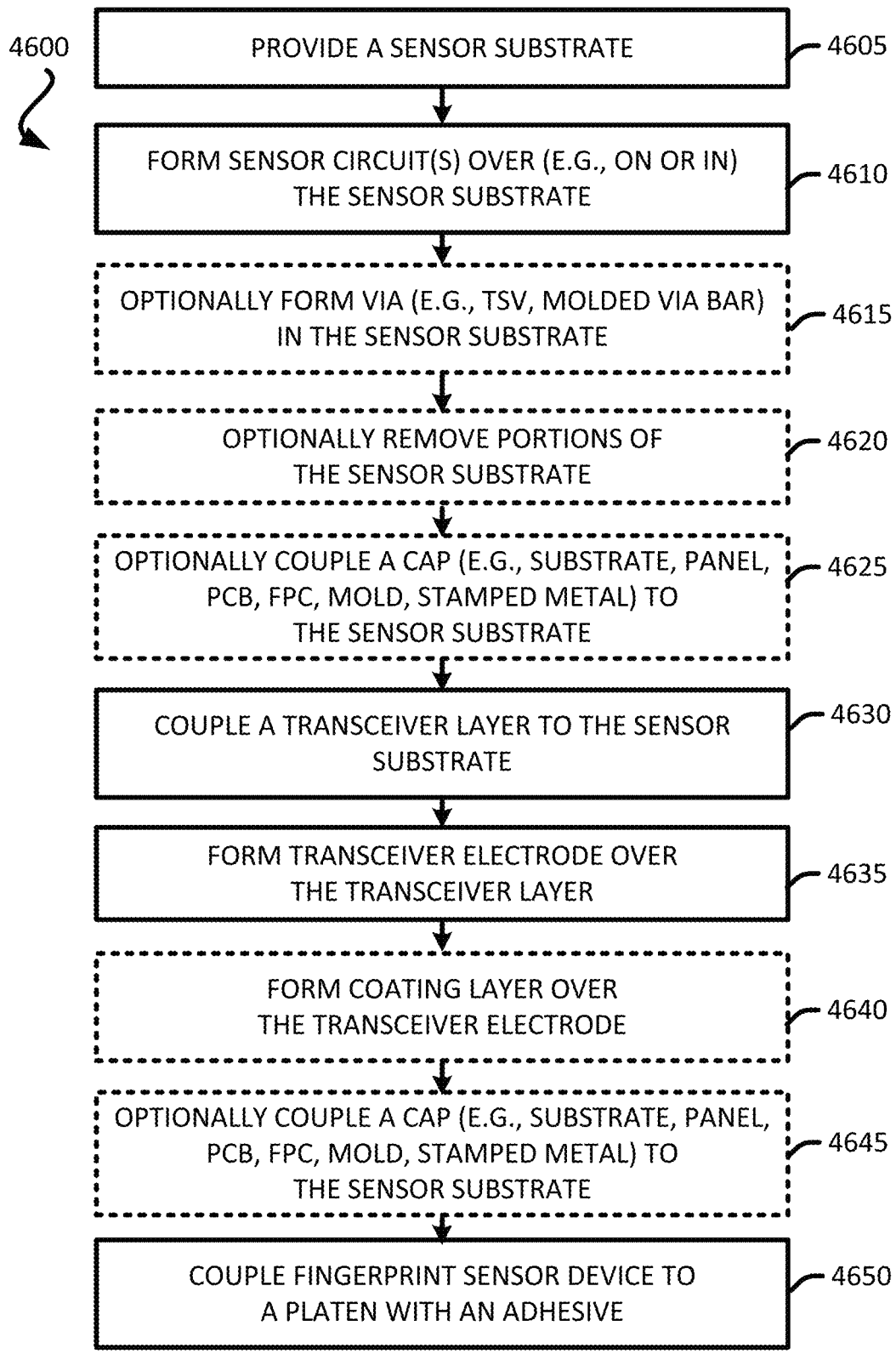
FIG. 46 illustrates a flow diagram of an exemplary method for fabricating a fingerprint sensor device that includes a transceiver layer over a sensor substrate.

In some implementations, providing/fabricating a fingerprint sensor device includes several processes. FIG. 46 illustrates an exemplary flow diagram of a method for providing/fabricating a fingerprint sensor device. In some implementations, the method of FIG. 46 may be used to provide/fabricate the fingerprint sensor device of FIGS. 2-6 and/or 9-40 described in the present disclosure.

It should be noted that the flow diagram of FIG. 46 may combine one or more processes in order to simplify and/or clarify the method for providing fingerprint sensor device. In some implementations, the order of the processes may be changed or modified.

The method provides (at block 4605) a sensor substrate (e.g., sensor substrate 202). Different implementations may use different materials for the sensor substrate. The sensor substrate may be fabricated or provided by a supplier. In some implementations, providing the sensor substrate may include fabricating a sensor substrate with one or more recessed portions or cavities formed inside the substrate. In some implementations, the sensor substrate may include a silicon substrate, an SOI substrate, a cavity-SOI substrate, a MEMS substrate or a TFT substrate. In some implementations, the sensor substrate may be a semiconductor substrate, a glass substrate or a plastic substrate. In some implementations, the sensor substrate 202 may be a display substrate such as an LCD or OLED display substrate. In some implementations, one or more MEMS processes may be used to form the SOI or cavity-SOI substrate.

The method forms (at block 4610) a plurality of sensor circuits (e.g., plurality of sensor circuits 204) over (e.g., on, in) a surface (e.g., first surface) of the sensor substrate. In some implementations, forming the sensor circuits may include forming an array of thin-film transistors (TFT) and supporting circuitry on a TFT substrate. In some implementations, silicon-based transistors and circuitry may be formed on or in a silicon substrate. In some implementations, one or more MEMS and thin-film fabrication processes may be used to fabricate the plurality of sensor circuits and device structures. In some implementations, one or more recessed regions or cavities may be formed in the substrate.

The method optionally forms (at block 4615) one or more vias in the sensor substrate. Different implementations may form different vias. In some implementations, the vias may be through-substrate vias (e.g., vias 220). In some implementations, the vias may be through-silicon vias or through-glass vias (TGVs). In some implementations, the vias may be molded in a via bar (e.g., a molded via bar 320). The molded via bar may be formed in an encapsulation layer that is coupled to the sensor substrate. Note that in some implementations such as those described with respect to FIGS. 44A-44C, vias in the substrate may be omitted. Note that in some implementations such as those described with respect to FIGS. 45A-45B, the via bar may be positioned above or on top of the sensor substrate. In other implementations, the via bar may be positioned beside or adjacent to the sensor substrate.

The method optionally removes (at block 4620) a portion of the sensor substrate. For example, the method may remove a portion of the sensor substrate to form a recessed portion. In some implementations, the recessed portion may allow for attachment of an FPC to bond pads formed in the recessed portion. In some implementations, the sensor substrate may be thinned and polished.

The method optionally couples (at block 4625) a cap to the sensor substrate. Different implementations may provide different caps. The cap may include a substrate, a panel, a sub-panel, a printed circuit board (PCB), a flexible printed circuit (FPC), an encapsulation layer (e.g., mold or mold compound), a stamped layer of metal a plastic layer, or a portion or combination thereof. In some implementations, the cap may be attached to the backside of the sensor substrate. In some implementations, the sensor substrate may be thinned (e.g. mechanically or chemically) and polished prior to attaching the backside cap.

The method couples (at block 4630) a transceiver layer to the sensor substrate. In some implementations, the transceiver layer (e.g., transceiver layer 206) may be coupled to a first surface of the sensor substrate. The transceiver layer may serve as a transmitter and a receiver, as described above in the present application. In some implementations, the transceiver layer may be attached and coupled to the sensor circuits and sensor substrate with an adhesive layer. In some implementations, the transceiver layer may be disposed directly on the sensor circuits and sensor substrate using, for example, a spraying, spinning, dispensing or coating process. In some implementations, the transceiver layer may be patterned and etched using a photolithographic process. In some implementations, the transceiver layer may be applied through a screen or mask or otherwise selectively disposed on the sensor circuits and sensor substrate.

The method forms (at block 4635) one or more electrodes (e.g., transceiver electrodes 208) over the transceiver layer. In some implementations, forming the electrodes may include forming interconnects over the sensor substrate. In some implementations, one or more metal layers may be deposited on the transceiver layer, patterned and etched to form the one or more transceiver electrodes and various metal interconnections. In some implementations, one or more layers of silver-urethane (Ag-Ur) ink or other conductive material may be disposed on the transceiver layer to form the one or more transceiver electrodes and associated interconnections. In some implementations, a plating process such as electroless or electroplated copper may be used to form the electrodes over the transceiver layer. For example, the transceiver electrode 208 may be formed by depositing a layer of copper (~20 nm) and nickel (~200 nm) on top of the transceiver layer, followed by a layer of electroless nickel and immersion gold (ENIG) (~3 um). In some implementations, an approximately six-micron thick layer of electroplated copper may be formed on top of a three-micron thick layer of ENIG to serve as the transceiver electrode, which may be capped with a six-micron thick layer of polyimide. In some implementations, the material thicknesses and types may be selected in part due to acoustic boundary-layer and matching considerations.

The method optionally forms (at block 4640) a coating or passivation layer over some or all of the electrodes and/or interconnects. In some implementations, a thin acrylic layer may serve as the passivation layer. In some implementations, the passivation layer may include one or more layers of silicon nitride, silicon dioxide, BCB, polyimide, or other suitable material to provide protection for underlying electrodes, interconnects, electrical traces, electrical and electronic components, and electronic circuits. The coating layer thickness and material may be selected in part to improve the acoustic performance of the sensor device, such as serving as an acoustic coupling layer, an acoustic matching layer or as a portion of an acoustic cavity for higher signal output and image contrast.

The method optionally couples (at block 4645) a cap to the sensor substrate. Different implementations may provide different caps. In some implementations, the cap may be a wafer, a substrate, a panel, a sub-panel, a printed circuit board (PCB), a flexible printed circuit (FPC), an encapsulation layer (e.g., mold or mold compound), a stamped layer of metal, or a plastic layer. The cap may be applied before or after singulation of the sensor substrate into individual sensor die. An FPC or other connective means may be attached to the sensor substrate. In some implementations, the FPC may be attached to the pads or vias of the sensor substrate before, after or during the attachment of the cap.

The method couples (at block 4650) the fingerprint sensor device (e.g., fingerprint sensor device 200) to a platen (e.g., platen 201) of a device (e.g., mobile device 5300) with an adhesive (e.g., a platen adhesive 209). In some implementations, a platen adhesive may be applied to a surface of the fingerprint sensor device and the device then attached to the platen. In some implementations, a platen adhesive may be applied to a platen or a portion of a platen, and the fingerprint sensor device then attached to the platen. Once positioned, the platen adhesive may be cured (e.g. thermally cured or UV-cured). In some implementations, one or more sealing layers such as an edge seal or an epoxy may be disposed around the affixed sensor device to provide further protection and ruggedness.

Exemplary Fingerprint Sensor Devices with Wrapped FPCs

Figure 47:
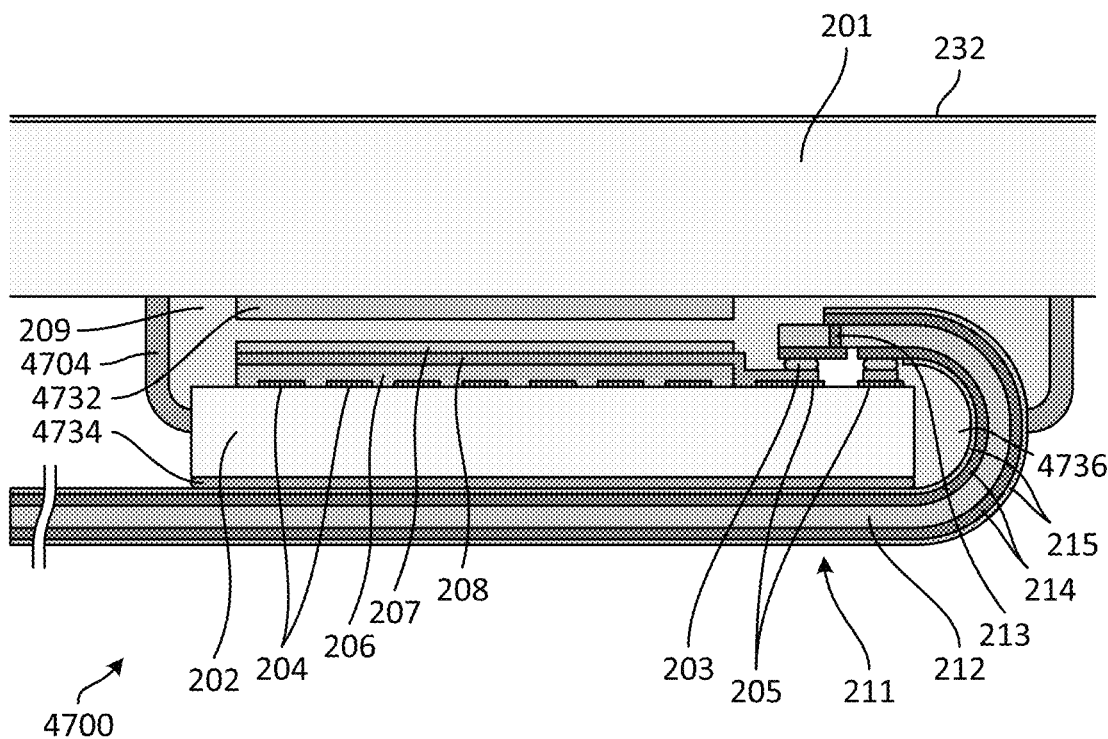
FIG. 47 through FIG. 52 illustrate cross-sectional views of various configurations of fingerprint sensor devices that include a wrapped flexible printed circuit (FPC).

FIG. 47 illustrates an example of a fingerprint sensor device 4700 that is coupled to a platen 201 with a platen adhesive 209. As shown in FIG. 47, the fingerprint sensor device 4700 may be located underneath the platen 201. The platen 201, in some implementations, may be a cover glass of a display device (e.g., a mobile device), a portion of an enclosure of a display device, or a cover of an ultrasonic authenticating button. In some implementations, the platen may include a portion of an LCD display panel, an OLED or AMOLED display panel, a display module, or a visual display. The platen 201 may include a protective coating layer 232, such as an anti-smudge layer, a scratch-resistant layer or one or more optical coating layers.

The fingerprint sensor device 4700 may include a sensor substrate 202, a plurality of sensor circuits 204, a transceiver layer 206, a coating layer 207, and one or more transceiver electrodes 208 (other passivation layers and device interconnection layers are not shown for clarity). In some implementations, the sensor substrate 202 may include a silicon substrate, a silicon-on-insulator (SOI) substrate, a thin-film transistor (TFT) substrate, a glass substrate, a plastic substrate, a ceramic substrate, or a portion of an LCD or OLED display substrate.

The plurality of sensor circuits 204 may be formed over a first surface of the sensor substrate 202, such as TFT circuits on a TFT substrate or CMOS circuits on or in a silicon substrate. The transceiver layer 206 may be disposed over the plurality of sensor circuits 204. In some implementations, the transceiver layer 206 may serve as both a transmitter and a receiver. The transceiver layer 206 may include one or more piezoelectric layers and electrode layers that enable the transceiver layer 206 to generate and detect ultrasonic waves/signals.

The transceiver electrode 208 may be formed over or otherwise disposed on the transceiver layer 206. The transceiver electrode 208 may include an electrically conductive layer and one or more electrical interconnect traces that are coupled to the transceiver layer 206 and/or other interconnects of the fingerprint sensor device 4700. The transceiver electrode 208 may include one or more interconnects that are formed over the sensor substrate 202 and provide electrical connection to sensors circuits 204 and/or one or more bond pads 205. In some implementations, a transceiver electrode coating layer 207 such as an acrylic layer or a passivation layer may be disposed on an outer surface of the transceiver electrode 208. The coating layer 207 may provide dielectric isolation, environmental protection, improved adhesion, and in some implementations serve as an acoustic coupling layer or acoustic matching layer for the fingerprint sensor device 4700.

The platen adhesive 209 may mechanically and acoustically couple the fingerprint sensor device 4700 to the platen 201. In some implementations, a platen interface layer 4732 may be positioned between the platen 201 and the sensor substrate 202. The platen interface layer 4732, also referred to as a mesa layer, may provide additional spacing between a bottom surface of the platen 201 and an upper surface of the sensor substrate 202 to allow a portion of FPC 211 to be connected to one or more bond pads 205 on the sensor substrate 202 without being obstructed. One or more paint layers, decal layers, icon layers, cosmetic layers, protective layers, guiding layers, acoustic coupling layers and/or acoustic matching layers may be positioned between the platen 201 and the sensor substrate 202 (not shown).

A flexible printed circuit (FPC) 211 may be coupled to the sensor substrate 202. The FPC 211 may include one or more dielectric layers 212, one or more layers of metal interconnects 214, and one or more FPC vias 213 in some implementations. One or more FPC cover layers 215 (also known as a coverlay) may be positioned on an outer portion of one or more sides of FPC 211 to provide electrical isolation, protection of metal interconnects 214, and additional stiffness. Other layers, such as electrostatic shielding layers or EMI shielding layers (not shown) may be included on portions of FPC 211. The interconnects 214 of FPC 211 may be electrically and mechanically coupled to the sensor substrate 202 through a conductive adhesive 203, such as an ACF or a solder material. In the implementation shown, a portion of FPC 211 may be wrapped around a second surface (e.g. the backside) of sensor substrate 202, attached thereto with an FPC attachment adhesive layer 4734. An FPC infill adhesive 4736 may be positioned between a curved portion of FPC 211 and the sensor substrate 202 to provide additional rigidity and environmental protection. In some implementations, the FPC infill adhesive 4736 may be a UV or thermally curable epoxy. In some implementations, one or more encapsulation layers 4704 may be positioned around one or more exposed portions of the fingerprint sensor device 4700. In some implementations, the encapsulation layer 4704 may be applied after the fingerprint sensor device 4700 is attached to a surface of the platen 201 to provide additional rigidity and environmental protection.

Figure 48:
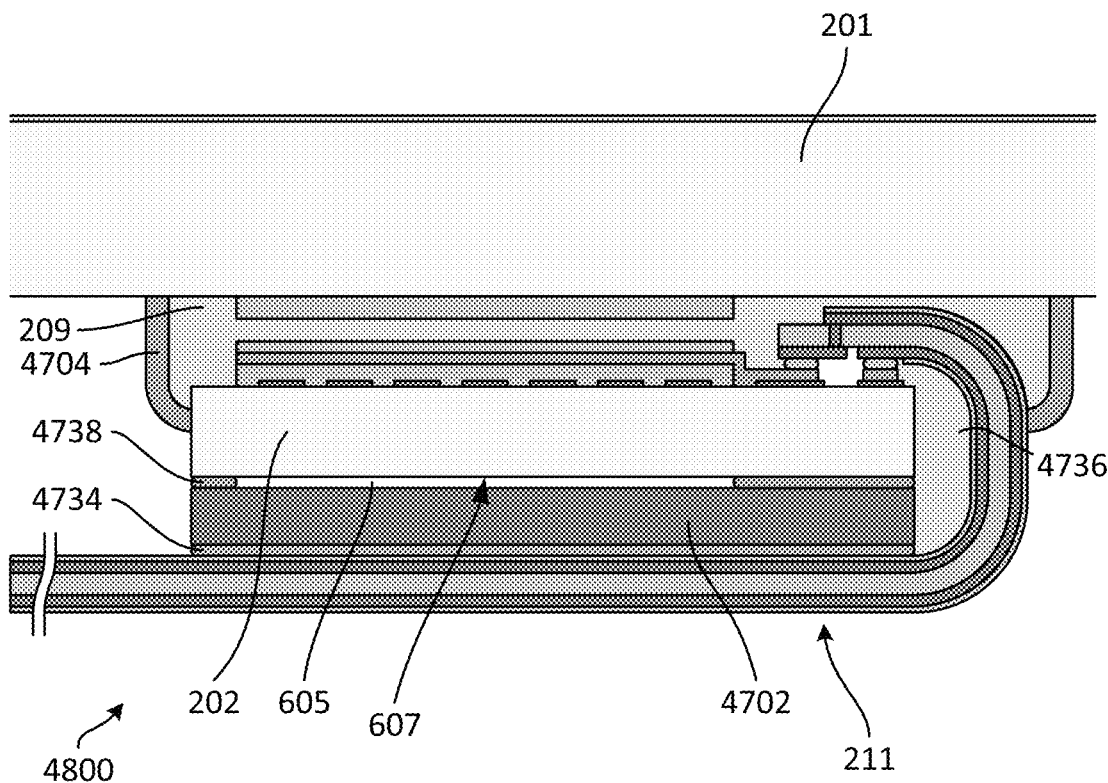

FIG. 48 illustrates an example of a fingerprint sensor device 4800 that includes a stiffener 4702 that may serve as a cap (e.g. cap means). The stiffener 4702 may be coupled to the backside of the sensor substrate 202 with a stiffener attachment adhesive 4738. The adhesive 4738 may be locally disposed on a portion of the backside of the sensor substrate 202 such as on one or more sides of a periphery region of the sensor substrate 202. In some implementations, adhesive 4738 may be disposed in a continuous frame around the backside of the sensor substrate 202. The stiffener 4702 may be coupled to the sensor substrate 202 such that a cavity 605 is formed between the second surface (e.g., back surface) of the sensor substrate 202 and the stiffener 4702. The cavity 605 may be a sealed cavity. In some implementations, the adhesive 4738 may be dispensed or screened onto the sensor substrate 202 and/or stiffener 4702 prior to assembly. In some implementations, the adhesive 4738 may comprise a metal bond ring for eutectic attachment of the stiffener 4702 to the sensor substrate 202. In some implementations, the adhesive 4738 may be applied to either the stiffener 4702 or the sensor substrate 202 prior to bonding the stiffener 4702 and sensor substrate 202 together. In some implementations, the stiffener-to-substrate bond may include a thermoplastic adhesive, a pressure-sensitive adhesive (PSA), an epoxy, a UV-curable epoxy, a thermal curing epoxy, a glass frit, a metal seal, a eutectic bond, a thermocompression bond, a plasma bond, or an anodic bond. In some implementations, the stiffener may comprise a wafer, substrate, panel, sub-panel or one or more layers of plastic, metal, glass, or silicon. In some implementations, a spacer may be used in the bonding process to control the gap height (e.g., the height of the cavity). In some implementations, the stiffener 4702 may be attached as a wafer, substrate, panel, sub-panel or other layer to the sensor substrate 202 prior to dicing, cutting or otherwise singulating the sensor die into a form illustrated in FIG. 48.

In some implementations, the stiffener 4702 may have one or more vent holes (not shown) to allow unwanted efflux from solvents, epoxies and other adhesives to be exhausted during assembly. Vent holes in the stiffener 4702 that are connected to the cavity 605 may allow the use of thermal adhesives 4738 when forming a continuous ring or frame around the cavity 605. The vent holes may be sealed as desired to provide environmental protection. In some implementations, the stiffener 4702 may include one or more standoffs and/or sidewalls that cover one or more sides of the sensor substrate. In some implementations, a protective encapsulation layer 4704 such as an edge seal, mold compound, an epoxy or other adhesive may be included with the stiffener 4702 and the platen adhesive 209 to further protect the sensor substrate 202 and other components of the fingerprint sensor device 4800.

The stiffener 4702 and the cavity 605 formed thereby may allow the interface between the sensor substrate 202 and the cavity 605 to operate as an acoustic barrier 607 (e.g., acoustic barrier means) for the fingerprint sensor device 4800. In some implementations, the cavity 605 may be evacuated or partially evacuated or filled with air or a gas such as nitrogen. The cavity 605 may have different cavity heights. For example, the height of the cavity 605 between the second surface of the sensor substrate 202 and the stiffener 4702 may be between about 0.05 microns (µm) and 150 microns (µm), or larger.

As described with respect to FIG. 47 above, an FPC 211 may be wrapped around the sensor substrate 202 and attached to the sensor substrate 202 with an FPC attachment adhesive layer 4734. An FPC infill adhesive 4736 may be positioned between a curved portion of the FPC 211 and the sensor substrate 202. In some implementations, the fingerprint sensor device 4800 may be attached to a platen 201 with a platen adhesive 209 and one or more encapsulation layers 4704.

Figure 49:
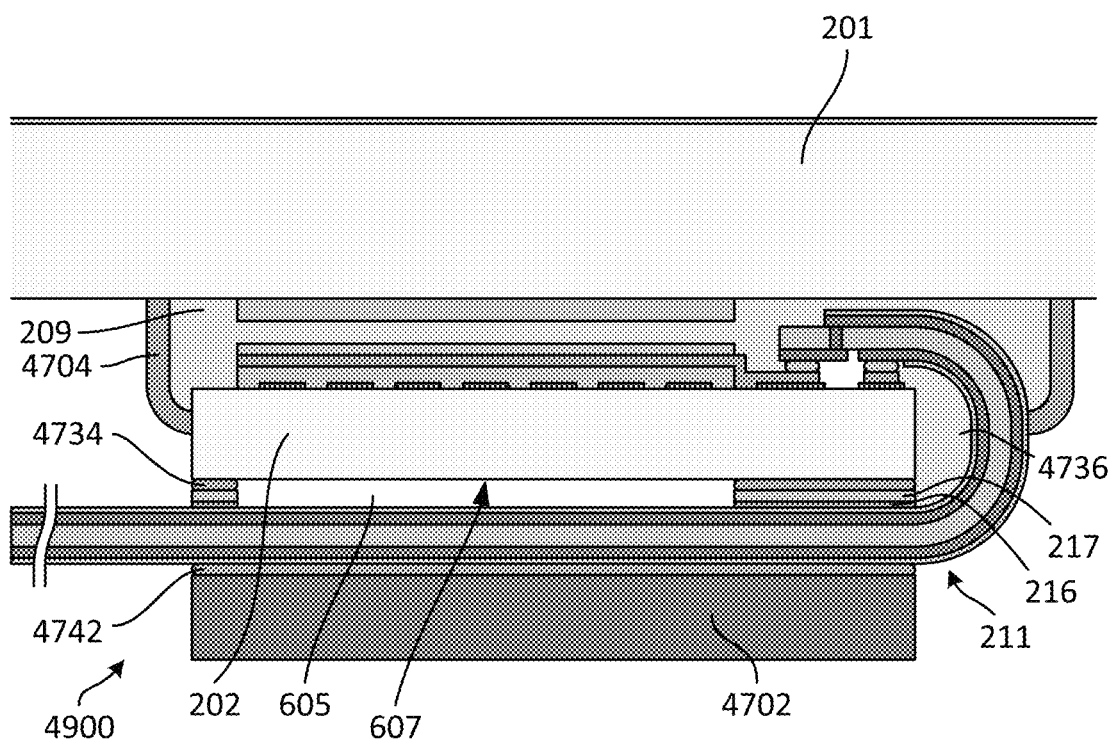

FIG. 49 illustrates an example of a fingerprint sensor device 4900 that includes an FPC 211 and an optional stiffener 4702 that may serve as a cap. The FPC 211 may be coupled to the backside of the sensor substrate 202 with an FPC attachment adhesive layer 4734. The adhesive layer 4734 may be locally disposed on a portion of the FPC 211 or the backside of the sensor substrate 202. In some implementations, the adhesive layer 4734 may be disposed in a continuous frame around the backside of the sensor substrate 202. The FPC 211 may be coupled to the sensor substrate 202 such that a cavity 605 is formed between the back surface of the sensor substrate 202 and the FPC 211. The cavity 605 may be a sealed cavity. In some implementations, the adhesive layer 4734 may be disposed on a raised portion of the FPC 211. The raised portion may be formed in part by additional layers or cutout regions in the FPC 211. As illustrated in FIG. 49, an FPC frame region 217 coupled to the FPC 211 with an FPC frame adhesive layer 216 may serve as the raised portion. The FPC attachment adhesive layer 4734 may couple the raised portion of the FPC 211 to the backside of the sensor substrate 202 to form a cavity 605. In some implementations, the FPC frame region 217 may be formed from a polyimide (PI) layer and attached to the FPC 211 with a laminated adhesive layer 216. In some implementations, the thickness of the FPC frame region 217, the adhesive layer 216 and the adhesive layer 4734 may control the height of the cavity 605. The cavity 605 allows the interface between the sensor substrate 202 and the cavity 605 to operate as an acoustic barrier 607 for the fingerprint sensor device 4900.

The FPC 211 may be wrapped around the sensor substrate 202 and attached to the sensor substrate 202 with the FPC attachment adhesive layer 4734. An FPC infill adhesive 4736 may be positioned between a curved portion of FPC 211 and the sensor substrate 202. In some implementations, the fingerprint sensor device 4900 may be attached to a platen 201 with a platen adhesive 209 and one or more encapsulation layers 4704. As shown in FIG. 49, an optional stiffener 4702 may be attached to FPC 211 with a stiffener adhesive 4742 proximate to the cavity 605 to provide additional rigidity and environmental protection.

Figure 50:
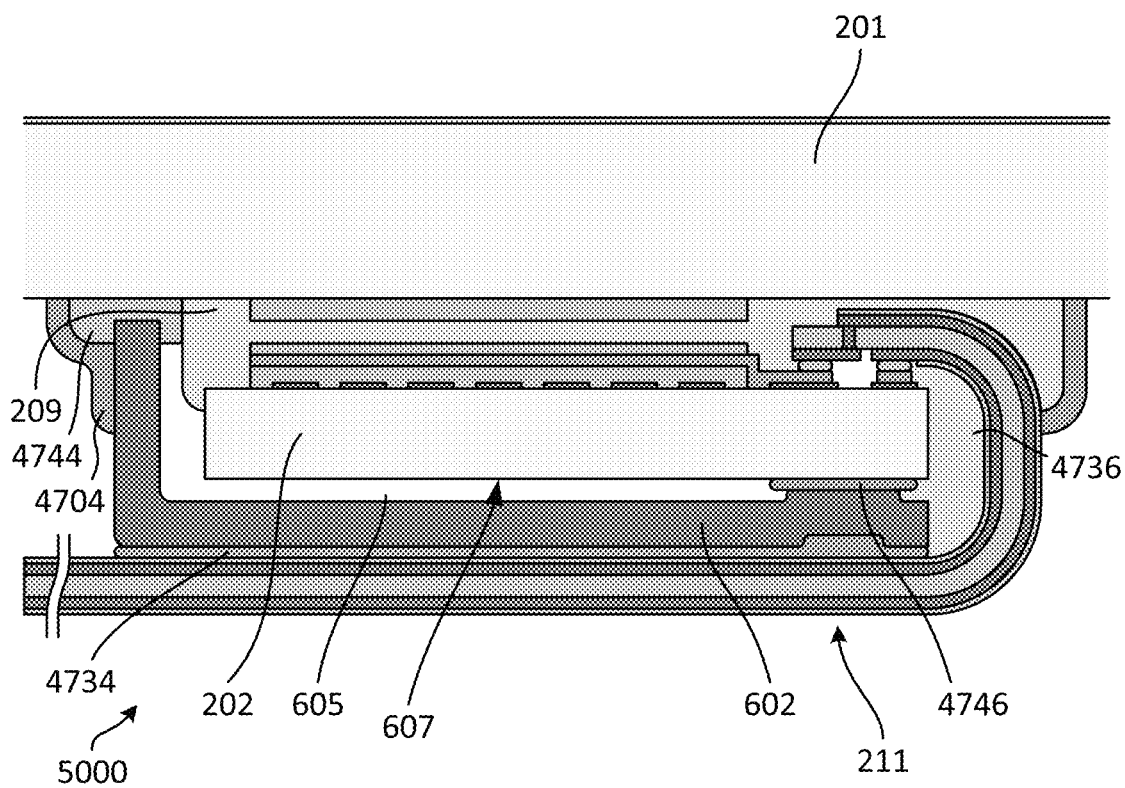

FIG. 50 illustrates an example of a fingerprint sensor device 5000 that includes a cap 602 (e.g. cap means). The cap 602 may be coupled to a portion of a platen 201 with a cap attachment adhesive 4744 and to a portion of the sensor substrate 202 with a cap attachment adhesive layer 4746. The adhesive layer 4746 may be locally disposed on a portion of the backside of the sensor substrate 202 such as on one or more sides of a periphery region of the sensor substrate 202. In some implementations, the cap 602 may be largely cantilevered over the active area of the sensor substrate 202 and attached at one end with the adhesive layer 4746. The cap 602 may be coupled to the sensor substrate 202 such that a cavity 605 is formed between the second surface (e.g., back surface) of the sensor substrate 202 and the cap 602. In some implementations, the adhesive layer 4746 may be dispensed or screened onto the sensor substrate 202 and/or cap 602 prior to assembly. In some implementations, a protruding portion of the cap 602, e.g. a stamped or pressed portion, may be connected to the sensor substrate 202 with the adhesive layer 4746. The cap attachment adhesive 4744 and/or the adhesive layer 4746 may include a thermoplastic adhesive, a pressure-sensitive adhesive (PSA), an epoxy, a UV-curable epoxy, a thermal curing epoxy, etc. In some implementations, the cap 602 may comprise one or more layers of plastic or metal. In some implementations, the cap attachment adhesive 4744 may be dispensed on a portion of the platen 201 and exposed portions of the platen adhesive 209 prior to attachment of the cap 602.

In some implementations, the protruding portion of the cap 602 and the adhesive layer 4746 may control the cavity height. For example, the height of the cavity 605 between the second surface of the sensor substrate 202 and the cap 602 may be between about 0.05 microns (μm) and 150 microns (μm) or larger. The cap 602 and the cavity 605 formed thereby may allow the interface between the sensor substrate 202 and the cavity 605 to operate as an acoustic barrier 607 for the fingerprint sensor device 5000.

An FPC 211 may be wrapped around the sensor substrate 202 and cap 602 and attached to the cap 602 with an FPC attachment adhesive layer 4734. An FPC infill adhesive 4736 may be positioned between a curved portion of FPC 211 and the sensor substrate 202. In some implementations, the fingerprint sensor device 5000 may be attached to the platen 201 with a platen adhesive 209, a cap attachment adhesive 4744, and one or more encapsulation layers 4704.

Figure 51:
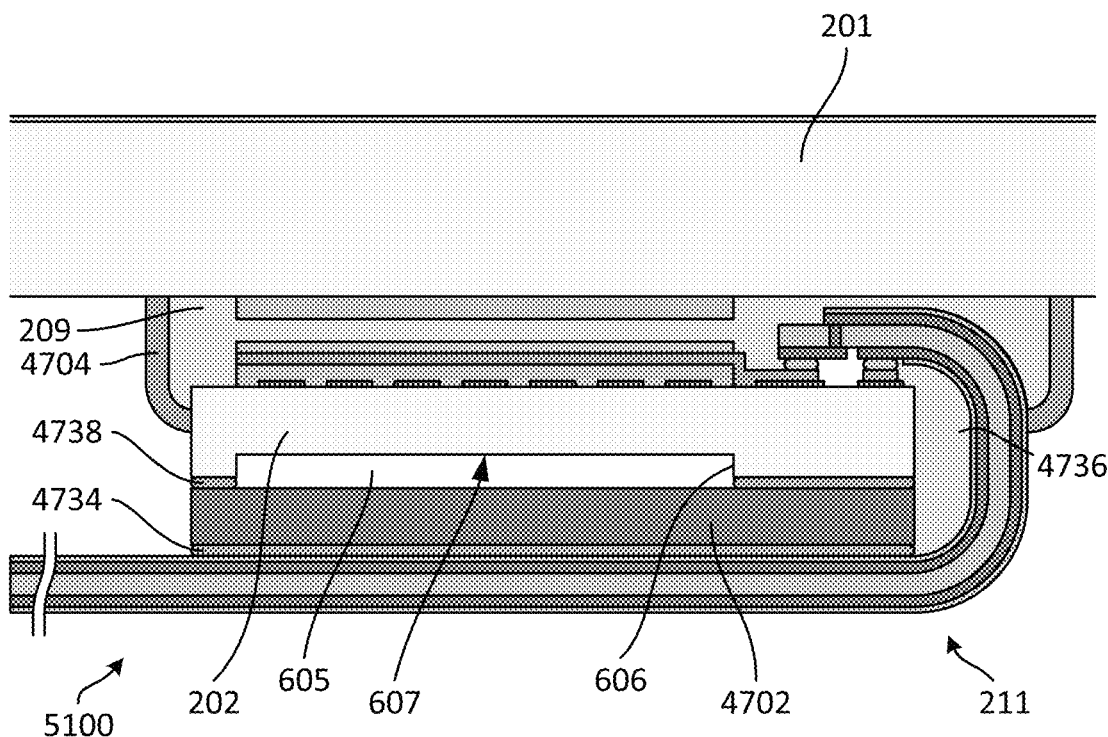

FIG. 51 illustrates an example of a fingerprint sensor device 5100 that includes a stiffener 4702 that may serve as a cap over a recessed region 606 in the sensor substrate 202. The stiffener 4702 may be coupled to the backside of the sensor substrate 202 with stiffener attachment adhesive 4738. The adhesive 4738 may be locally disposed on a peripheral portion of the backside of the sensor substrate 202. In some implementations, the adhesive 4738 may be disposed in a continuous frame around the backside of the sensor substrate 202 exterior to the recessed region 606. In some implementations, the stiffener attachment adhesive 4738 may span the recessed region 606. The stiffener 4702 may be coupled to the sensor substrate 202 such that a cavity 605 is formed between the recessed region 606 of the sensor substrate 202 and the stiffener 4702. In some implementations, the adhesive 4738 may be dispensed or screened onto the sensor substrate 202 and/or stiffener 4702 prior to bonding the stiffener 4702 and sensor substrate 202 together. In some implementations, the stiffener-to-substrate bond may include a thermoplastic adhesive, a pressure-sensitive adhesive (PSA), an epoxy, a UV-curable epoxy, a thermal curing epoxy, a glass frit, a metal seal, a eutectic bond, a thermocompression bond, etc. In some implementations, the stiffener may comprise a wafer, substrate, panel, sub-panel or one or more layers of plastic, metal, glass or silicon. In some implementations, the stiffener 4702 may be attached as a wafer, substrate, panel, sub-panel or other layer to the sensor substrate 202 prior to dicing, cutting or otherwise singulating the sensor die.

The stiffener 4702 and the cavity 605 formed thereby may allow the interface between the sensor substrate 202 and the cavity 605 to operate as an acoustic barrier 607. The height of the cavity 605 between the recessed region 606 of the sensor substrate 202 and the stiffener 4702 may be between about 0.05 microns (μm) and 150 microns (μm) or larger.

An FPC 211 may be wrapped around the sensor substrate 202 and stiffener 4702 and attached to the stiffener 4702 with an FPC attachment adhesive layer 4734. An FPC infill adhesive 4736 may be positioned between a curved portion of FPC 211 and the sensor substrate 202. In some implementations, the fingerprint sensor device 5100 may be attached to the platen 201 with a platen adhesive 209 and one or more encapsulation layers 4704. In some implementations of a sensor substrate 202 having a recessed region 606 forming a cavity 605, the FPC 211 may span the cavity 605 and the stiffener 4702 attached to the FPC 211 proximate the cavity 605.

Figure 52:
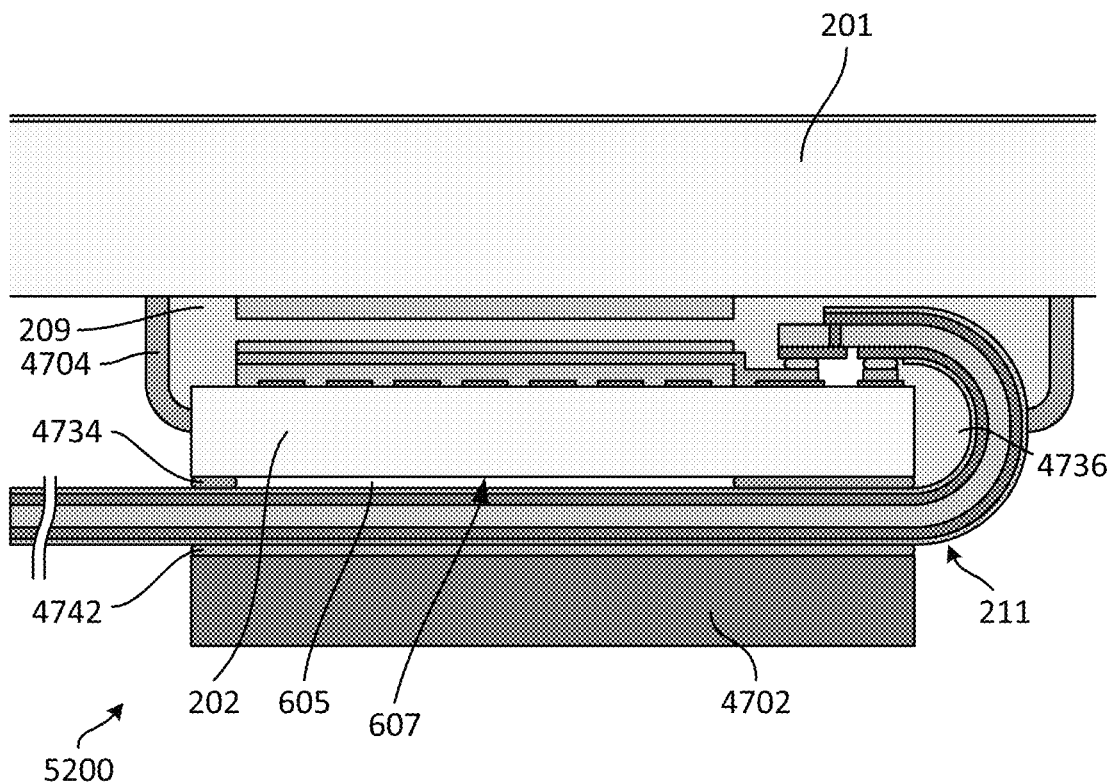

FIG. 52 illustrates an example of a fingerprint sensor device 5200 that includes an FPC 211 that may serve as a cap. The FPC 211 may be coupled to the backside of the sensor substrate 202 with a locally disposed FPC attachment adhesive layer 4734. The FPC 211 may be coupled to the sensor substrate 202 such that a cavity 605 is formed between the back surface of the sensor substrate 202 and the FPC 211. The thickness of the adhesive layer 4734 may control the height of the cavity 605. The cavity 605 allows the interface between the sensor substrate 202 and the cavity 605 to operate as an acoustic barrier 607 for the fingerprint sensor device 5200. The FPC 211 may be wrapped around the sensor substrate 202 and attached to the sensor substrate 202 with the FPC attachment adhesive layer 4734. An FPC infill adhesive 4736 may be positioned between a curved portion of FPC 211 and the sensor substrate 202. In some implementations, the fingerprint sensor device 5200 may be attached to a platen 201 with a platen adhesive 209 and one or more encapsulation layers 4704. As shown in FIG. 51, an optional stiffener 4702 may be attached to FPC 211 with a stiffener adhesive 4742 proximate the cavity 605. In a variation of the configuration shown in FIG. 51, the stiffener 4702 may be attached between the FPC 211 and the sensor substrate 202 to form the cavity 605. It is noted that the fingerprint sensor devices described in FIGS. 47-52 may be fabricated using the methods, processes, and/or sequences described in FIGS. 43A-43C, 44A-44C, 45A-45B, and/or 46.

Exemplary Electronic Devices

Figure 53:
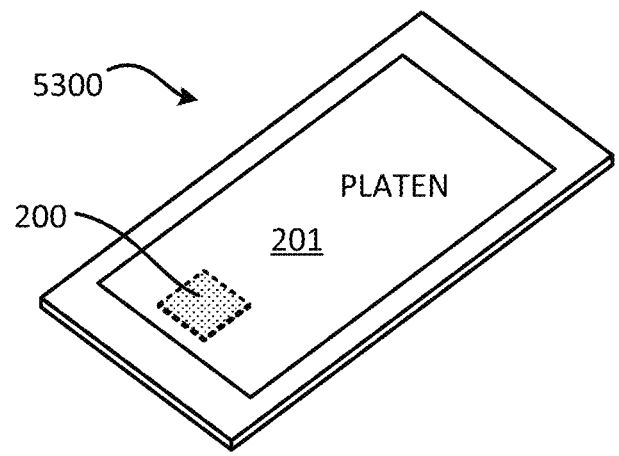
FIG. 53 illustrates an angled view of a mobile device that includes a fingerprint sensor device.
Figure 54:
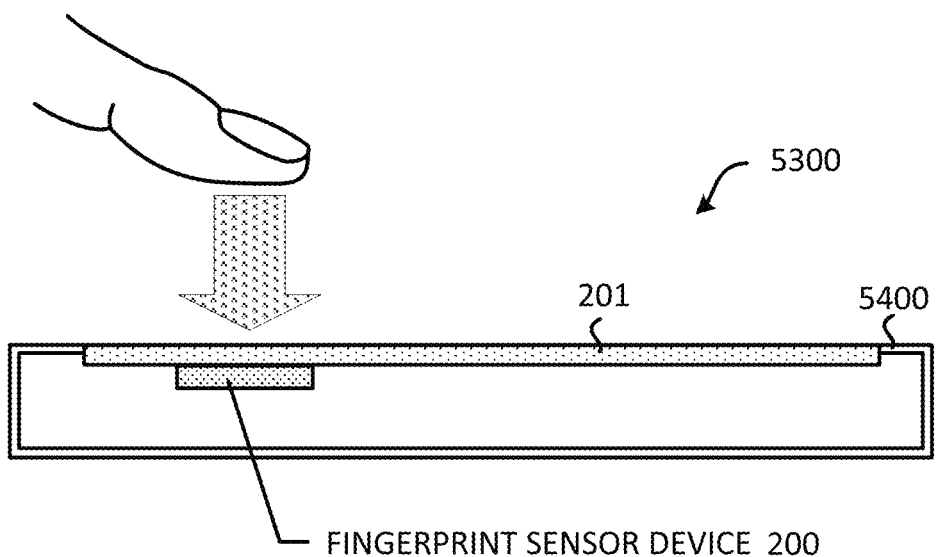
FIG. 54 illustrates a cross-sectional view of a mobile device that includes a fingerprint sensor device.

FIG. 53 illustrates an angled view of a mobile device 5300 that includes a platen 201 and a fingerprint sensor device 200. FIG. 54 illustrates a cross-sectional view of the mobile device 5300 that includes the platen 201 and a housing 5400. As shown in FIG. 54, the fingerprint sensor device 200 (e.g., fingerprint sensing means) may be positioned inside the mobile device 5300 and located beneath the platen 201, and thereby providing an aesthetically pleasing mobile device with fingerprint sensing functionality. In some implementations, the fingerprint sensor device 200 may be positioned under the cover glass of a mobile device 5300 having a display, with the cover glass or display serving as a platen. In some implementations, the fingerprint sensor device 200 may be positioned behind a portion of a display module. In some implementations, the fingerprint sensor device 200 may be positioned within a button associated with the mobile device 5300. In some implementations, the fingerprint sensor device 200 may be positioned within the mobile device 5300 and attached to a front side, backside, or sidewall of the housing 5400. It is noted that any of the fingerprint sensor devices (e.g., finger sensing means) described in the present disclosure may be implemented in the mobile device 5300.

Exemplary Inverted Fingerprint Sensor Devices

Figure 55:
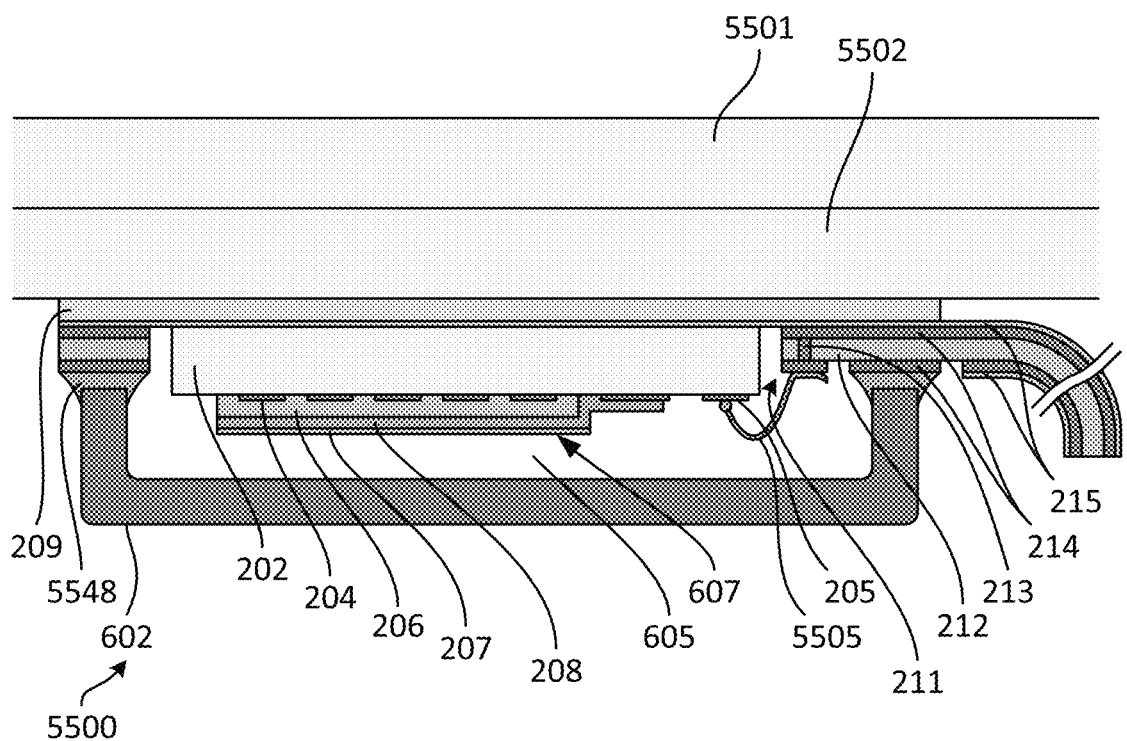
FIG. 55 illustrates an example of an inverted fingerprint sensor device coupled to a visual display with a portion of an FPC positioned between the sensor substrate and the visual display.

FIG. 55 illustrates an example of an inverted fingerprint sensor device 5500 coupled to a visual display with a portion of an FPC 211 positioned between the sensor substrate 202 and the visual display. In some implementations, the fingerprint sensor device 5500 may be coupled to a display module 5502 that underlies a display cover layer 5501 such as a cover glass of an LCD or OLED display device. Details of the display module 5502 are not shown for clarity. In some implementations, the display module 5502 may comprise an LCD display panel, an OLED display panel, or a layer thereof. The fingerprint sensor device 5500 may be coupled to a portion of the display module with a platen adhesive 209.

As shown in FIG. 55, the fingerprint sensor device 5500 may be located underneath a layer of the display module 5502. The fingerprint sensor device 5500 may include a sensor substrate 202, a plurality of sensor circuits 204, a transceiver layer 206, and one or more transceiver electrodes 208. In some implementations, the sensor substrate 202 may include a silicon substrate, a silicon-on-insulator (SOI) substrate, a thin-film transistor (TFT) substrate, a glass substrate, a plastic substrate, a ceramic substrate, or a portion of an LCD or OLED display substrate. As described above with respect to FIG. 5, the inverted fingerprint sensor device may generate and launch one or more ultrasonic waves through the sensor substrate 202 and receive reflected ultrasonic waves back through the sensor substrate 202 for ultrasonic imaging of a target object.

Interconnects (e.g., electrical traces) may be provided on the sensor substrate 202 to provide electrical connection between sensor circuits 204, transceiver electrode 208, and/or one or more bond pads 205. In some implementations, a transceiver electrode coating layer 207 such as an acrylic layer or a passivation layer may be disposed on an outer surface of the transceiver electrode 208 to provide dielectric isolation and environmental protection for the fingerprint sensor device 5500.

The sensor substrate 202 may be coupled to a flexible printed circuit (FPC) 211. The FPC 211 may include one or more dielectric layers 212, one or more layers of metal interconnects 214, and one or more FPC vias 213 in some implementations. One or more FPC cover layers 215 may be positioned on an outer portion of one or more sides of FPC 211. A cutout region may be formed in one or more dielectric layers 212, metal interconnects 214 and cover layers 215 in FPC 211 for the attachment of the sensor substrate 202 to the FPC 211. In some implementations, acoustic performance may be impacted favorably by the use of thin layers between the sensor substrate 202 and the display module 5502. One or more dielectric layers 212, metal interconnects 214 or cover layers 215 may be positioned between the sensor substrate 202 and the display module 5502. As shown in FIG. 55, a single cover layer 215 is positioned between the sensor substrate 202 and the display module 5502.

Bond pads 205 on the sensor substrate 202 may be electrically coupled to one or more interconnects 214 of FPC 211 through a conductive adhesive such as an ACF or a solder material, or through one or more bond wires 5505 as shown. A cap 602 such as a stamped metal cap may be positioned over the sensor substrate 202 and attached to FPC 211 with a cap adhesive 5548 such as a solder, an epoxy or other suitable adhesive material. A cavity 605 may be formed between the cap 602 and the transceiver electrode 208 (or coating layer 207) to form an acoustic barrier 607 at the interface between the transceiver electrode 208 (or coating layer 207) and the cavity 605. A portion of the FPC 211 may be optionally wrapped around an outer side of cap 602 and attached thereto with a suitable adhesive.

Figure 56:
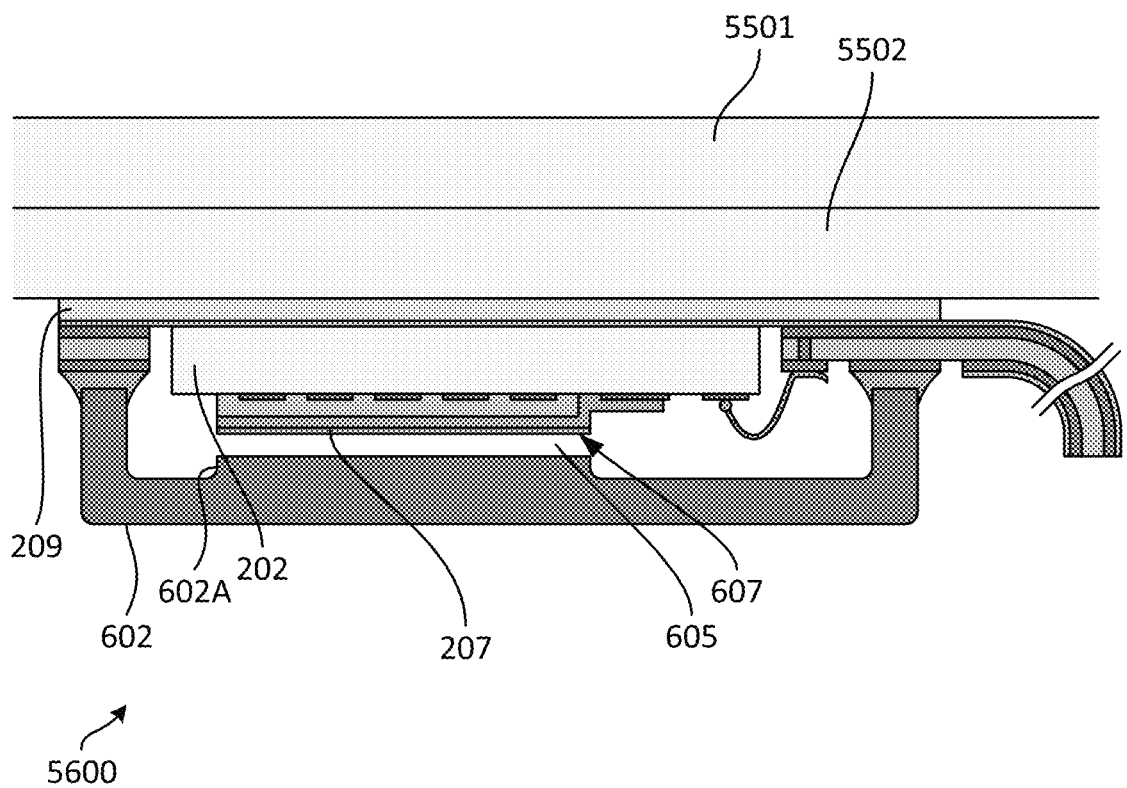
FIG. 56 illustrates another example of an inverted fingerprint sensor device coupled to a visual display with a portion of an FPC positioned between the sensor substrate and the visual display.

The fingerprint sensor device 5500 may be coupled to the display module 5502 with a platen adhesive 209. In some implementations where the interface layers between the sensor substrate 202 and the display module 5502 are particularly thin and flexible, a protruding region 602A may be included as part of cap 602, as shown in FIG. 56. During assembly, the protruding region 602A of the cap 602 may be pressed against device layers such as coating layer 207 on the sensor substrate 202 to compress the platen adhesive 209 and aid in the uniform attachment of the fingerprint sensor device 5600 to the display module 5502. After assembly, the protruding region 602A of cap 602 pulls away from the coating layer 207 to restore the cavity 605 and the acoustic barrier 607 between the coating layer 207 and the cavity 605.

Figure 57:
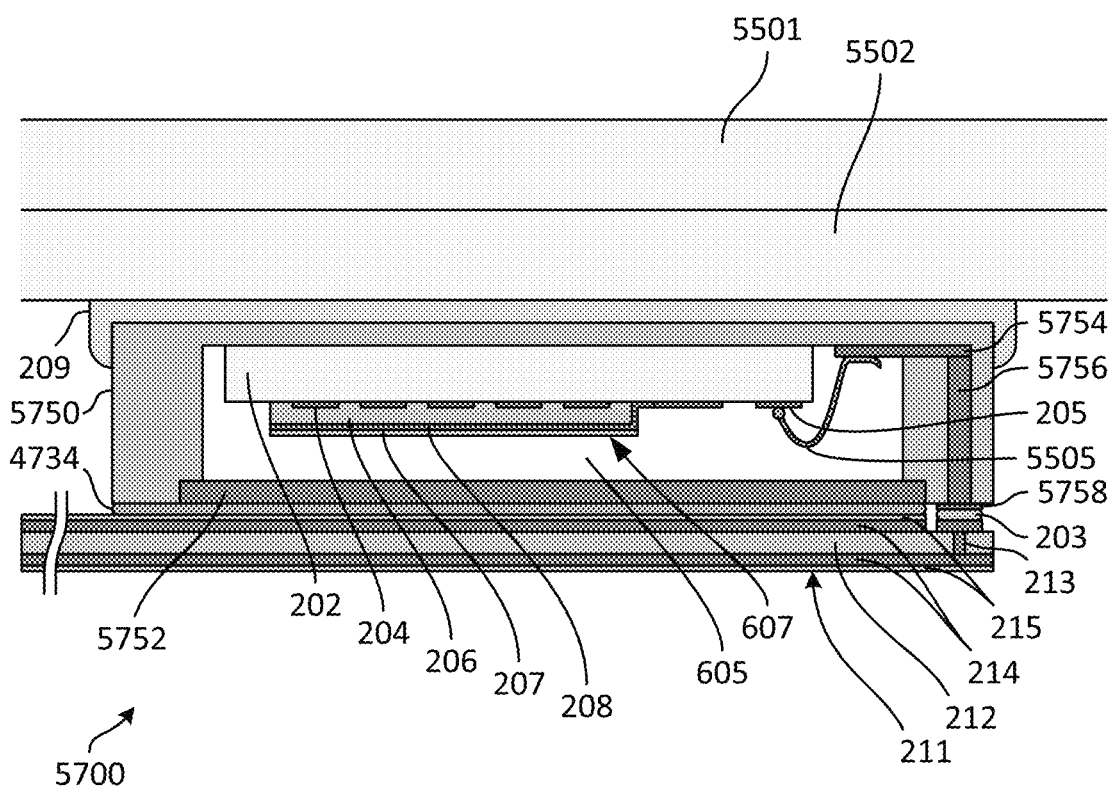
FIG. 57 illustrates an example of an inverted fingerprint sensor device in an LTCC or plastic package that is coupled to a portion of a visual display.

FIG. 57 illustrates an example of an inverted fingerprint sensor device 5700 in an LTCC or plastic package 5750 that is coupled to a portion of a visual display with a layered portion of the package 5750 positioned between the sensor substrate and the visual display. In some implementations, the fingerprint sensor device 5700 may be coupled to a display module 5502 that underlies a display cover layer 5501. The fingerprint sensor device 5500 may be coupled to a portion of the display module 5502 with a platen adhesive 209.

As shown in FIG. 57, the fingerprint sensor device 5700 may be located underneath a layer of the display module 5502. The fingerprint sensor device 5700 may include a sensor substrate 202, a plurality of sensor circuits 204, a transceiver layer 206, and one or more transceiver electrodes 208. Interconnects may be provided on the sensor substrate 202 to provide electrical connection between sensor circuits 204, transceiver electrode 208, and/or one or more bond pads 205. A transceiver electrode coating layer 207 may be disposed on an outer surface of the transceiver electrode 208 to provide dielectric isolation and environmental protection for the fingerprint sensor device 5700. Passivation layers and other device layers are not shown for clarity.

The sensor substrate 202 may be attached to a nominally flat bottom of the LTCC or plastic package 5750. The material used in the bottom of the package 5750 may be selected to have an acoustic impedance similar to that of the display module 5502 or the sensor substrate 202 to reduce acoustic reflections of ultrasonic waves traveling through the interface between the sensor substrate 202 and the bottom of package 5750. In some implementations, the bottom layer of package 5750 may serve as a platen without attachment to a display module. An FPC 211 may be attached to one or more embedded package vias 5756 and external landing pads 5758 of package 5750 with an electrically conductive adhesive 203 such as a solder or a layer of ACF. The FPC 211 may include one or more dielectric layers 212, one or more layers of metal interconnects 214, and one or more FPC vias 213. One or more FPC cover layers 215 may be positioned on an outer portion of FPC 211. In some implementations, the FPC 211 may be attached to a metal, plastic or ceramic lid 5752 of the package 5750 with an FPC attachment adhesive layer 4734.

Bond pads 205 on the sensor substrate 202 may be electrically coupled to one or more package traces 5754, package vias 5756 and associated landing pads 5758 of the LTCC or plastic package 5750 to interconnects 214 of FPC 211 through a conductive adhesive 203, such as an ACF or a solder material. One or more bond wires 5505 may provide electrical connection from the bond pads 205 to the package traces 5754. A lid 5752 such as a stamped metal, plastic or ceramic layer may be positioned over and attached to the package 5750 with an epoxy, glue, solder or other suitable adhesive material. A cavity 605 may be formed between the lid 5752 and the coating layer 207 to form an acoustic barrier 607 at the interface between the coating layer 207 and the cavity 605. The fingerprint sensor device 5700 including the package 5750 may be coupled to the display module 5502 with a platen adhesive 209 or through other suitable means. It is noted that the fingerprint sensor devices described in FIGS. 47-52 may be fabricated using the methods, processes, and/or sequences described in FIGS. 43A-43C, 44A-44C, 45A-45B, and/or 46.

Exemplary Electronic Devices

Figure 58:
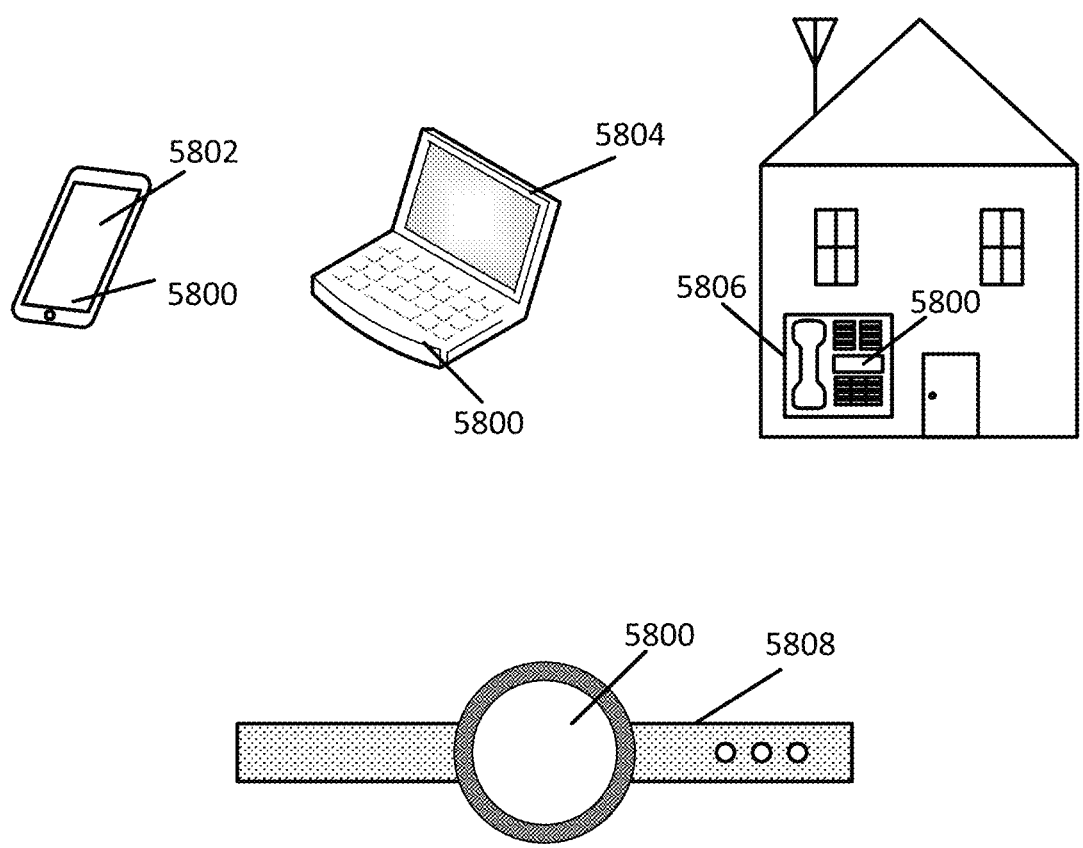
FIG. 58 illustrates various electronic devices that may include the various integrated devices, integrated device packages, semiconductor devices, dies, integrated circuits, sensors and/or packages described herein.

FIG. 58 illustrates various electronic devices that may be integrated with any of the aforementioned fingerprint sensor devices, integrated device, semiconductor device, integrated circuit, die, interposer, package or package-on-package (PoP). For example, a mobile phone device 5802, a laptop computer device 5804, a fixed location terminal device 5806, or a wearable device 5808 may include a fingerprint sensor device 5800 as described herein. The fingerprint sensor device 5800 may be, for example, any of the fingerprint sensor devices described herein. The devices 5802, 5804, 5806 and 5808 illustrated in FIG. 58 are merely exemplary. Other electronic devices may also feature the fingerprint sensor device 5800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 9-42, 43A-43C, 44A-44C, 45A-45B, and/or 46-58 may be rearranged and/or combined into a single component, process, feature or function or embodied in several components, processes, or functions. Additional elements, components, processes, and/ or functions may also be added without departing from the disclosure. It should also be noted FIGS. 2-6, 9-42, 43A-43C, 44A-44C, 45A-45B, and/or 46-58 and its corresponding description in the present disclosure is not limited to dies and/or ICs. In some implementations, FIGS. 2-6, 9-42, 43A-43C, 44A-44C, 45A-45B, and/or 46-58 and its corresponding description may be used to manufacture, create, provide, and/or produce fingerprint sensor devices and/or integrated devices. In some implementations, a device may include a fingerprint sensor device, a die, an integrated device, a die package, an integrated circuit (IC), a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A fingerprint sensor device, comprising:
a platen;
a sensor substrate including a recessed portion configured to allow a flexible printed circuit to be located between the platen and the sensor substrate;
a cap coupled to the sensor substrate;
a cavity formed between the sensor substrate and the cap, wherein the sensor substrate and the cavity form an acoustic barrier;
a plurality of sensor circuits over a first surface of the sensor substrate;
a transceiver layer located over the plurality of sensor circuits and the first surface of the sensor substrate, wherein the transceiver layer comprises a first single piezoelectric layer that is configured to both generate one or more ultrasonic waves, and to receive one or more ultrasonic waves; and
a transceiver electrode positioned over the first single piezoelectric layer.

2. The fingerprint sensor device of claim 1, wherein the transceiver electrode is coupled to at least one via of the sensor substrate.

3. The fingerprint sensor device of claim 2, wherein the at least one via comprises a through-substrate via (TSV).

4. The fingerprint sensor device of claim 2, wherein the at least one via comprises a molded via bar.

5. The fingerprint sensor device of claim 1,
wherein the acoustic barrier is configured to have a reflection ratio of about at least 80%.

6. The fingerprint sensor device of claim 5, wherein the cavity has a height between about 0.05 microns and about 150 microns.

7. The fingerprint sensor device of claim 5, wherein the cap is selected from the group consisting of a wafer, a substrate, a panel, a sub-panel, a printed circuit board (PCB), a flexible printed circuit (FPC), an encapsulation layer, a metal layer, and a plastic layer.

8. The fingerprint sensor device of claim 1, wherein the sensor substrate is coupled to the platen with a platen adhesive and wherein the transceiver electrode is positioned between the plurality of sensor circuits and the platen.

9. The fingerprint sensor device of claim 1, wherein the sensor substrate comprises a second surface opposite the first surface, and wherein the second surface of the sensor substrate is coupled to the platen with a platen adhesive.

10. The fingerprint sensor device of claim 1, wherein the sensor substrate comprises silicon or glass.

11. The fingerprint sensor device of claim 1, wherein the sensor substrate has a thickness between about 50 microns and about 500 microns.

12. The fingerprint sensor device of claim 1, further comprising a coating layer disposed on the transceiver electrode.

13. The fingerprint sensor device of claim 1, wherein the first single piezoelectric layer or a second piezoelectric layer comprises a first segmented piezoelectric layer and a second segmented piezoelectric layer, and wherein the transceiver electrode comprises a transmitter electrode coupled to the first segmented piezoelectric layer and a receiver electrode coupled to the second segmented piezoelectric layer.

14. The fingerprint sensor device of claim 13, wherein the first segmented piezoelectric layer and the transmitter electrode are configured to generate one or more ultrasonic waves, and wherein the second segmented piezoelectric layer and the receiver electrode are configured to receive one or more ultrasonic waves.

15. The fingerprint sensor device of claim 1, wherein the fingerprint sensor device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

16. The fingerprint sensor device of claim 1, further comprising the platen, wherein the platen comprises at least a portion of a display cover glass, an LCD display panel, an OLED display panel, a display module, a mobile device enclosure, or a cover of an ultrasonic authenticating button.

17. An apparatus comprising:
a platen;
a sensor substrate including a recessed portion configured to allow a flexible printed circuit to be located between the platen and the sensor substrate;
cap means coupled to the sensor substrate;
a cavity formed between the sensor substrate and the cap means, wherein the sensor substrate and the cavity form an acoustic barrier;
a plurality of sensor circuits over a first surface of the sensor substrate; and
transceiver means located over the plurality of sensor circuits and the first surface of the sensor substrate, wherein the transceiver means comprises:
transmitter means; and
receiver means,
wherein the transceiver means comprises a first single piezoelectric layer configured to generate one or more ultrasonic waves and to receive one or more ultrasonic waves.

18. The apparatus of claim 17, wherein the transceiver means includes a transceiver electrode coupled to at least one via of the sensor substrate.

19. The apparatus of claim 17, wherein a height of the cavity between the sensor substrate and the cap means is between about 0.05 microns and about 150 microns.

20. The apparatus of claim 19, wherein the cap means is selected from the group consisting of a wafer, a substrate, a panel, a sub-panel, a printed circuit board (PCB), a flexible printed circuit (FPC), an encapsulation layer, a metal layer, and a plastic layer.

21. The apparatus of claim 17, wherein the sensor substrate is coupled to the platen with a platen adhesive and wherein the transceiver means includes a transceiver electrode that is positioned between the plurality of sensor circuits and the platen.

22. The apparatus of claim 17, wherein the sensor substrate comprises a second surface opposite the first surface, and wherein the second surface of the sensor substrate is coupled to the platen with a platen adhesive.

23. The apparatus of claim 17, wherein the acoustic barrier is configured to have a reflection ratio of about at least 80 percent.

24. The apparatus of claim 17, wherein the acoustic barrier is configured to have a reflection ratio of about at least 98 percent.

25. The apparatus of claim 17, wherein the sensor substrate has a thickness between about 50 microns and about 500 microns.

26. The apparatus of claim 17, wherein the transmitter means comprises:
 a first piezoelectric segment;
 an electrode layer formed over the first single piezoelectric segment; and
 a coating layer formed over the electrode layer.

27. The apparatus of claim 26, wherein the receiver means further comprises:
 a second piezoelectric segment;
 a second electrode layer formed over the second piezoelectric segment; and
 a second coating layer formed over the second electrode layer.

28. The apparatus of claim 27,
 wherein the first single piezoelectric layer includes the first piezoelectric segment, and
 wherein the second piezoelectric segment is coplanar with the first piezoelectric segment.

29. The apparatus of claim 17, further comprising the platen, wherein the platen comprises at least a portion of a display cover glass, an LCD display panel, an OLED display panel, a display module, a mobile device enclosure, or a cover of an ultrasonic authenticating button.

30. A method for fabricating a fingerprint sensor device, comprising:
 providing a platen;
 providing a sensor substrate including a recessed portion;
 coupling a cap to the sensor substrate such that a cavity is formed between the sensor substrate and the cap, wherein the sensor substrate and the cavity form an acoustic barrier;
 providing a flexible printed circuit located between the platen and the sensor substrate;
 forming a plurality of sensor circuits over a first surface of the sensor substrate;
 providing a transceiver layer over the plurality of sensor circuits and the first surface of the sensor substrate, wherein providing the transceiver layer comprises:
  providing a first single piezoelectric layer that is configured to both generate one or more ultrasonic waves and to receive one or more ultrasonic waves; and
 providing a transceiver electrode positioned over the first single piezoelectric layer.

31. The method of claim 30, wherein providing the transceiver electrode comprises coupling the transceiver electrode to at least one via in the sensor substrate.

32. The method of claim 31, wherein providing the at least one via comprises forming a through-substrate via (TSV).

33. The method of claim 31, wherein providing the at least one via comprises providing a molded via bar.

34. The method of claim 30, wherein the cavity positioned between the sensor substrate and the cap has a cavity height between about 0.05 microns and about 150 microns.

35. The method of claim 30, wherein the cap is selected from the group consisting of a wafer, a substrate, a panel, a sub-panel, a printed circuit board (PCB), a flexible printed circuit (FPC), an encapsulation layer, a metal layer, and a plastic layer.

36. The method of claim 30, wherein the sensor substrate comprises a second surface, and wherein the second surface of the sensor substrate is coupled to the platen with a platen adhesive.

37. The method of claim 30, wherein the acoustic barrier is configured to have a reflection ratio of about at least 80 percent.

38. The method of claim 30, wherein the sensor substrate has a thickness between about 50 microns and about 500 microns.

39. The fingerprint sensor device of claim 1, wherein the flexible printed circuit is electrically coupled to the sensor substrate and includes capacitive touch electrodes.

* * * * *